United States Patent
Hsu et al.

(10) Patent No.: US 12,288,695 B2
(45) Date of Patent: Apr. 29, 2025

(54) METHOD OF FORMING A TRANSISTOR DEVICE HAVING DIPOLE-CONTAINING GATE DIELECTRIC LAYER AND FLUORINE-CONTAINING GATE DIELECTRIC LAYER

(71) Applicant: Taiwan Semiconductor Manufacturing Co., Ltd., Hsinchu (TW)

(72) Inventors: Chung-Wei Hsu, Baoshan Township (TW); Kuo-Cheng Chiang, Zhubei (TW); Mao-Lin Huang, Hsinchu (TW); Lung-Kun Chu, New Taipei (TW); Jia-Ni Yu, New Taipei (TW); Chun-Fu Lu, Hsinchu (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 359 days.

(21) Appl. No.: 17/705,004

(22) Filed: Mar. 25, 2022

(65) Prior Publication Data
US 2023/0120117 A1   Apr. 20, 2023

Related U.S. Application Data

(60) Provisional application No. 63/256,172, filed on Oct. 15, 2021.

(51) Int. Cl.
*H01L 21/324* (2006.01)
*H01L 21/8234* (2006.01)
(Continued)

(52) U.S. Cl.
CPC .... *H01L 21/324* (2013.01); *H01L 21/823412* (2013.01); *H01L 29/0665* (2013.01);
(Continued)

(58) Field of Classification Search
CPC ............... H01L 21/324; H01L 21/823412
See application file for complete search history.

(56) References Cited

U.S. PATENT DOCUMENTS 9,209,247 B2   12/2015   Colinge et al.
9,236,267 B2   1/2016    De et al.
(Continued)

FOREIGN PATENT DOCUMENTS

| TW | 201244090 A | 11/2012 |
|---|---|---|
| TW | 202013441 A | 4/2020 |
| TW | 202131414 A | 8/2021 |

*Primary Examiner* — Michael Jung
(74) *Attorney, Agent, or Firm* — Slater Matsil, LLP

(57) ABSTRACT

A method of forming a semiconductor device includes forming a first dielectric layer over a first channel region in a first region and over a second channel region in a second region; introducing a first dipole element into the first dielectric layer in the first region to form a first dipole-containing gate dielectric layer in the first region; forming a second dielectric layer over the first dipole-containing gate dielectric layer; introducing fluorine into the second dielectric layer to form a first fluorine-containing gate dielectric layer over the first dipole-containing gate dielectric layer; and forming a gate electrode over the first fluorine-containing gate dielectric layer.

20 Claims, 76 Drawing Sheets

(51) Int. Cl.
  *H01L 29/06*    (2006.01)
  *H01L 29/423*   (2006.01)
  *H01L 29/66*    (2006.01)
  *H01L 29/786*   (2006.01)

(52) U.S. Cl.
  CPC .. *H01L 29/42392* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,362,282 B1 * | 6/2016 | Ando | H01L 29/66545 |
| 9,368,737 B2 | 6/2016 | Hwang | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,468,258 B1 * | 11/2019 | Lin | H01L 21/28247 |
| 11,610,822 B2 | 3/2023 | Chen | |
| 11,670,553 B2 | 6/2023 | Savant | |
| 2005/0224897 A1 * | 10/2005 | Chen | H01L 29/517 |
| | | | 257/900 |
| 2010/0219481 A1 * | 9/2010 | Tseng | H01L 21/823857 |
| | | | 257/369 |
| 2019/0097023 A1 * | 3/2019 | Wu | H01L 21/0226 |

\* cited by examiner

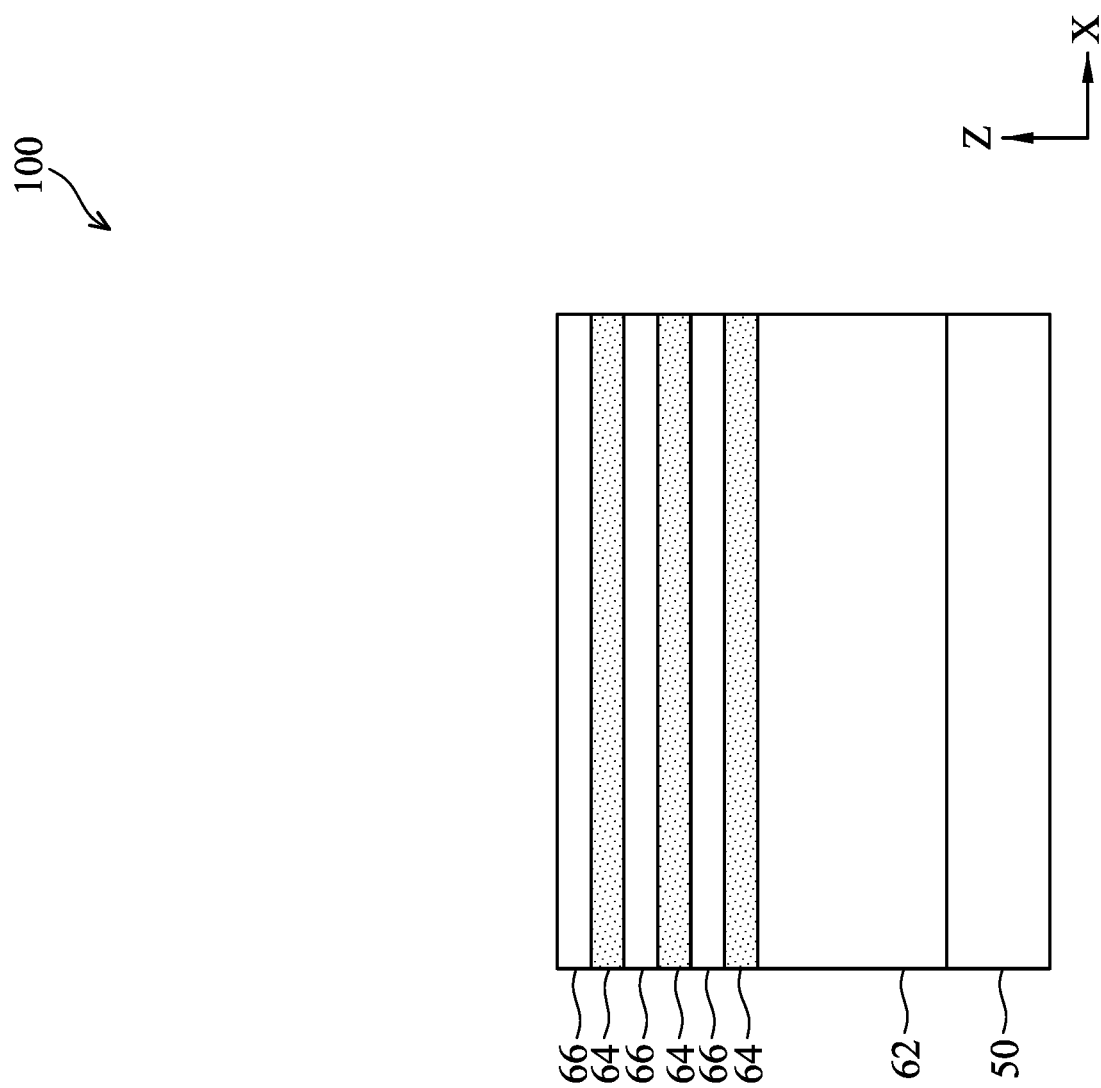

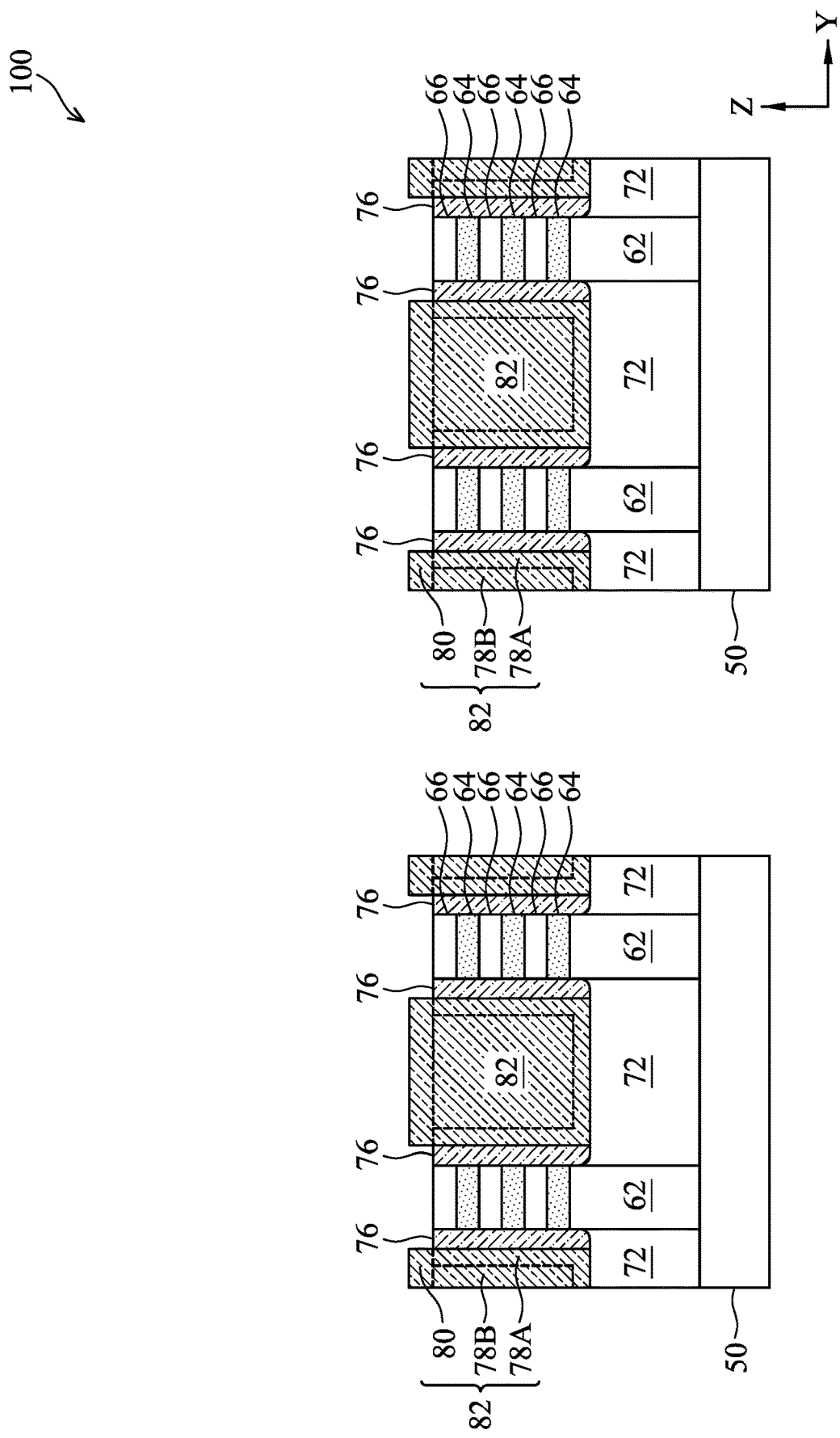

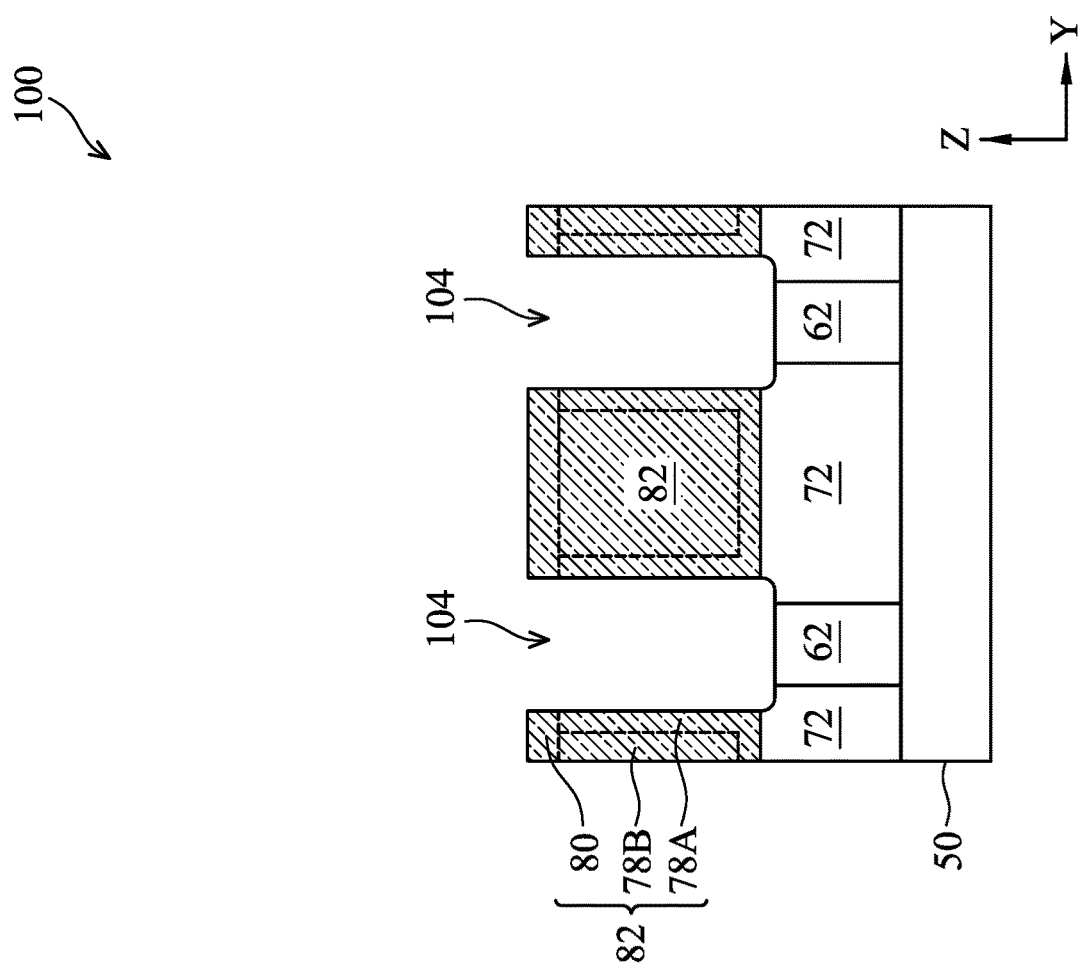
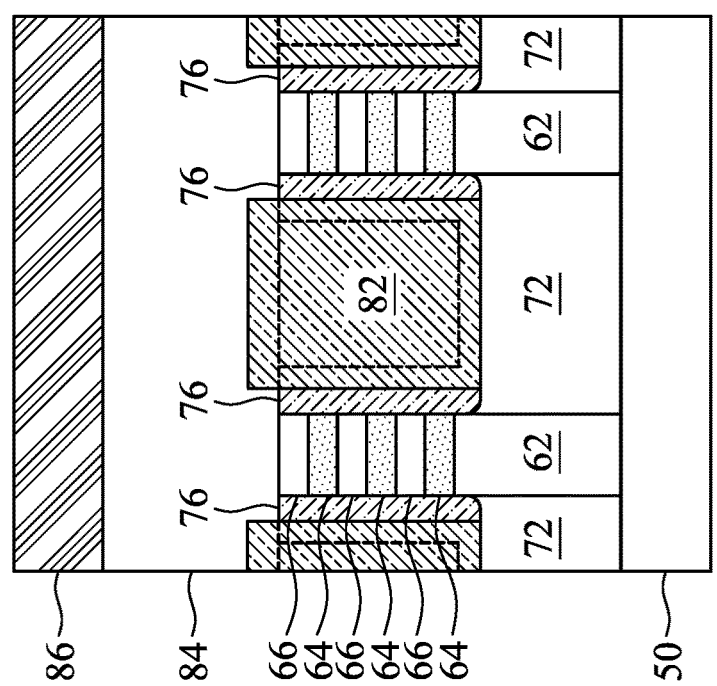
Figure 13B
Figure 13C

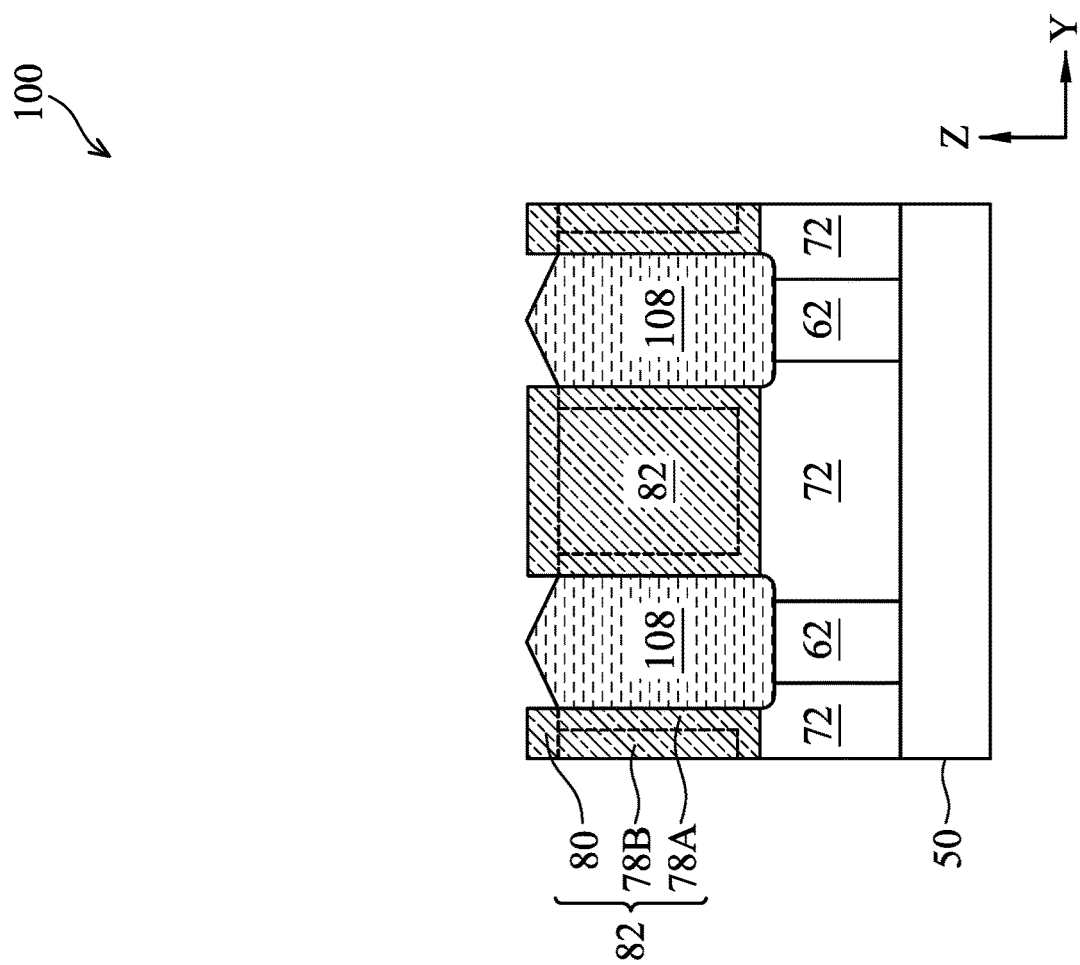
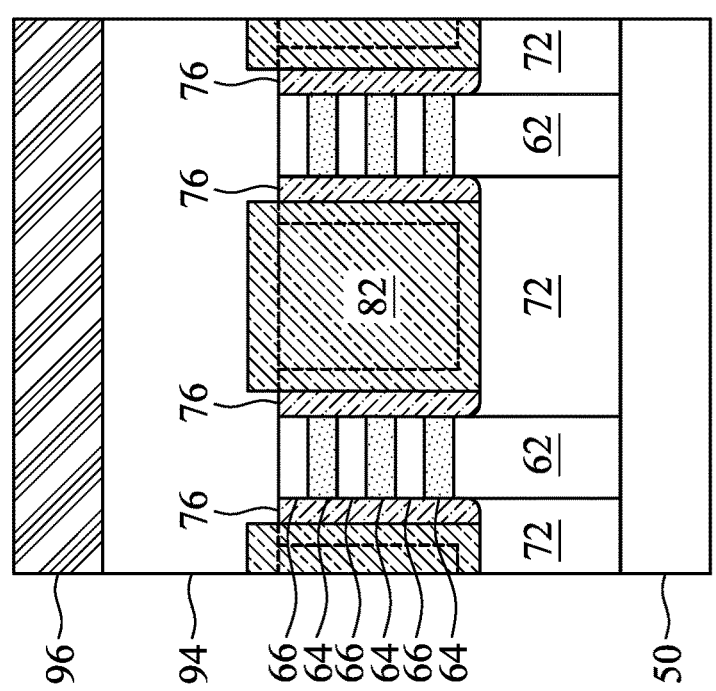
Figure 14C
Figure 14B

METHOD OF FORMING A TRANSISTOR DEVICE HAVING DIPOLE-CONTAINING GATE DIELECTRIC LAYER AND FLUORINE-CONTAINING GATE DIELECTRIC LAYER

PRIORITY CLAIM AND CROSS-REFERENCE

This application claims the benefit of U.S. Provisional Application No. 63/256,172, filed on Oct. 15, 2021, and entitled "Novel Nanosheet Device Mobility Boost and Multiple Vt Offering Technique Thereof," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-C, 6A-C, 7A-C, 8A-C, 9A-C, 10A-C, 11A-C, 12A-C, 13A-C, 14A-C, 15A-C, 16A-C, 17A-C, 18A, 18B, 19A, 19B, 20A, 20B, 21A, 21B, 22A, 22B, 23A, 23B, 24A, 24B, 25A, 25B, 26A, 26B, 27A, and 27B are cross-sectional views of a nanostructure field-effect transistor device at various stages of manufacturing, in accordance with some embodiments.

FIG. 25C is an enlarged view of gate dielectric layers with the distribution profiles of dipole elements and fluorine atoms, in accordance with some embodiments.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As discussed in greater detail below, embodiments illustrated in the present disclosure provide a gate dielectric layer that comprises dipole elements that may tune the threshold voltage of semiconductor devices and fluorine atoms that may improve mobility of the semiconductor devices by passivating oxygen vacancy and/or reducing silicon dangling bonds of the gate dielectric layer. In some embodiments, a two-step process is utilized to introduce the dipole elements and the fluorine atoms into different parts of the gate dielectric layer, thereby reducing interference caused between the dipole elements and the fluorine atoms. Thus, in the illustrated embodiments, overlapping regions of the dipole elements and the fluorine atoms may be appropriately reduced, and the semiconductor devices can have both desired threshold voltages and improved device mobility.

Figure 1:
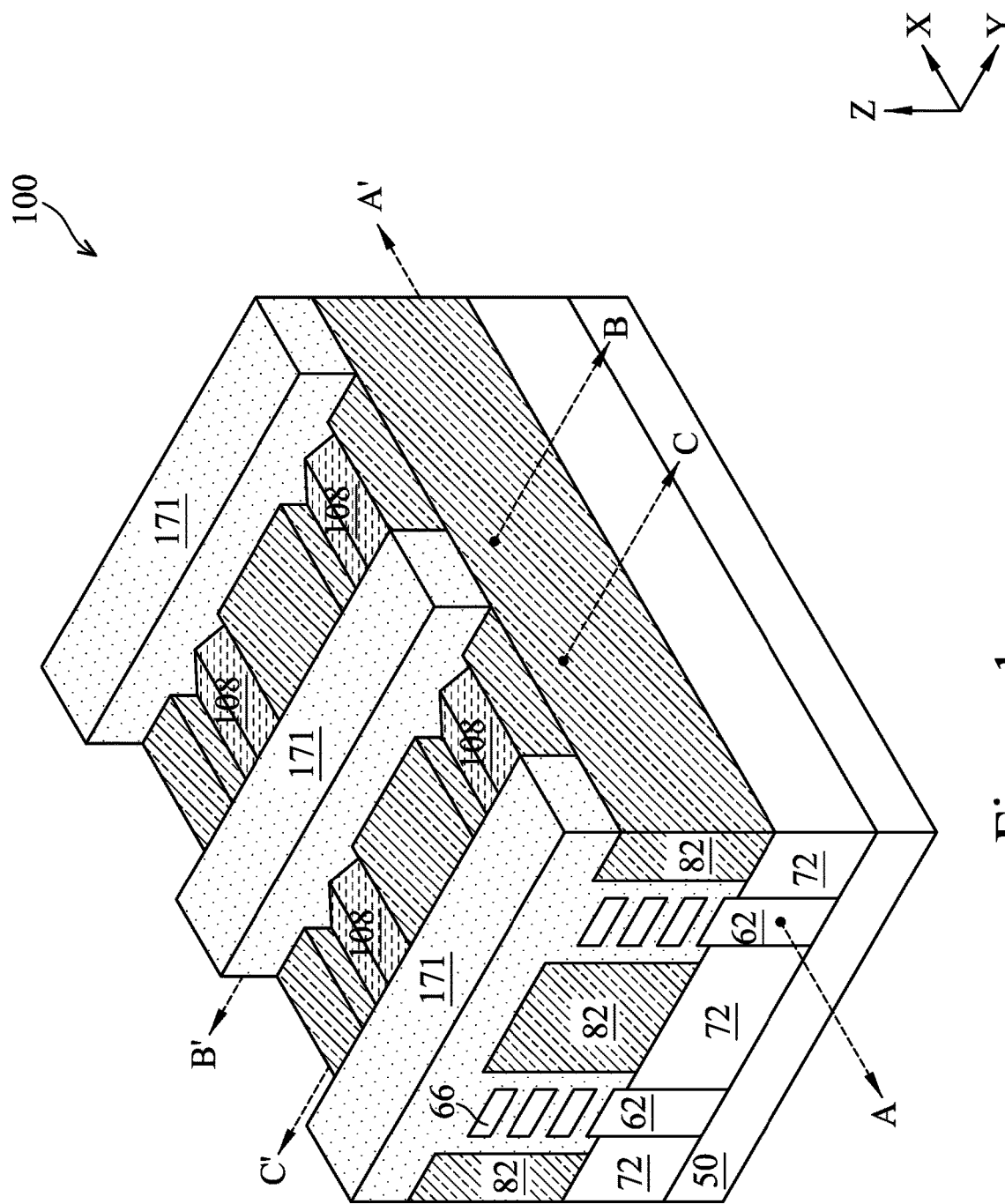
FIGS. 1-4 illustrate an example of a nanostructure field-effect transistor (nanostructure-FET) device in a three-dimensional view, in accordance with some embodiments.

FIG. 1 illustrates an example of nanostructure FETs 100 (e.g., nanowire FETs, nanosheet FETs, gate-all-around FETs, multi-bridge channel FETs, nano-ribbon FETs, or the like), in accordance with some embodiments. FIG. 1 is a three-dimensional view, where some features of the nanostructure-FETs 100 are omitted for illustration clarity.

The nanostructure-FETs 100 include nanostructures 66 (e.g., nanosheets, nanowires, or the like) over semiconductor fins 62 on a substrate 50 (e.g., a semiconductor substrate), with the nanostructures 66 acting as channel regions for the nanostructure-FETs 100. The nanostructures 66 may include p-type nanostructures, n-type nanostructures, or a combination thereof. Isolation regions 72, such as shallow trench isolation (STI) regions, are disposed between adjacent semiconductor fins 62, which may protrude above and from between adjacent isolation regions 72. Although the isolation regions 72 are described/illustrated as being separate from the substrate 50, as used herein, the term "substrate" may refer to the semiconductor substrate alone or a combination of the semiconductor substrate and one or more additional structures, such as the isolation regions 72. Additionally, although the bottom portions of the semiconductor fins 62 are illustrated as being separate from the substrate 50, the bottom portions of the semiconductor fins 62 may be single, continuous materials with the substrate 50. In this context, the semiconductor fins 62 refer to the portion extending above and from between the adjacent isolation regions 72.

Gate electrodes 171 are over top surfaces of the semiconductor fins 62 and along top surfaces, sidewalls, and bottom surfaces of the nanostructures 66. Epitaxial source/drain regions 108 are disposed on the semiconductor fins 62 at opposing sides of the gate electrodes 171. The epitaxial source/drain regions 108 may be shared between various semiconductor fins 62. For example, adjacent epitaxial source/drain regions 108 may be electrically connected, such as through coupling the epitaxial source/drain regions 108 with a same source/drain contact.

Insulating fins 82, also referred to as hybrid fins or dielectric fins, are disposed over the isolation regions 72, and between adjacent epitaxial source/drain regions 108. The insulating fins 82 block epitaxial growth during the epitaxial source/drain regions 108 formation to prevent coalescing of adjacent epitaxial source/drain regions 108. For example, in some embodiments, the insulating fins 82 may be formed to separate the epitaxial source/drain regions 108 of adjacent transistors.

FIG. 1 further illustrates reference cross-sections that are used in later figures. Cross-section A-A' is along a longitudinal axis of a semiconductor fin 62 and in a direction of, for example, a current flow between the epitaxial source/drain regions 108 of the nanostructure-FETs 100 v. Cross-section B-B' is along a longitudinal axis of a gate structure 130 and in a direction, for example, perpendicular to a direction of current flow between the epitaxial source/drain regions 108 of the nanostructure-FETs 100 (e.g., along the Y-axis). Cross-section C-C' is parallel to cross-section B-B' and extends through epitaxial source/drain regions 108 of the nanostructure-FETs 100 (e.g., along the Y-axis). Subsequent figures refer to these reference cross-sections for clarity.

Figure 2:
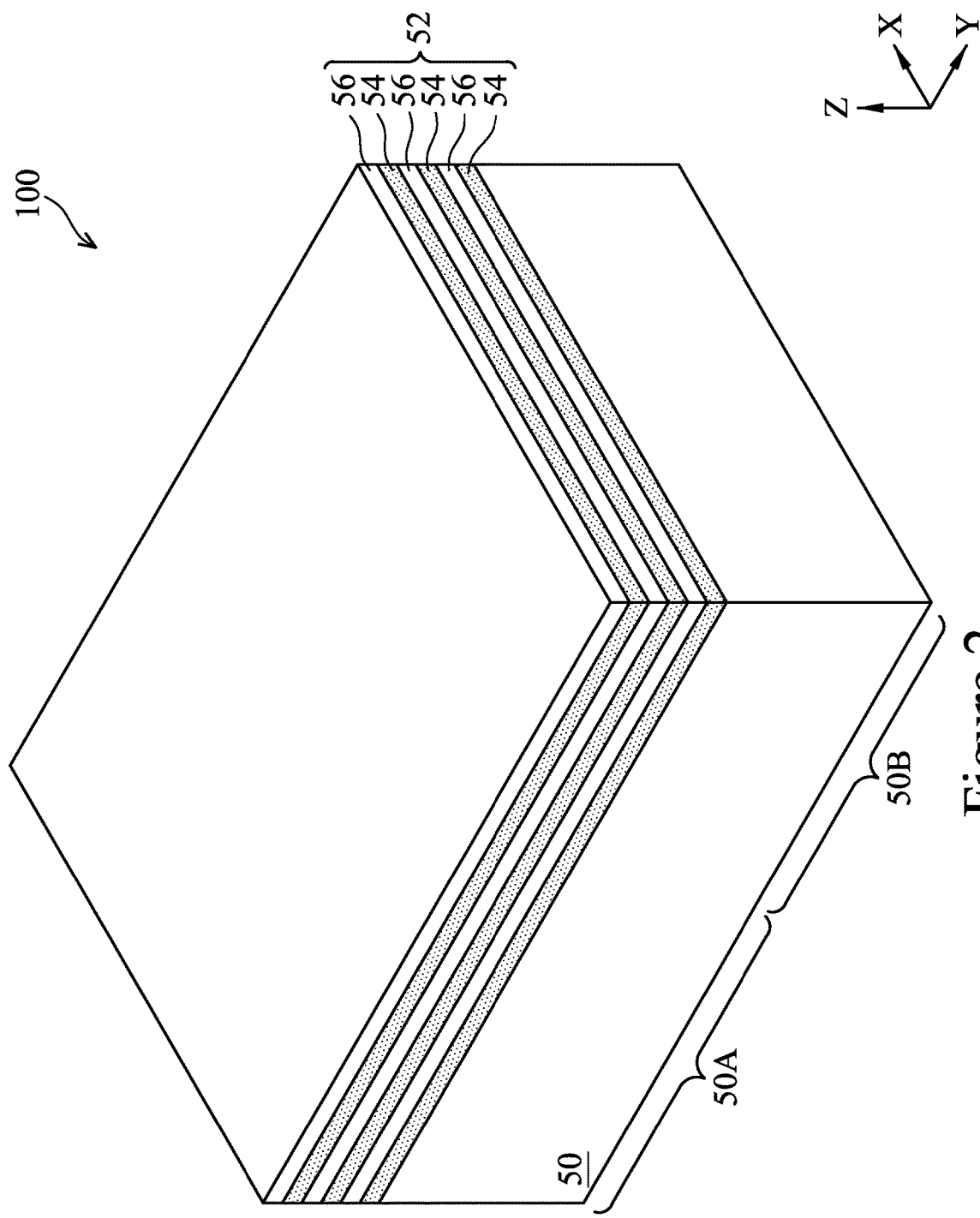
Figure 3:
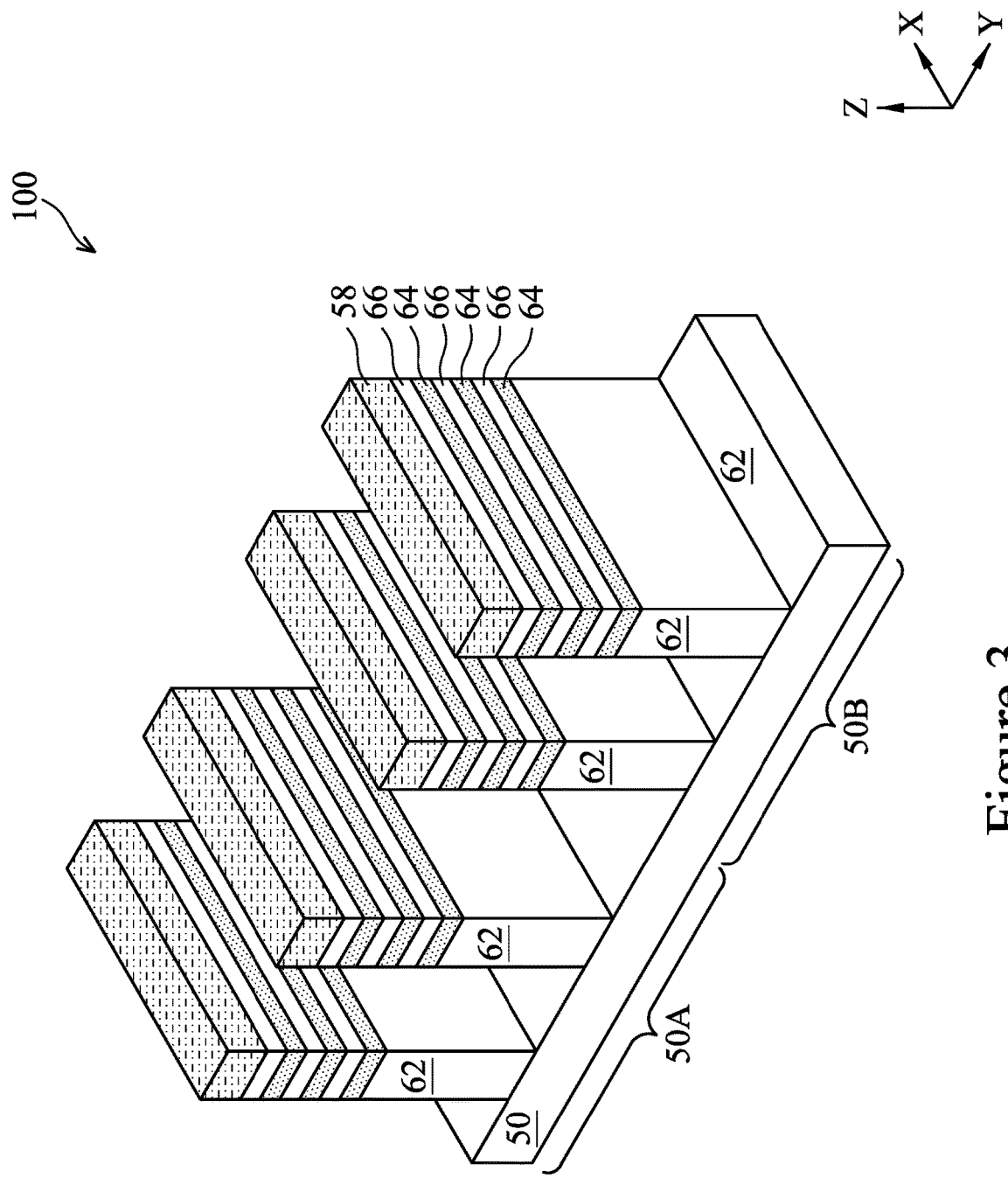
Figure 4:
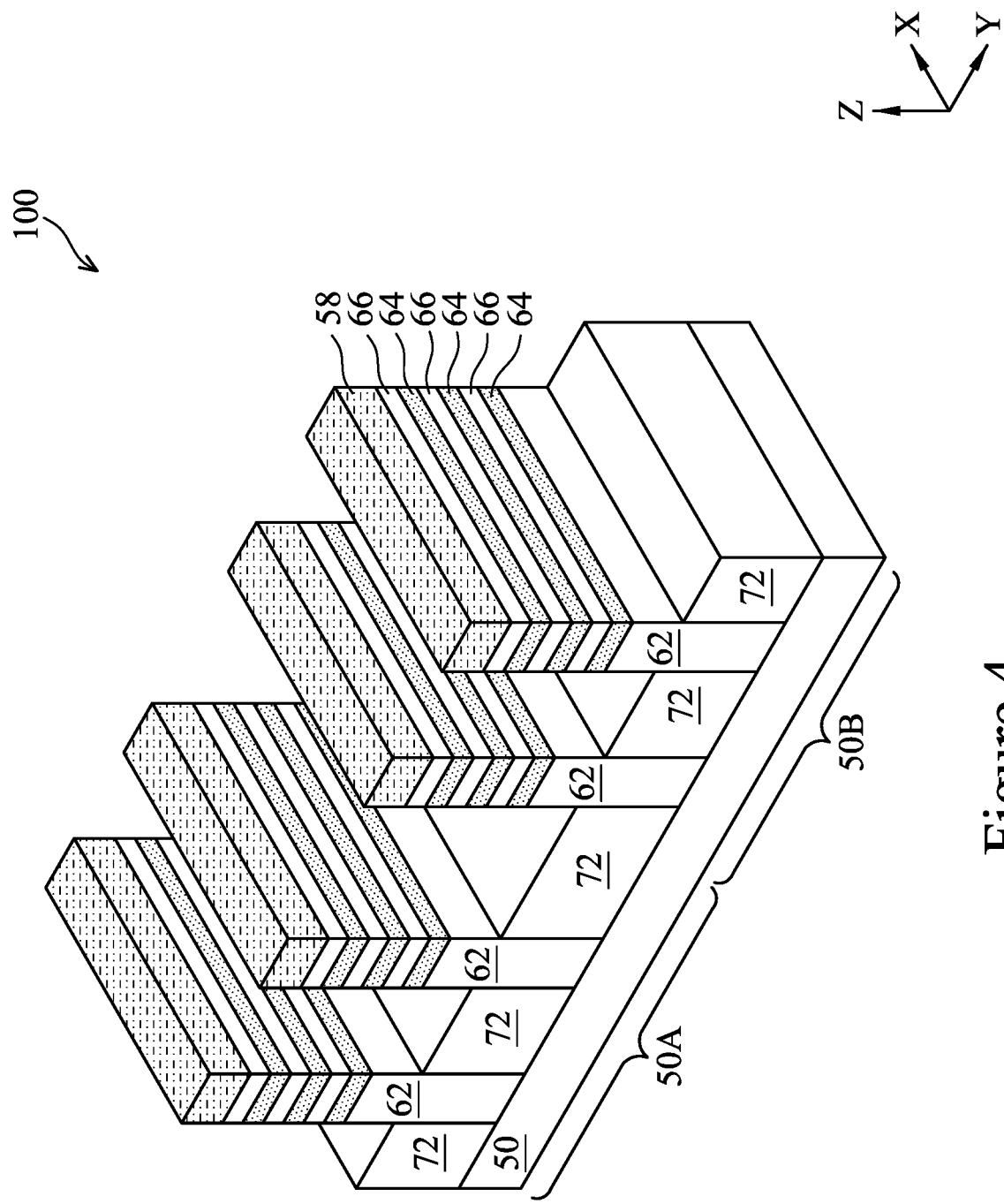

FIGS. 2-27B are views of intermediate stages in the manufacturing of nanostructure-FETs 100, in accordance with some embodiments. FIGS. 2, 3, and 4 are three-dimensional views. FIGS. 5A, 6A, 7A, 8A, 9A, 10A, 11A, 12A, 13A, 14A, 15A, 16A, 17A, 18A, 19A, 20A, 21A, 22A, 23A, 24A, 25A, 26A, and 27A are cross-sectional views illustrated along a similar cross-section as reference cross-section A-A' in FIG. 1. FIGS. 5B, 6B, 7B, 8B, 9B, 10B, 11B, 12B, 13B, 14B, 15B, 16B, 17B, 18B, 19B, 20B, 21B, 22B, 23B, 24B, 25B, 26B, and 27B are cross-sectional views illustrated along a similar cross-section as reference cross-section B-B' in FIG. 1. FIGS. 5C, 6C, 7C, 8C, 9C, 10C, 11C, 12C, 13C, 14C, 15C, 16C, and 17C are cross-sectional views illustrated along a similar cross-section as reference cross-section C-C' in FIG. 1.

In FIG. 2, a substrate 50 is provided for forming nanostructure-FETs 100. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Figure 26A:
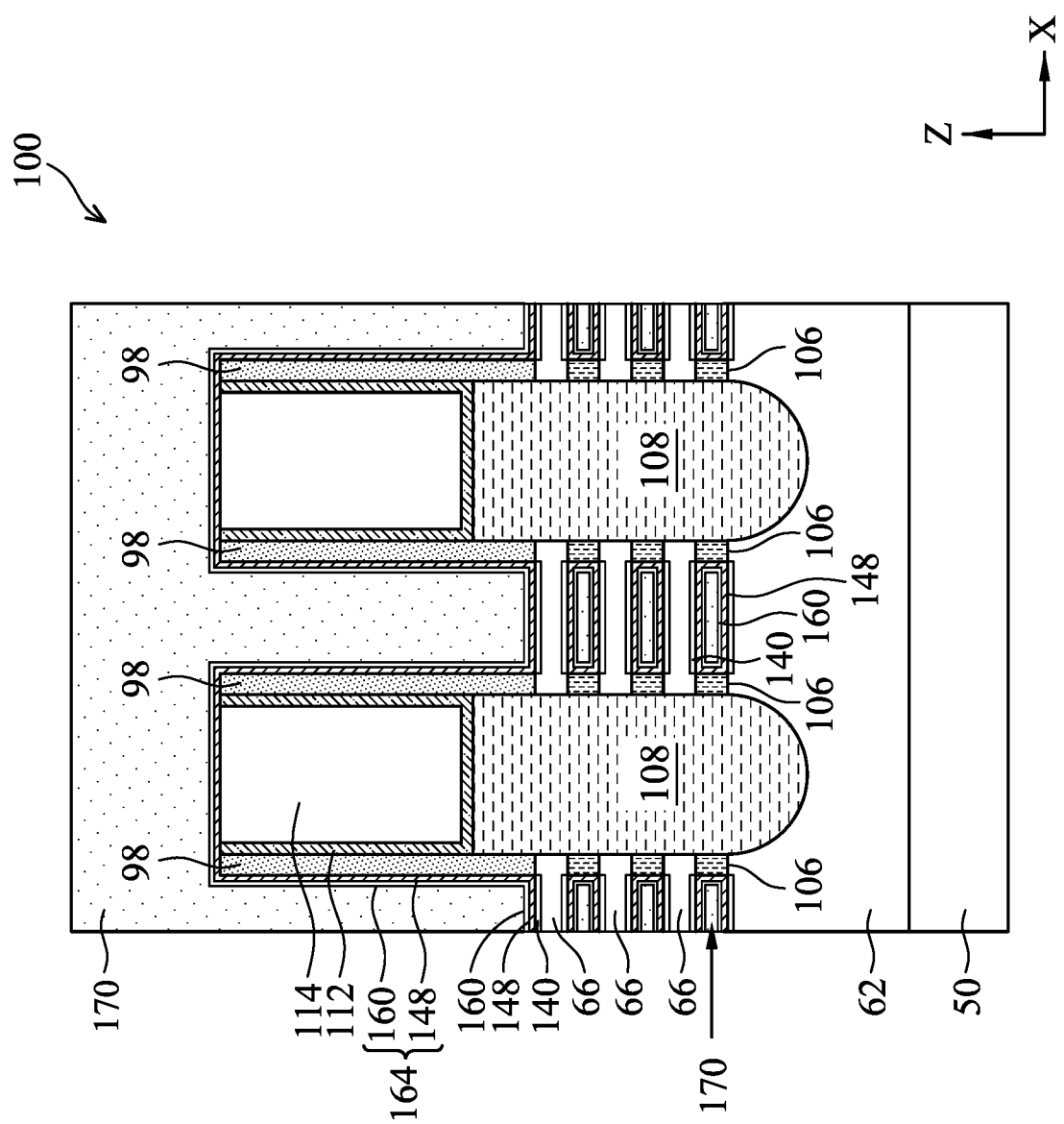
Figure 26B:
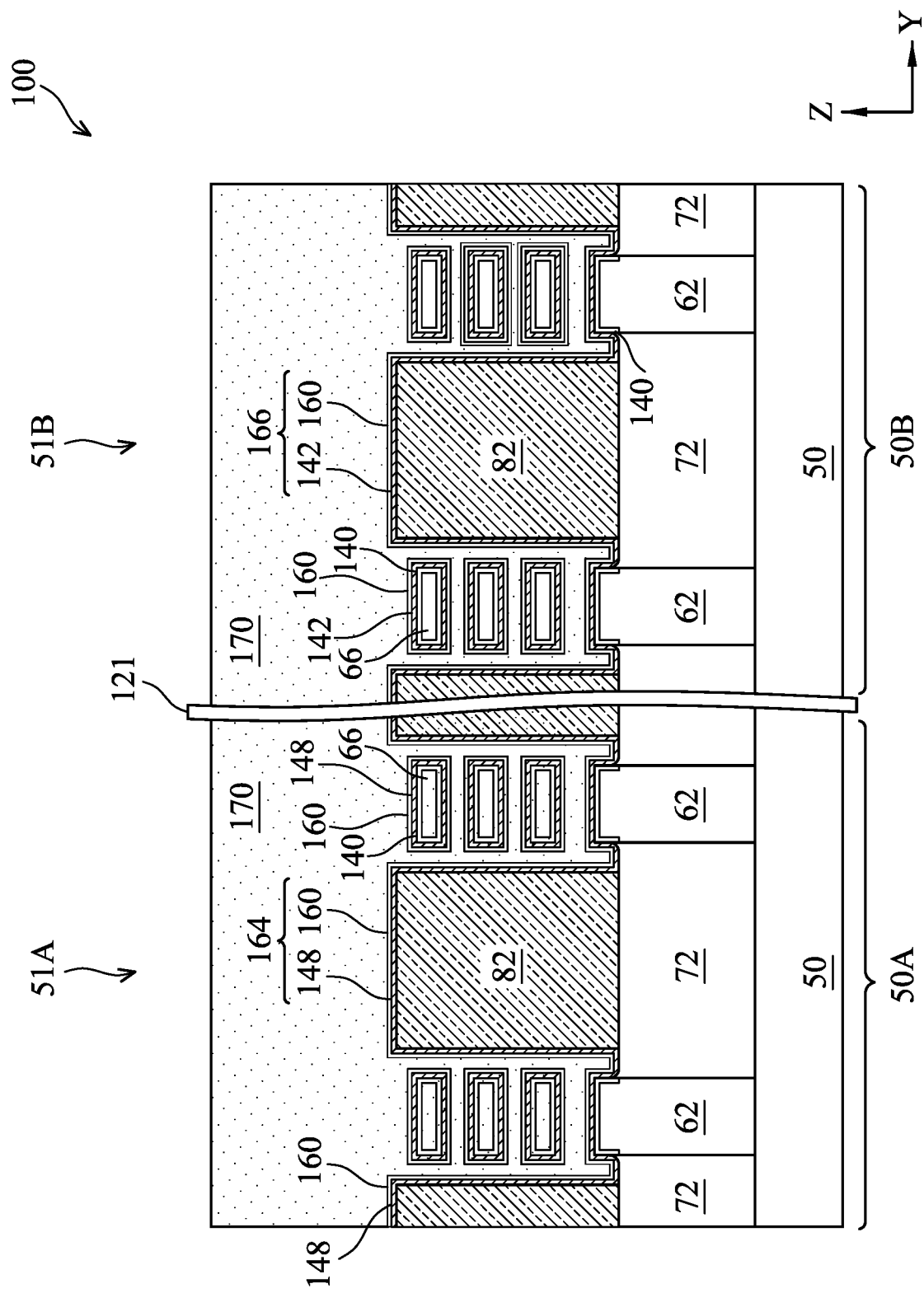

The substrate 50 has a first region 50A for forming semiconductor devices 51A (e.g., transistors, see FIG. 26B) and a second region 50B for forming semiconductor devices 51B (e.g., transistors, see FIG. 26B). As discussed in greater detail below, fluorine atoms are introduced into the gate dielectric of the transistors in the first region 50A and the second region 50B, and the gate dielectric of the transistor in the first region 50A is further adjusted using a two-step process to introduce dipole elements to adjust the threshold voltage. In some embodiments, the first region 50A and the second region 50B are different device regions such as a logic device region and an I/O device region, respectively. The first region 50A and the second region 50B may be used for forming devices of the same conductivity type (e.g., n-type or p-type) or different conductivity types. For example, the first region 50A and the second region 50B may both be for forming either of NMOS or PMOS devices or forming an NMOS device in one region and a PMOS device in the other region. The first region 50A may be physically separated from the second region 50B, and any number of device features (e.g., other active devices, doped regions, isolation structures, etc.) may be disposed between the first region 50A and the second region 50B. Although one first region 50A and one second region 50B are illustrated, any number of first region 50A and second region 50B may be provided.

The substrate 50 may be lightly doped with a p-type or an n-type impurity. An anti-punch-through (APT) implantation may be performed on an upper portion of the substrate 50 to form an APT region (not shown). During the APT implantation, impurities may be implanted in the substrate 50. The impurities may have a conductivity type opposite from a conductivity type of source/drain regions that will be subsequently formed in each of the n-type region and the p-type region. The APT region may extend under the source/drain regions in the nanostructure-FETs 100. The APT region may be used to reduce the leakage from the source/drain regions to the substrate 50. In some embodiments, the doping concentration in the APT region is in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and any number of the second semiconductor layers 56. For example, the multi-layer stack 52 may include from one to ten layers of each of the first semiconductor layers 54 and the second semiconductor layers 56. In the illustrated embodiment, and as will be subsequently described in greater detail, the first semiconductor layers 54 will be removed, and the second semiconductor layers 56 will be patterned to form channel regions for the nanostructure-FETs in both the first region 50A and the second region 50B. In some embodiments, the first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etch selectivity from the etching of the second semiconductor layers 56, such as silicon germanium. The second semiconductor material of the second semiconductor layers 56 is a material suitable for both n-type and p-type devices, such as silicon, in some embodiments.

In some embodiments (not separately illustrated), the first semiconductor layers 54 will be patterned to form channel regions for nanostructure-FETs in one region (e.g., the first region 50A), and the second semiconductor layers 56 will be patterned to form channel regions for nanostructure-FETs in another region (e.g., the second region 50B). The first semiconductor material and the second semiconductor material may have a high etch selectivity from the etching of one another, so that the first semiconductor layers 54 may be removed without removing the second semiconductor layers 56 in the first region 50A, and the second semiconductor layers 56 may be removed without removing the first semiconductor layers 54 in the second region 50B. For example, the first semiconductor material of the first semiconductor layers 54 may be silicon germanium (e.g., $Si_xGe_{1-x}$, where x can be in the range of 0 to 1), pure germanium, a III-V compound semiconductor, a II-VI compound semiconductor, or the like, for a p-type device, and the second semiconductor material of the second semiconductor layers 56 may be silicon, silicon carbide, a III-V compound semiconductor, a II-VI compound semiconductor, or the like for an n-type device. Each of the layers may have a small thickness, such as a thickness in a range of 5 nm to 30 nm.

In FIG. 3, trenches are patterned in the substrate 50 and the multi-layer stack 52 to form semiconductor fins 62, nanostructures 64, and nanostructures 66. The semiconductor fins 62 are semiconductor strips patterned in the substrate 50. The nanostructures 64 and the nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The semiconductor fins 62 and the nanostructures 64, 66 may be patterned by any suitable method. For example, the semiconductor fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask 58 to pattern the semiconductor fins 62 and the nanostructures 64, 66.

In some embodiments, the semiconductor fins 62 and the nanostructures 64, 66 each have widths in a range of 8 nm to 40 nm. In the illustrated embodiment, the semiconductor fins 62 and the nanostructures 64, 66 have substantially equal widths in the first region 50A and the second region 50B. In some embodiments, the semiconductor fins 62 and the nanostructures 64, 66 in one region are wider or narrower than the semiconductor fins 62 and the nanostructures 64, 66 in another region. Further, while each of the semiconductor fins 62 and the nanostructures 64, 66 are illustrated as having a consistent width throughout, in some embodiments, the semiconductor fins 62 and/or the nanostructures 64, 66 may have tapered sidewalls such that a width of each of the semiconductor fins 62 and/or the nanostructures 64, 66 continuously increases in a direction towards the substrate 50. In such embodiments, each of the nanostructures 64, 66 may have a different width and be trapezoidal in shape.

In FIG. 4, isolation regions 72 are formed over the substrate 50 and between adjacent semiconductor fins 62. The isolation regions 72 are disposed around at least a portion of the semiconductor fins 62 such that at least a portion of the nanostructures 64, 66 protrude from between adjacent isolation regions 72. In the illustrated embodiment, the top surfaces of the isolation regions 72 are below the top surfaces of the semiconductor fins 62. In some embodiments, the top surfaces of the isolation regions 72 are above or coplanar (within process variations) with the top surfaces of the semiconductor fins 62.

The isolation regions 72 may be formed by any suitable method. For example, an insulation material can be formed over the substrate 50 and the nanostructures 64, 66, and between adjacent semiconductor fins 62. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the isolation regions 72 are each illustrated as a single layer, some embodiments may utilize multiple layers. For example, in some embodiments, a liner (not separately illustrated) may first be formed along surfaces of the substrate 50, the semiconductor fins 62, and the nanostructures 64, 66. Thereafter, an insulation material, such as those previously described, may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In some embodiments, the planarization process may expose the mask 58 or remove the mask 58. After the planarization process, the top surfaces of the insulation material and the mask 58 or the nanostructures 64, 66 are coplanar (within process variations). Accordingly, the top surfaces of the mask 58 (if present) or the nanostructures 64, 66 are exposed through the insulation material. In the illustrated embodiment, the mask 58 remains on the nanostructures 64, 66. The insulation material is then recessed to form the isolation regions 72. The insulation material is recessed such that at least a portion of the nanostructures 64, 66 protrude from between adjacent portions of the insulation material. Further, the top surfaces of the isolation regions 72 may have a flat surface as illustrated, a convex surface, a concave surface (such as dishing), or a combination thereof by applying an appropriate etch. The insulation material may be recessed using any acceptable etching process, such as one that is selective to the material of the insulation material (e.g., selectively etches the insulation material of the isolation regions 72 at a faster rate than the materials of the semiconductor fins 62 and the nanostructures 64, 66). For example, an oxide removal may be performed using dilute hydrofluoric (dHF) acid as an etchant.

The process previously described is just one example of how the semiconductor fins 62 and the nanostructures 64, 66 may be formed. In some embodiments, the semiconductor fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the semiconductor fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the semiconductor fins 62, and/or the substrate 50. The wells may have a conductivity type opposite from a conductivity type of source/drain regions that will be subsequently formed in each of the n-type region and the p-type region. In some embodiments, a p-type well is formed in the n-type region, and an n-type well is formed in the p-type region. In some embodiments, a p-type well or an n-type well is formed in both the n-type region and the p-type region. The n-type well may be formed by performing an n-type impurity implant. The n-type impurities may be phosphorus, arsenic, antimony, or the like implanted in the region to a concentration in the range of $10^{13}$ cm$^{-3}$ to $10^{14}$ cm$^{-3}$. The p-type well may be formed by performing a p-type impurity implant. The p-type impurities may be boron, boron fluoride, indium, or the like implanted in the region to a concentration in the range of $10^{13}$ cm$^{-3}$ to $10^{14}$ cm$^{-3}$. After the implants are implanted, an anneal may be performed to repair damage and activate the p-type and/or n-type impurities that were implanted. In some embodiments where epitaxial structures are epitaxially grown for the semiconductor fins 62 and/or the nanostructures 64, 66, the grown materials may be in situ doped during growth, which may obviate the implantations, although in situ and implantation doping may be used together.

FIGS. 5A-27B illustrate various additional steps in the manufacturing of embodiment devices. Throughout the discussion herein, figures with the same numeral but different alphabets (e.g., FIGS. 5A-C) show cross-sectional views of the nanostructure-FETs 100 at the same processing stage but along different cross-sections. Note that the structures illustrated in FIGS. 5A-17C may be applicable to the first region 50A or the second region 50B or both the first region 50A and the second region 50B. In FIGS. 18A-27B, FIGS. 18A through 27A denoted with an alphabet "A" specifically illustrate the structures and features in the first region 50A, and FIGS. 18B through 27B denoted with an alphabet "B" illustrate both of the structures and features in the first region 50A and the second region 50B. As will be subsequently described in greater detail, gate dielectric layers 148 and 160 will be formed over the nanostructures 66 using a two-step process in the first region 50A to introduce fluorine atoms to passivate oxygen vacancies and dipole elements to adjust the threshold voltage, while omitting the dipole elements from the second region 50B. Using techniques such as those discussed herein allows the operating characteristics such as threshold voltages to be individually tuned.

FIGS. 5A, 6A, 7A, 8A, 9A, 10A, 11A, 12A 13A, 14A, 15A, 16A, 17A, 18A, 19A, 20A, 21A, 22A, 23A, 24A, 25A, 26A, and 27A are cross-sectional views along cross-section A-A' in FIG. 1 (e.g., along the X-axis) and illustrate a semiconductor fin 62 and structures formed on it. FIGS. 5B, 6B, 7B, 8B, 9B, 10B, 11B, 12B 13B, 14B, 15B, 16B, 17B, 18B, 19B, 20B, 21B, 22B, 23B, 24B, 25B, 26B, and 27B are cross-sectional views along cross-section B-B' in FIG. 1 (e.g., along the Y-axis) and illustrate two semiconductor fins 62, portions of the insulating fins 82, the STI and structures formed on them. FIGS. 5C, 6C, 7C, 8C, 9C, 10C, 11C, 12C 13C, 14C, 15C, 16C, 17C are cross-sectional views along cross-section C-C' in FIG. 1 (e.g., along the Y-axis) and illustrate two semiconductor fins 62, portions of the insulating fins 82, the isolation regions 72 and structures formed on it. FIG. 25C is an enlarged view of the gate dielectric layers 148 and 160 with the distribution profiles of dipole elements and fluorine atoms in these gate dielectric layers 148 and 160.

Figure 5A:
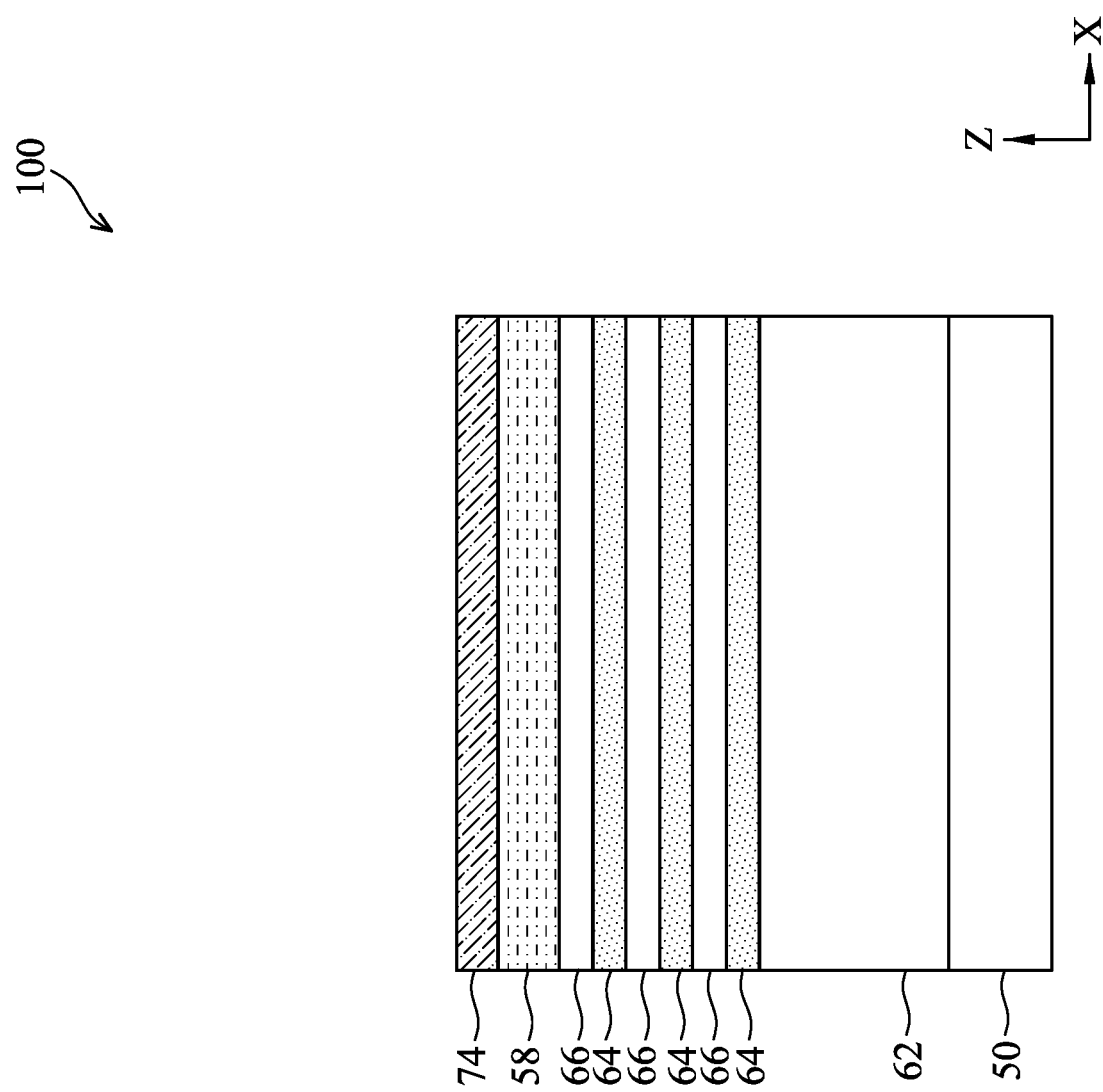
Figure 5C:
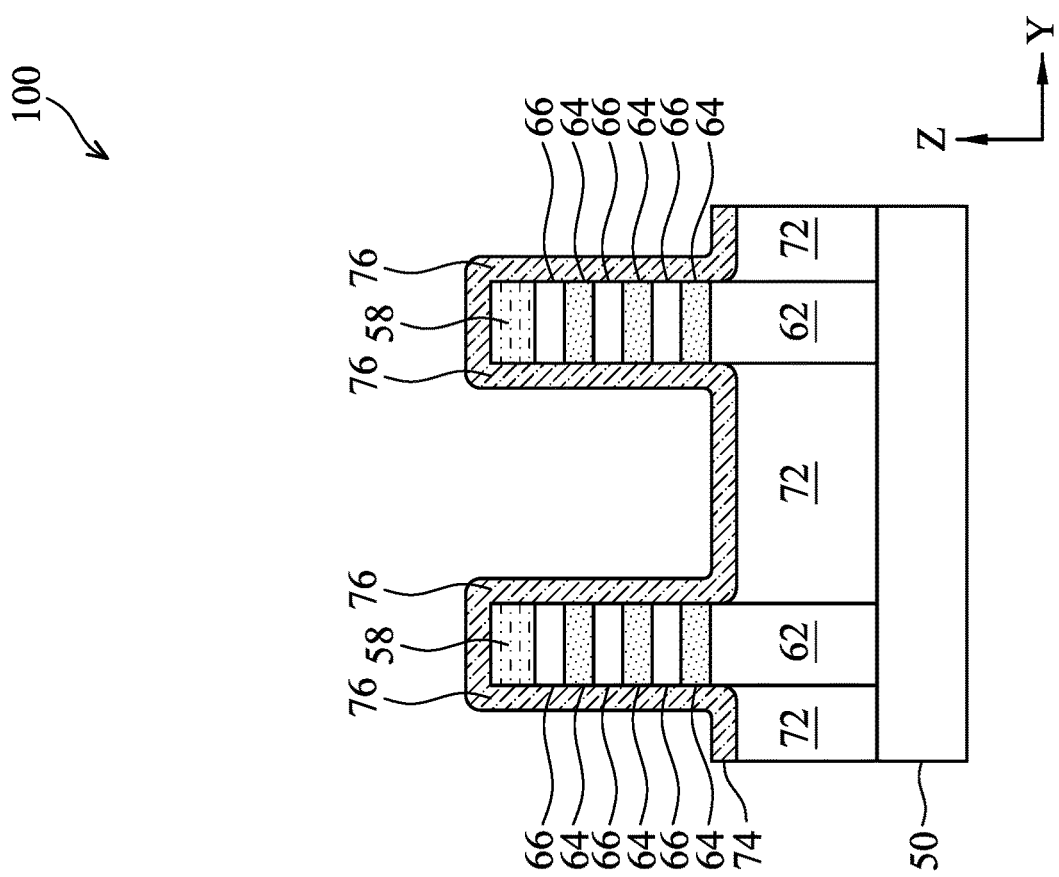
Figure 5B:
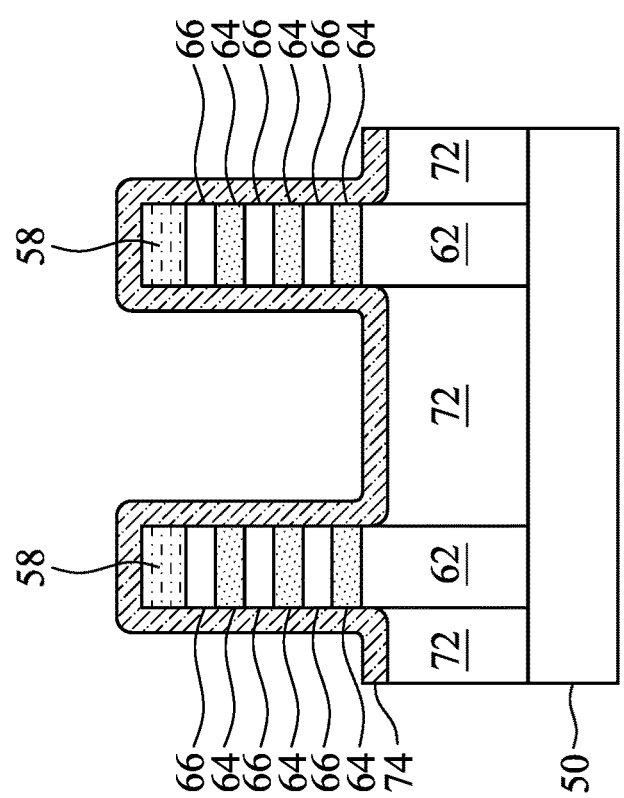

In FIGS. 5A-C, a cladding layer 74 is conformally formed over the mask 58, the semiconductor fins 62, the nanostructures 64, 66, and the isolation regions 72. The cladding layer 74 may be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. For example, the cladding layer 74 may be formed of silicon or silicon germanium.

Figure 6A:
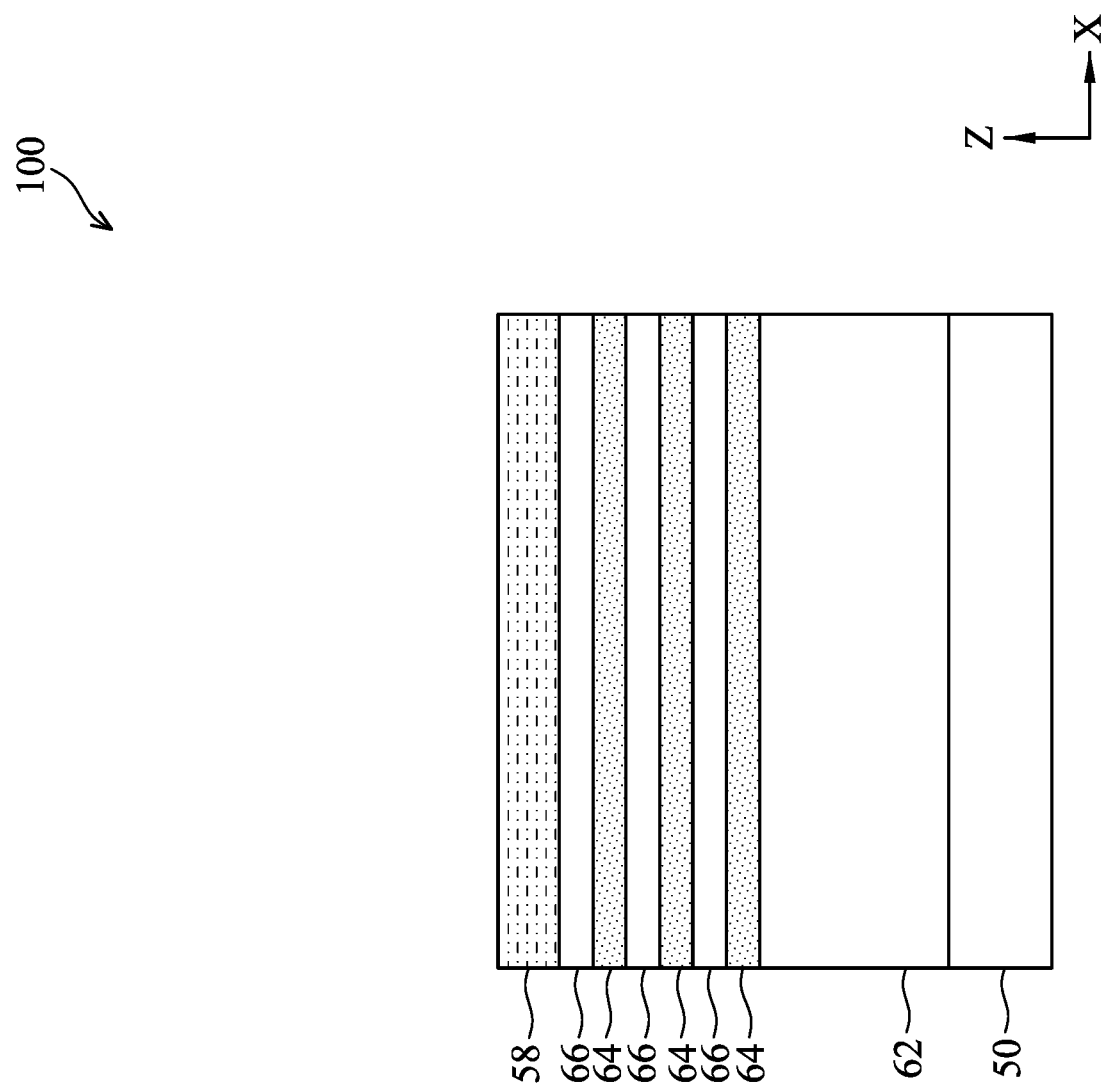
Figure 6C:
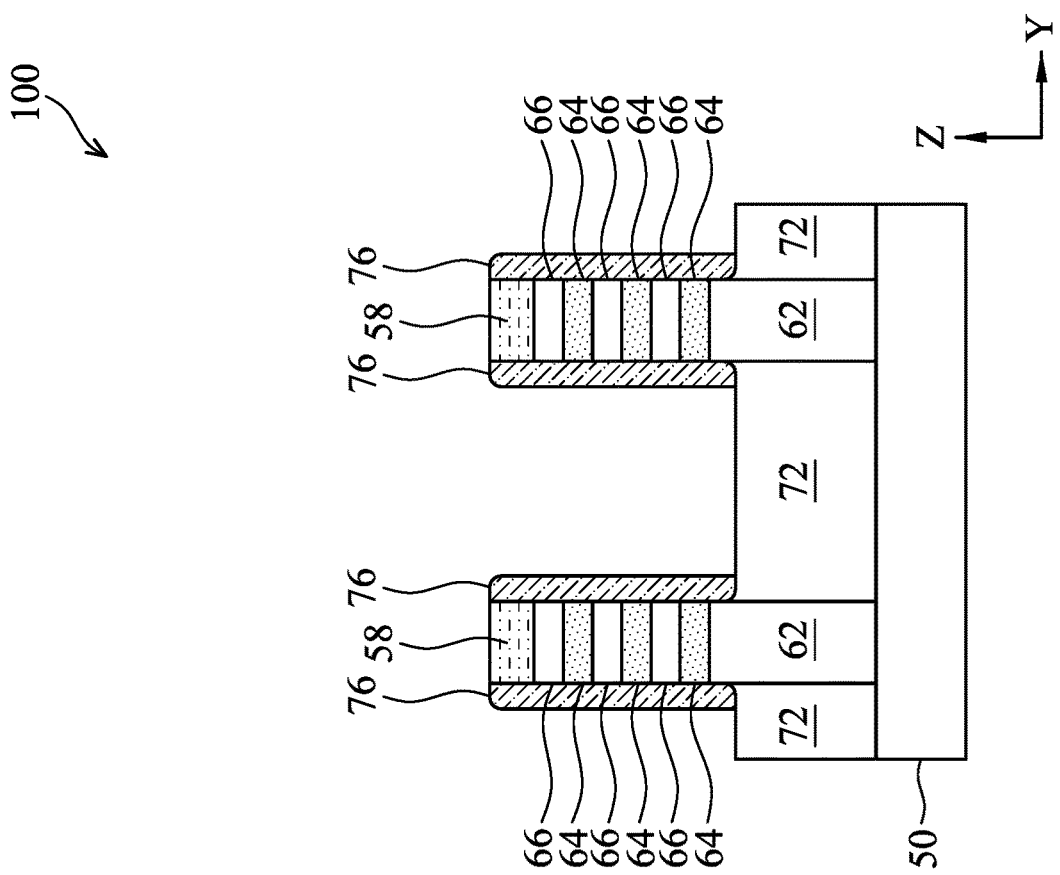
Figure 6B:
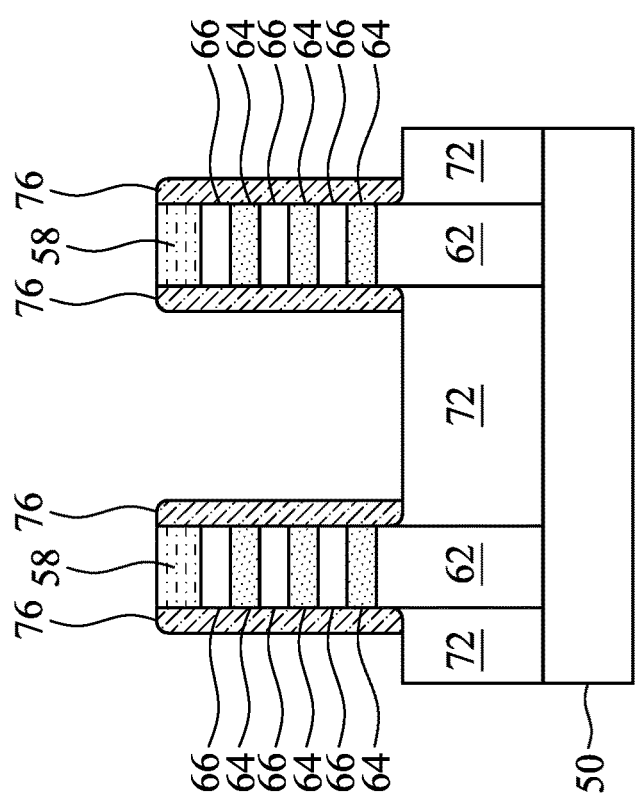

In FIGS. 6A-C, the cladding layer 74 is patterned to form cladding spacers 76 using an etching process, such as a dry etch, a wet etch, or a combination thereof. The etching process may be anisotropic. As a result of the etching process, the portions of the cladding layer 74 over the mask 58 and the nanostructures 64, 66 are removed, and the isolation regions 72 between the nanostructures 64, 66 are partially exposed. The cladding spacers 76 are disposed over the isolation regions 72 and are further disposed on the sidewalls of the mask 58, the semiconductor fins 62, and the nanostructures 64, 66. In some embodiments, the cladding spacers 76 may have a thickness in a range of about 2 nm to about 10 nm along sidewalls of the mask 58 and nanostructures 64, 66. In subsequent process steps, a dummy gate layer 84 may be deposited over portions of the cladding spacers 76 (see below, FIGS. 11A-C), and the dummy gate layer 84 may be patterned to provide dummy gates 94 that include underlying portions of the cladding spacers 76 (see below, FIGS. 12A-C). These dummy gates 94 (e.g., patterned portions of the dummy gate layer 84 and portions of the cladding spacers 76) may then be replaced with a functional gate stack. Specifically, the cladding spacers 76 are used as temporary spacers during processing to delineate boundaries of insulating fins, and the cladding spacers 76 and the nanostructures 64 will be subsequently removed and replaced with gate structures that are wrapped around the nanostructures 66. The cladding spacers 76 are formed of a material that has a high etch selectivity from the etching of the material of the nanostructures 66. For example, the cladding spacers 76 may be formed of the same semiconductor material as the nanostructures 64 so that the cladding spacers 76 and the nanostructures 64 may be removed in a single process step. Alternatively, the cladding spacers 76 may be formed of a different material as the nanostructures 64.

FIGS. 7A through 9C illustrate a formation of insulating fins 82 (also referred to as hybrid fins or dielectric fins) between the cladding spacers 76 adjacent to the semiconductor fins 62 and nanostructures 64, 66. The insulating fins 82 may insulate and physically separate subsequently formed source/drain regions (see below, FIGS. 14A-C) from each other.

Figure 7A:
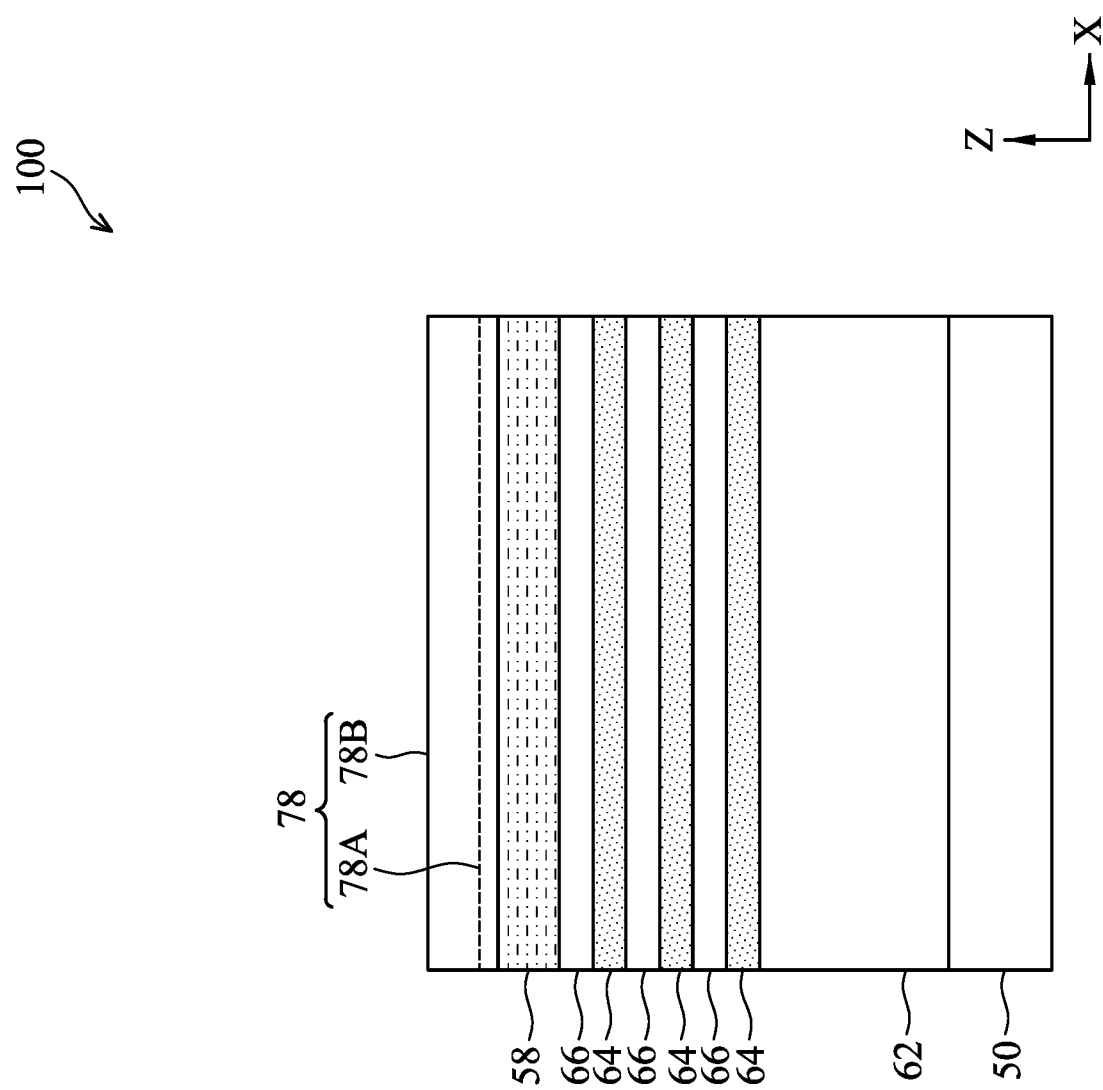
Figure 7C:
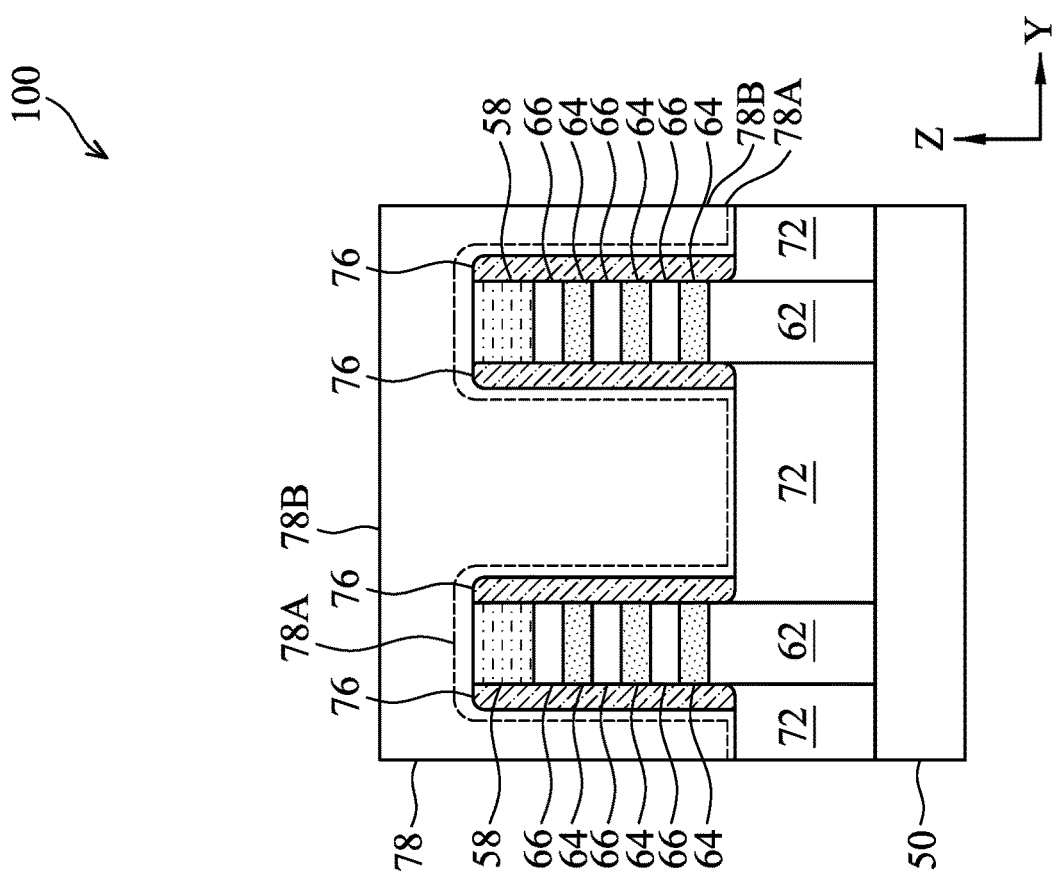
Figure 7B:
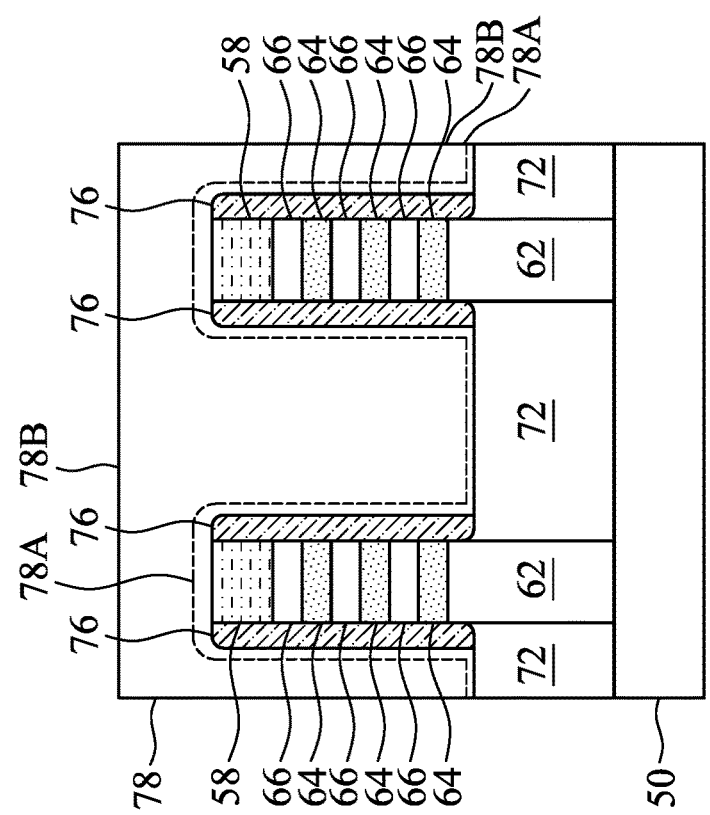

In FIGS. 7A-C, a liner 78A and a fill material 78B are formed over the structure. As discussed in greater detail below, the liner 78A and the fill material 78B will be patterned and collectively form portions of the insulating fins 82. The liner 78A is conformally deposited over exposed surfaces of the isolation regions 72, the masks 58, the semiconductor fins 62, the nanostructures 64, 66, and the cladding spacers 76 by an acceptable deposition process such as atomic layer deposition (ALD), chemical vapor deposition (CVD), physical vapor deposition (PVD), or the like. The liner 78A may be formed of one or more dielectric material(s) having a high etch selectivity from the etching of the semiconductor fins 62, the nanostructures 64, 66, and the cladding spacers 76, e.g., a nitride such as silicon nitride, silicon carbonitride, silicon oxycarbonitride, or the like. The liner 78A may reduce oxidation of the cladding spacers 76 during the subsequent formation of the fill material 78B, which may be useful for a subsequent removal of the cladding spacers 76.

Next, a fill material 78B is formed over the liner 78A, filling the remaining area between the semiconductor fins 62 and the nanostructures 64, 66 that is not filled by the cladding spacers 76 or the liner 78A. The fill material 78B may form the bulk of the lower portions of the insulating fins 82 (see FIGS. 9A-C) to insulate subsequently formed source/drain regions (see FIG. 14C) from each other. The fill material 78B may be formed by an acceptable deposition process such as ALD, CVD, PVD, or the like. The fill material 78B may be formed of one or more dielectric material(s) having a high etch selectivity from the etching of the semiconductor fins 62, the nanostructures 64, 66, the cladding spacers 76, and the liner 78A such as an oxide such as silicon oxide, silicon oxynitride, silicon oxycarbonitride, silicon oxycarbide, the like, or combinations thereof.

Figure 8A:
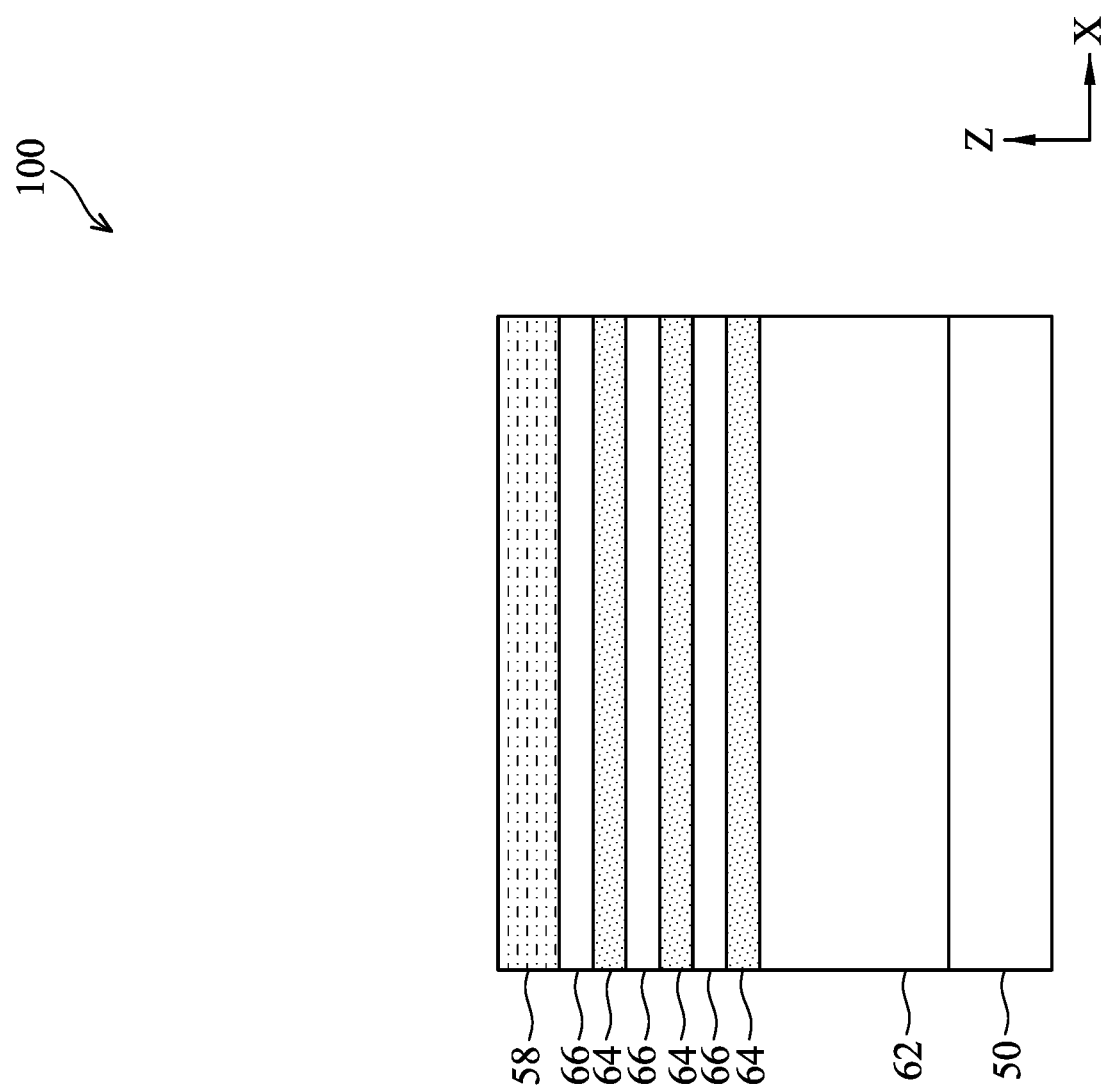
Figure 8B:
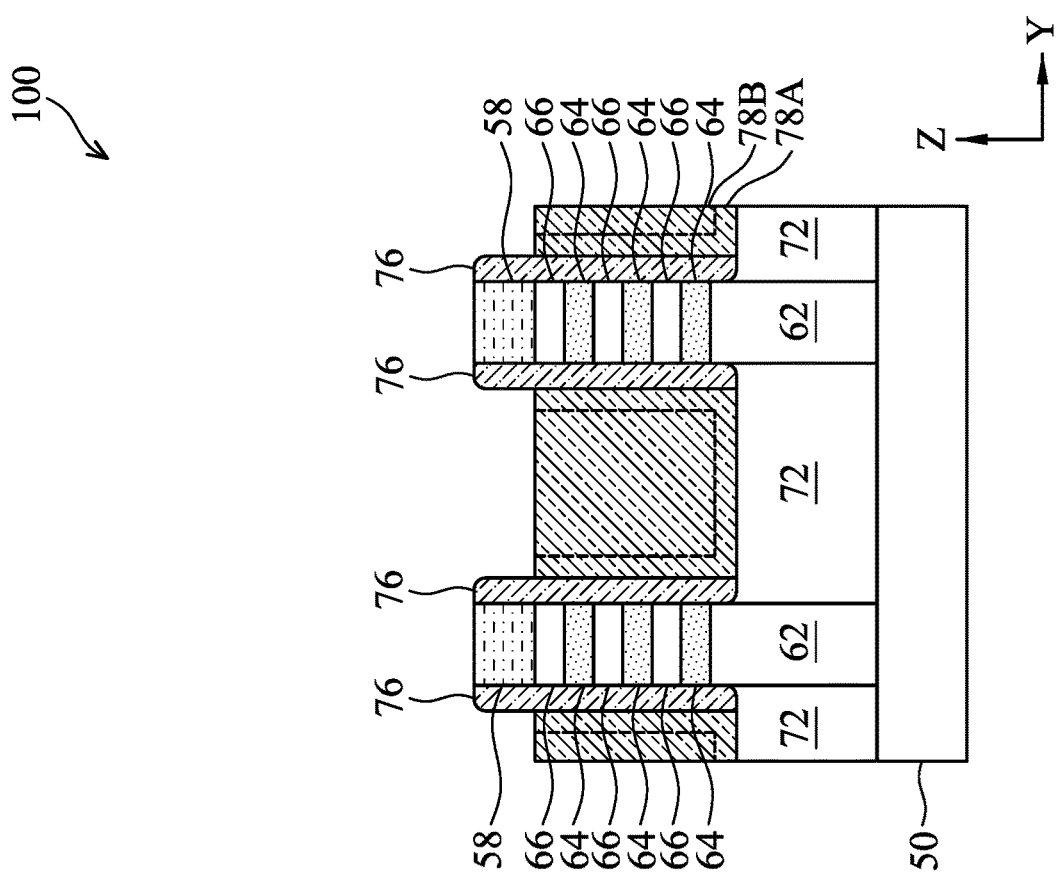
Figure 8C:
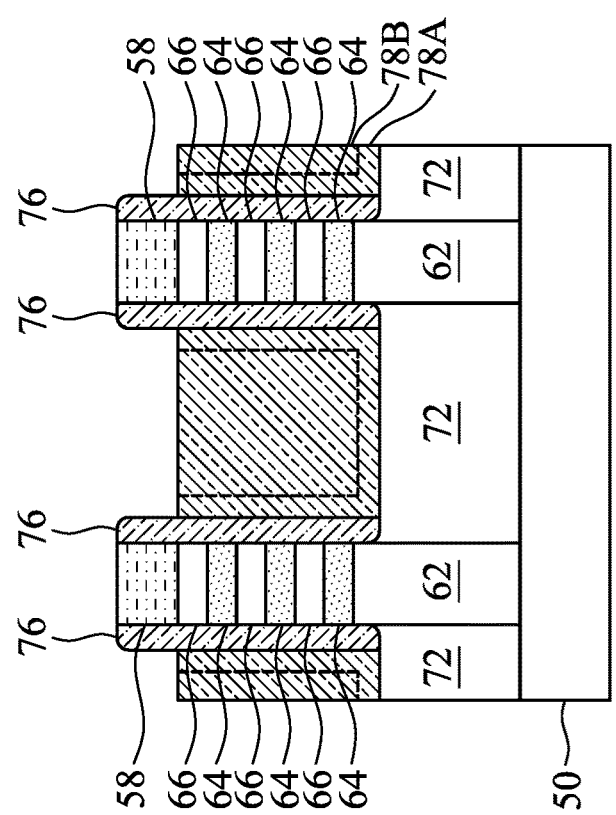

In FIGS. 8A-8C, upper portions of the liner 78A and the fill material 78B above top surfaces of the masks 58 may be removed using one or more acceptable planarization and/or etching processes. The etching process may be selective to the liner 78A and to the fill material 78B (e.g., selectively etches the liner 78A and the fill material 78B at a faster rate than the cladding spacers 76 and/or the mask 58). After etching, top surfaces of the liner 78A and the fill material 78B may be below top surfaces of the mask 58. In other embodiments, the fill material 78 may be recessed below top surfaces of the mask 58 while the liner 78A is maintained at a same level as the mask 58.

Figure 9A:
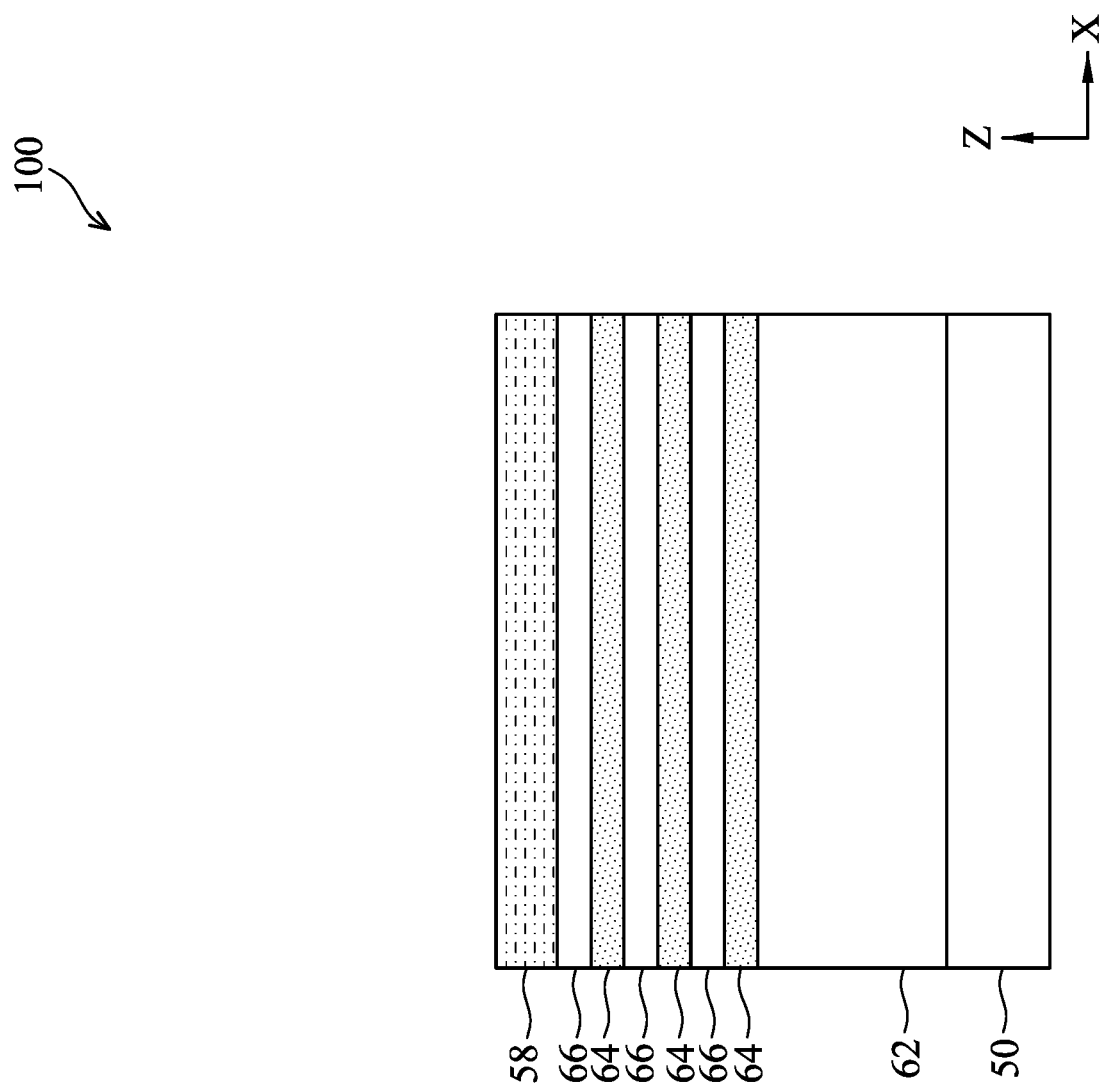
Figure 9C:
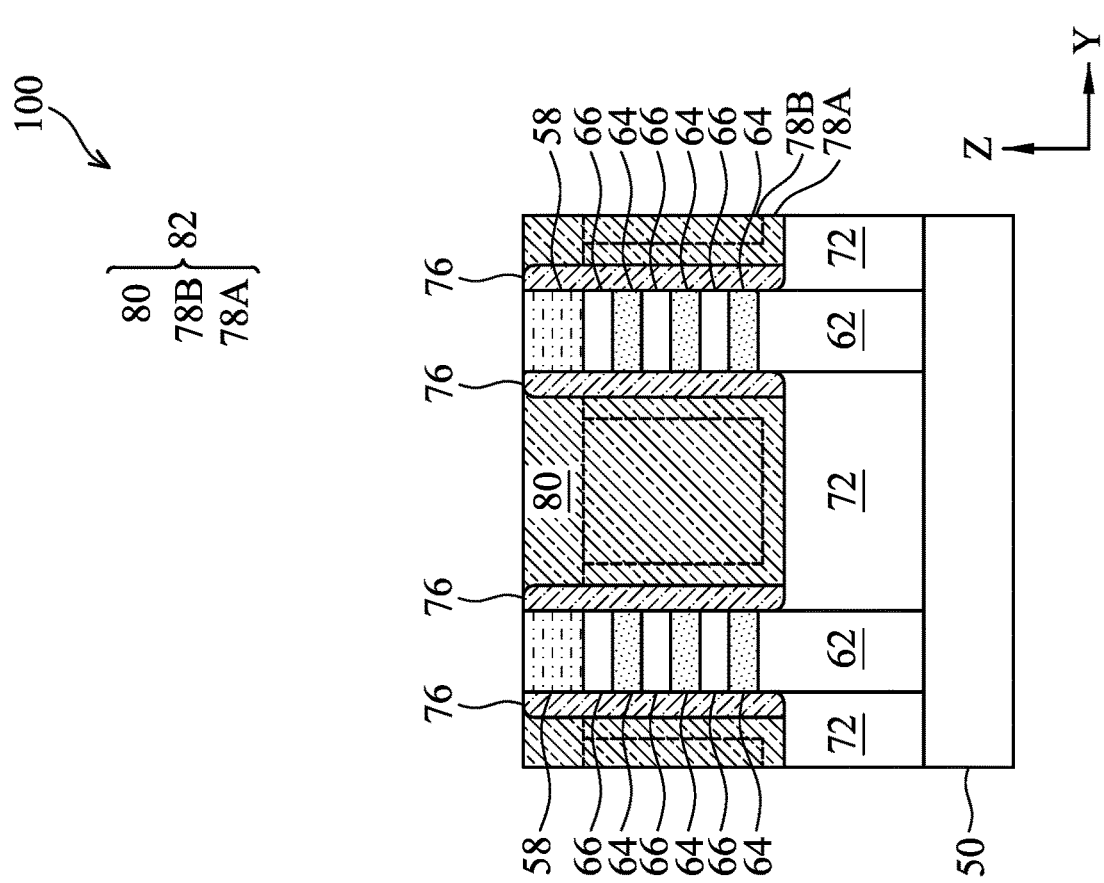
Figure 9B:
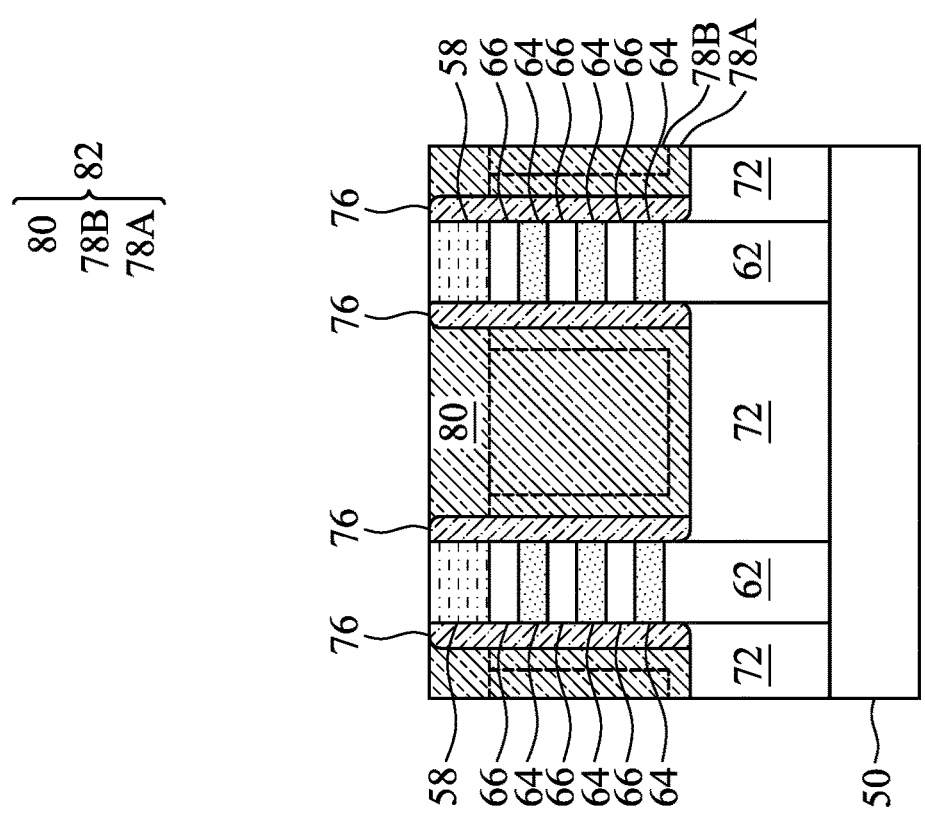

FIGS. 9A-C illustrate the forming of a dielectric capping layer 80 on the liner 78A and the fill material 78B, thereby forming the insulating fins 82. The dielectric capping layer 80 may fill a remaining area over the liner 78A, over the fill material 78B, and between sidewalls of the mask 58. The dielectric capping layer 80 may be formed by an acceptable deposition process such as ALD, CVD, PVD, or the like.

The dielectric capping layer 80 may be formed of one or more dielectric material(s) having a high etch selectivity from the etching of the semiconductor fins 62, the nanostructures 64, 66, the cladding spacers 76, the liner 78A, and the fill material 78B. For example, the dielectric capping layer 80 may comprise a high-k material such as hafnium oxide, zirconium oxide, zirconium aluminum oxide, hafnium aluminum oxide, hafnium silicon oxide, aluminum oxide, the like, or combinations thereof. In this way, the dielectric capping layer 80 may serve as a hard mask that protects the underlying liner 78A and the fill material 78B from over etch in subsequent processes.

The dielectric capping layer 80 may be formed to initially cover the mask 58 and the nanostructures 64, 66. Subsequently, a removal process is applied to remove excess material(s) of the dielectric capping layer 80. In some embodiments, a planarization process such as a CMP, an etch-back process, combinations thereof, or the like may be utilized. The planarization process exposes the masks 58 such that top surfaces of the masks 58, the cladding spacers 76, and the dielectric capping layer 80 are coplanar (within process variations). In the illustrated embodiment, the masks 58 remain after the planarization process. In some embodiments, portions of or the entirety of the masks 58 may also be removed by the planarization process.

As a result, insulating fins 82 are formed between and contacting the cladding spacers 76. The insulating fins 82 comprise the liner 78A, the fill material 72B, and the dielectric capping layer 80. The cladding spacers 76 space the insulating fins 82 apart from the nanostructures 64, 66, and a size of the insulating fins 82 may be adjusted by adjusting a thickness of the cladding spacers 76.

In FIGS. 10A-C, the mask 58 is removed using an etching process, for example. The etching process may be a wet etch that selectively removes the mask 58 without significantly etching the insulating fins 82. The etching process may be anisotropic. Further, the etching process (or a separate, selective etching process) may also be applied to reduce a height of the cladding spacers 76 to a similar level (e.g., same within processing variations) as the stacked nanostructures 64, 66. After the etching process(es), a topmost surface of the stacked nanostructures 64, 66 and the cladding spacers 76 may be exposed and may be lower than a topmost surface of the insulating fins 82.

Figure 11A:
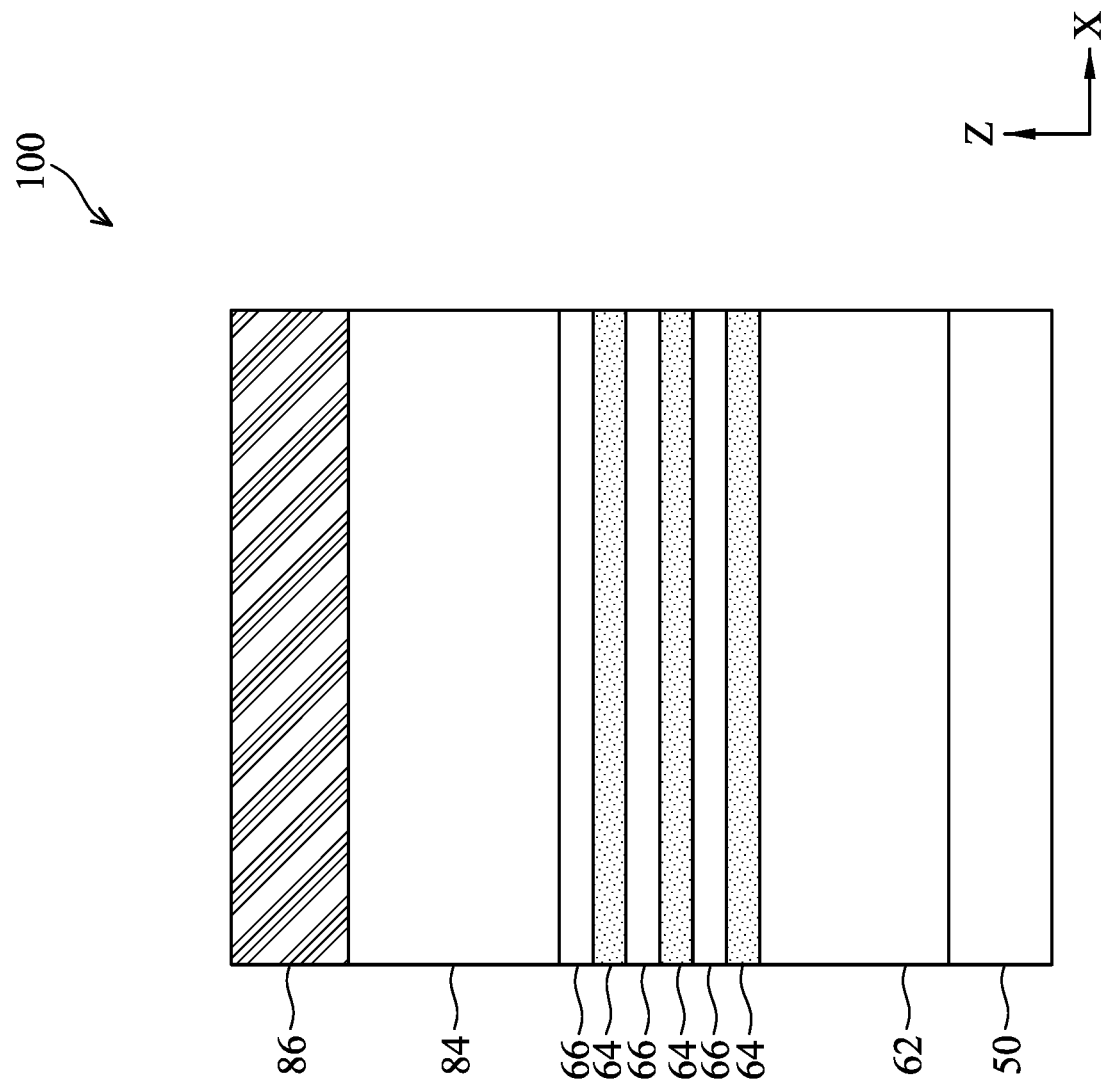
Figure 11C:
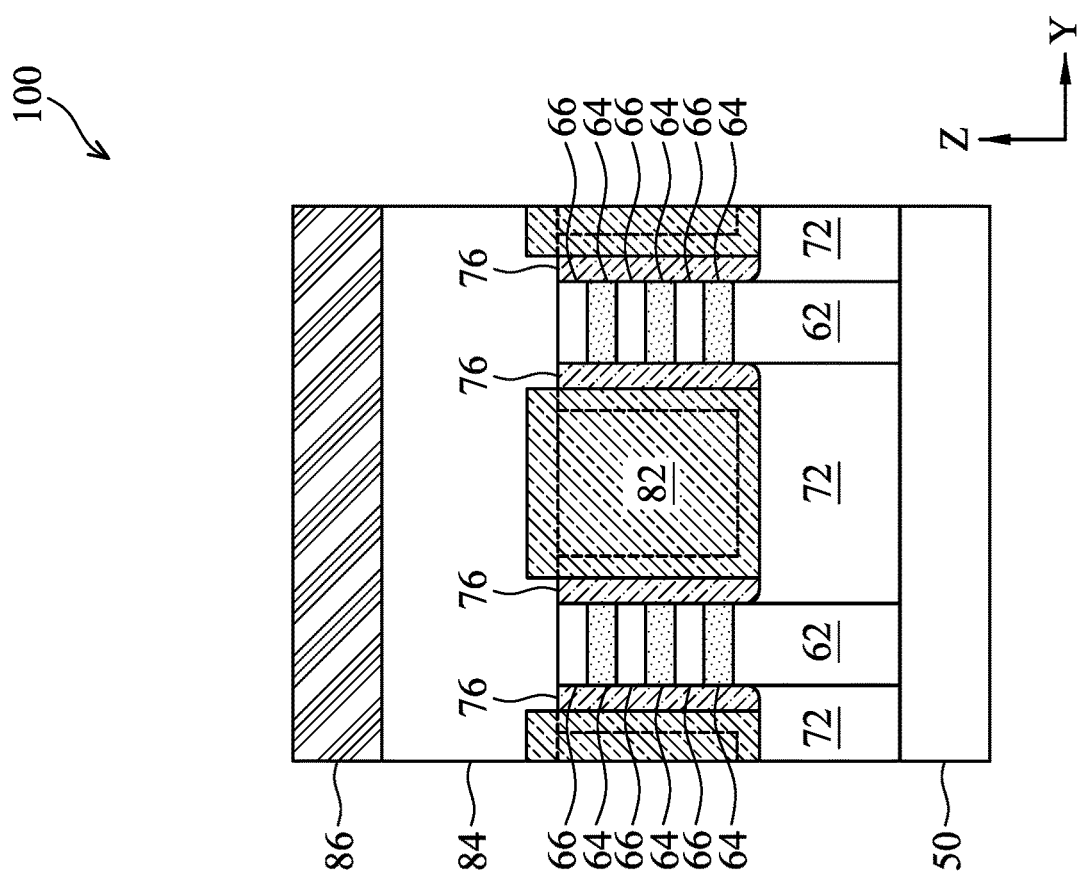
Figure 11B:
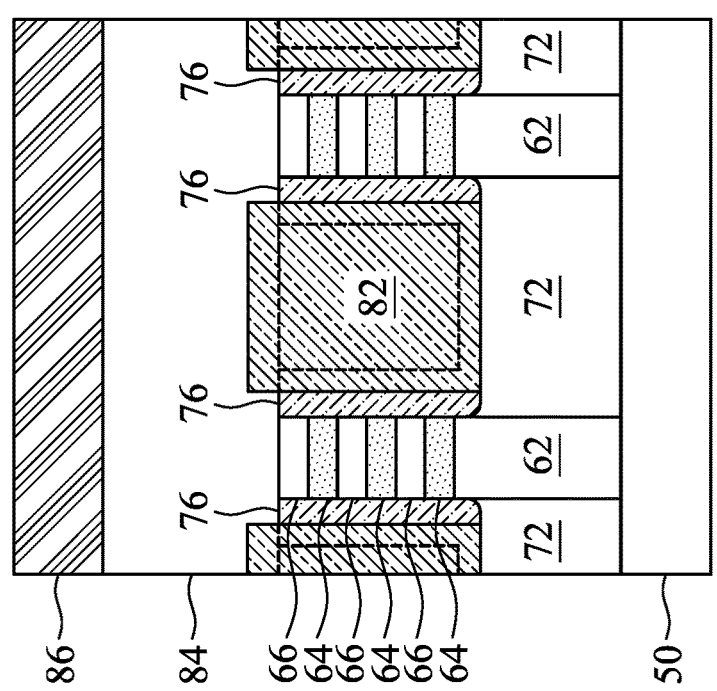

In FIG. 11A-C, a dummy gate layer 84 is formed on the insulating fins 82, the cladding spacers 76, and the nanostructures 64, 66. Because the nanostructures 64, 66 and the cladding spacers 76 extend lower than the insulating fins 82, the dummy gate layer 84 may be disposed along exposed sidewalls of the insulating fins 82. The dummy gate layer 84 may be deposited and then planarized, such as by a CMP. The dummy gate layer 84 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 84 may also be formed of a semiconductor material (such as one selected from the candidate semiconductor materials of the substrate 50), which may be grown by a process such as vapor phase epitaxy (VPE) or molecular beam epitaxy (MBE), deposited by a process such as chemical vapor deposition (CVD) or atomic layer deposition (ALD), or the like. The dummy gate layer 84 may be formed of material(s) that have a high etch selectivity from the etching of insulation materials, e.g., the insulating fins 82. A mask layer 86 may be deposited over the dummy gate layer 84. The mask layer 86 may be formed of one or more dielectric material layers, such as silicon nitride, silicon oxynitride, or the like. In this example, a single dummy gate layer 84 and a single mask layer 86 are formed across the first region 50A and the second region 50B.

Figure 12A:
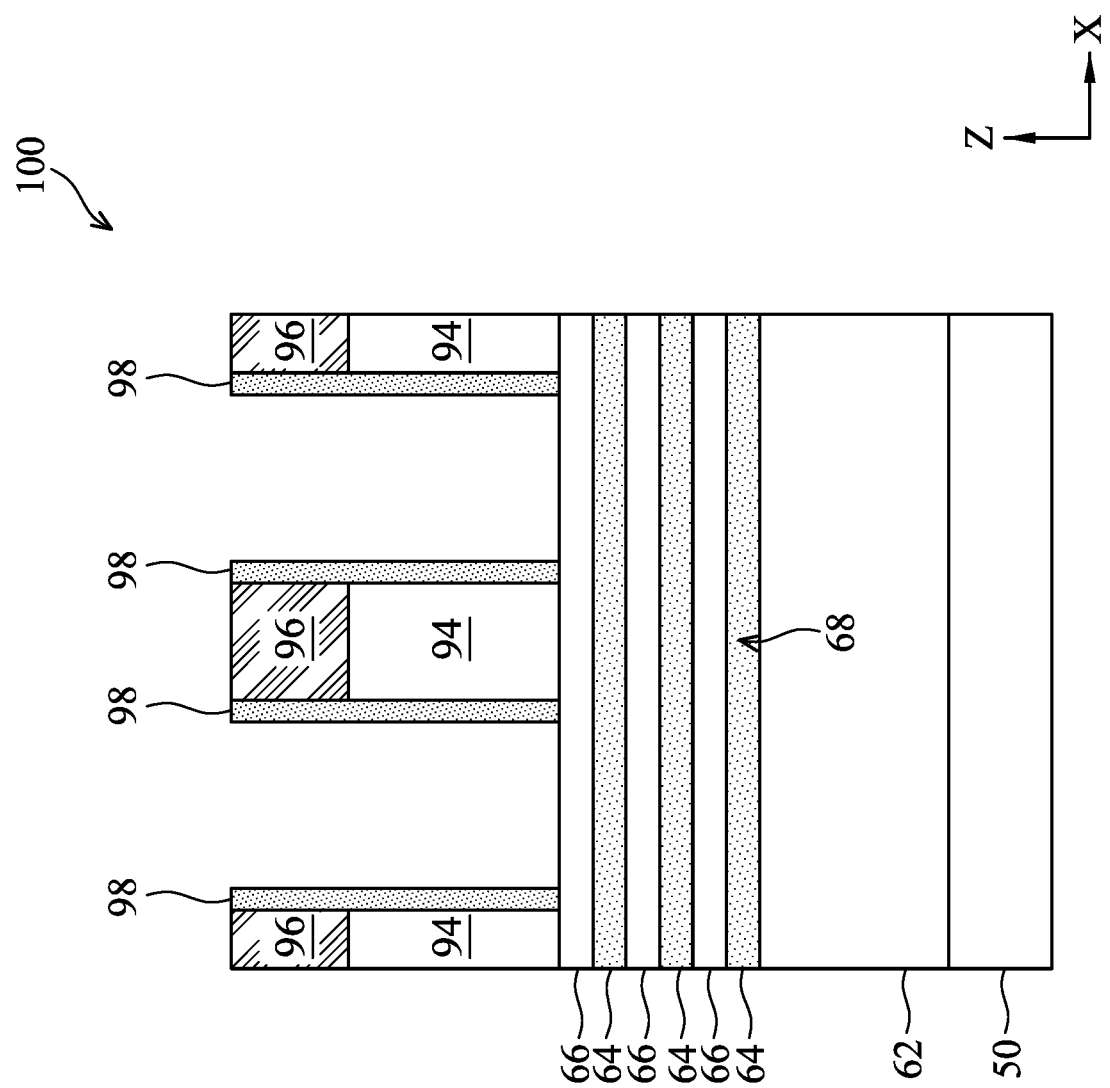
Figure 12C:
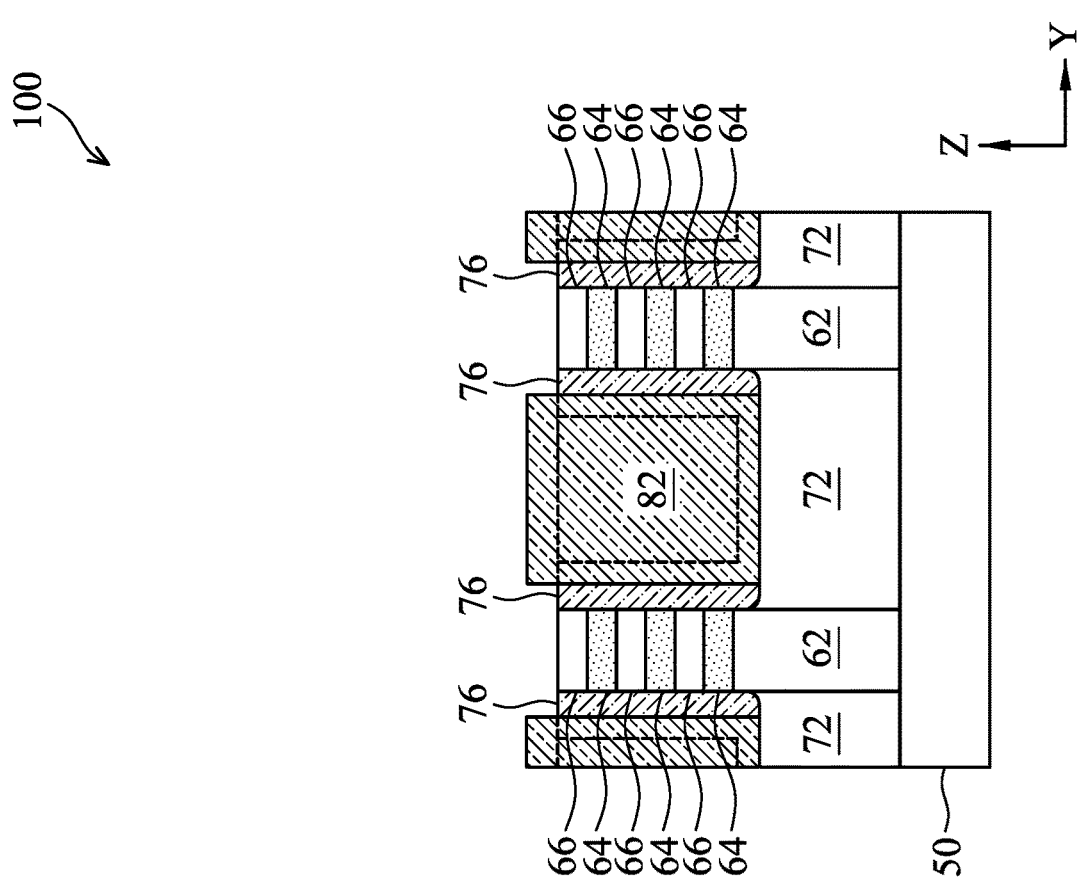
Figure 12B:
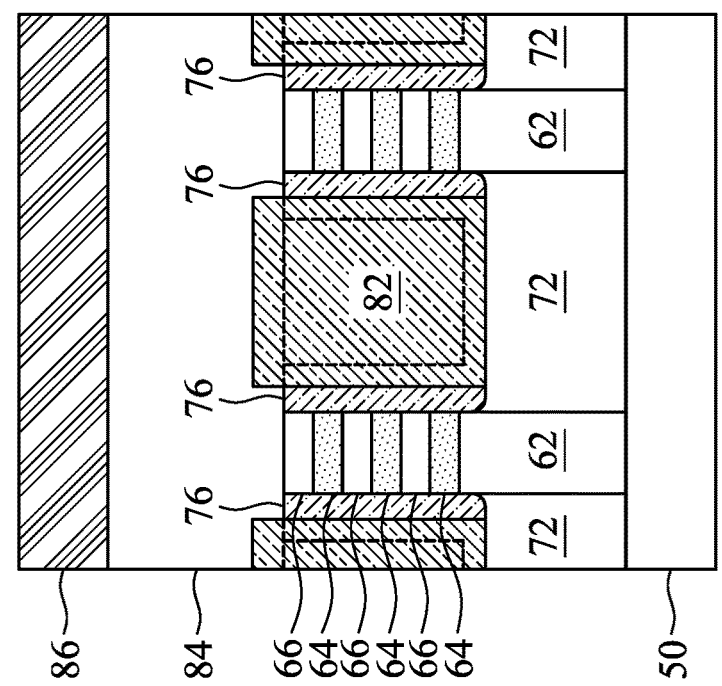

In FIGS. 12A-12C, the mask layer 86 is patterned using acceptable photolithography and etching techniques to form masks 96. The pattern of the masks 96 is then transferred to the dummy gate layer 84 by any acceptable etching technique to form dummy gates 94. The dummy gates 94 covers the top surface of the nanostructures 64, 66 that will be used to form channel regions. The pattern of the masks 96 may be used to physically separate adjacent dummy gates 94. The dummy gates 94 may also have lengthwise directions substantially perpendicular (within process variations) to the lengthwise directions of the semiconductor fins 62. The masks 96 can optionally be removed after patterning, such as by any acceptable etching technique.

The cladding spacers 76 and the dummy gates 94 collectively extend along the portions of the nanostructures 66 that will be patterned to form channel regions 68. Subsequently formed gate structures will replace the cladding spacers 76 and the dummy gates 94.

As noted above, the dummy gates 94 may be formed of a semiconductor material. In some embodiments, the nanostructures 64, the cladding spacers 76, and the dummy gates 94 are each formed of semiconductor materials. In some embodiments, the nanostructures 64 and the cladding spacers 76 are formed of a first semiconductor material (e.g., silicon germanium) and the dummy gates 94 are formed of a second semiconductor material (e.g., silicon), so that during a replacement gate process, the dummy gates 94 may be removed in a first etching step, and the nanostructures 64 and the cladding spacers 76 may be removed together in a second etching step. When the nanostructures 64 and the cladding spacers 76 are formed of silicon germanium: the nanostructures 64 and the cladding spacers 76 may have similar germanium concentrations, the nanostructures 64 may have a greater germanium concentration than the cladding spacers 76, or the cladding spacers 76 may have a greater germanium concentration than the nanostructures 64. In some embodiments, the nanostructures 64 are formed of a first semiconductor material (e.g., silicon germanium) and the cladding spacers 76 and the dummy gates 94 are formed of a second semiconductor material (e.g., silicon), so that during a replacement gate process, the cladding spacers 76 and the dummy gates 94 may be removed together in a first etching step, and the nanostructures 64 may be removed in a second etching step.

Gate spacers 98 are formed over the nanostructures 64, 66, and on exposed sidewalls of the masks 96 (if present) and the dummy gates 94. The gate spacers 98 may be formed by conformally depositing one or more dielectric material(s) on the dummy gates 94 and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 94 (thus forming the gate spacers 98). After etching, the gate spacers 98 can have curved sidewalls or can have straight sidewalls.

Further, implants may be performed to form lightly doped source/drain (LDD) regions (not separately illustrated). Appropriate type impurities (e.g., n-type or p-type) may be implanted into the semiconductor fins 62 and/or the nanostructures 64, 66. The n-type impurities may be any of the n-type impurities previously described, and the p-type impurities may be any of the p-type impurities previously described. During the implanting, the channel regions 68 remain covered by the dummy gates 94, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 13A:
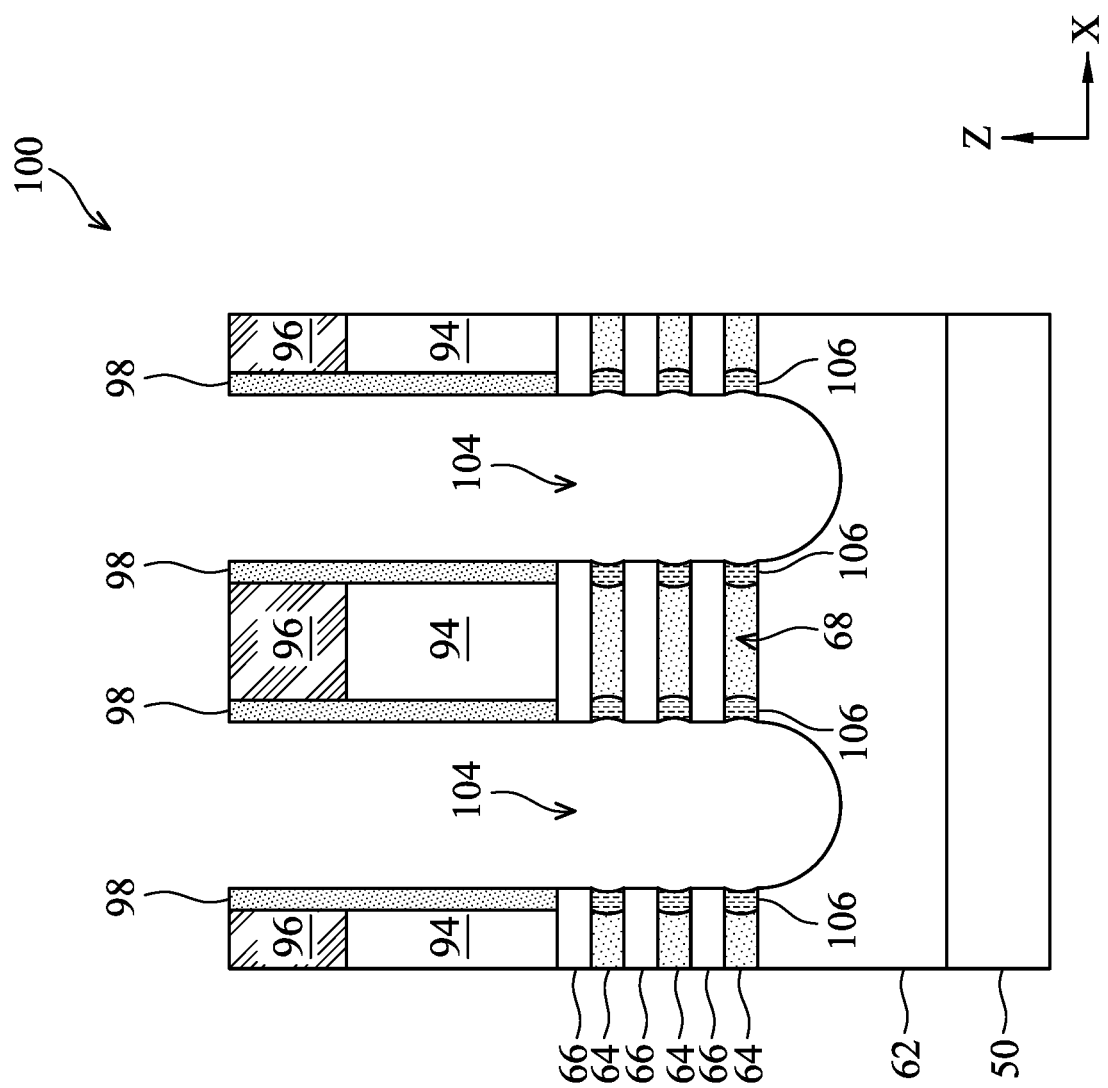

In FIGS. 13A-C, source/drain recesses 104 are formed in the nanostructures 64, 66 and the cladding spacers 76. In the illustrated embodiment, the source/drain recesses 104 extend through the nanostructures 64, 66 and the cladding spacers 76 into the semiconductor fins 62. The source/drain recesses 104 may also extend into the substrate 50. In various embodiments, the source/drain recesses 104 may extend to a top surface of the substrate 50 without etching the substrate 50; the semiconductor fins 62 may be etched such that bottom surfaces of the source/drain recesses 104 are disposed below the top surfaces of the isolation regions 72; or the like. The source/drain recesses 104 may be formed by etching the nanostructures 64, 66 and the cladding spacers 76 using an anisotropic etching process, such as a RIE, a NBE, or the like. The gate spacers 98 and the dummy gates 94 collectively mask portions of the semiconductor fins 62 and/or the nanostructures 64, 66 in the channel region during the etching processes used to form the source/drain recesses 104. A single etch process may be used to etch the nanostructures 64, 66 and the cladding spacers 76, or multiple etch processes may be used to etch the nanostructures 64, 66 and the cladding spacers 76 individually. Timed etch processes may be used to stop the etching of the source/drain recesses 104 after the source/drain recesses 104 reach a desired depth.

Inner spacers 106 are formed on the sidewalls of the nanostructures 64, e.g., those sidewalls exposed by the source/drain recesses 104, and epitaxial source/drain regions 108 are formed in the source/drain recesses 104 as illustrated in FIGS. 13A-C. As will be subsequently described in greater detail, source/drain regions will be subsequently formed in the source/drain recesses 104, and the nanostructures 64 will be subsequently replaced with corresponding gate structures. The inner spacers 106 act as isolation features between the subsequently formed source/drain regions and the subsequently formed gate structures. Further, the inner spacers 106 may be used to substantially prevent damage to the subsequently formed source/drain regions by subsequent etching processes, such as etching processes used to subsequently remove the nanostructures 64.

As an example to form the inner spacers 106, the source/drain recesses 104 can be laterally expanded. Specifically, portions of the sidewalls of the nanostructures 64 exposed by the source/drain recesses 104 may be recessed. Although sidewalls of the nanostructures 64 are illustrated as being concave, the sidewalls may be straight or convex. The sidewalls may be recessed by any acceptable etching process, such as one that is selective to the nanostructures 64 (e.g., selectively etches the materials of the nanostructures 64 at a faster rate than the material of the nanostructures 66). The etching may be isotropic. For example, when the nanostructures 66 are formed of silicon and the nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas.

The inner spacers 106 are then formed on the recessed sidewalls of the nanostructures 64. The inner spacers 106 can be formed by conformally forming an insulating material and subsequently etching the insulating material. The insulating material may be silicon nitride or silicon oxynitride, although any suitable material, such as a low-k dielectric material, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 106 are illustrated as being recessed with respect to the sidewalls of the gate spacers 98, the outer sidewalls of the inner spacers 106 may extend beyond or be flush with the sidewalls of the gate spacers 98. In other words, the inner spacers 106 may partially fill, completely fill, or overfill the sidewall recesses. Moreover, although the sidewalls of the inner spacers 106 are illustrated as being concave, the sidewalls of the inner spacers 106 may be straight or convex.

Figure 14A:
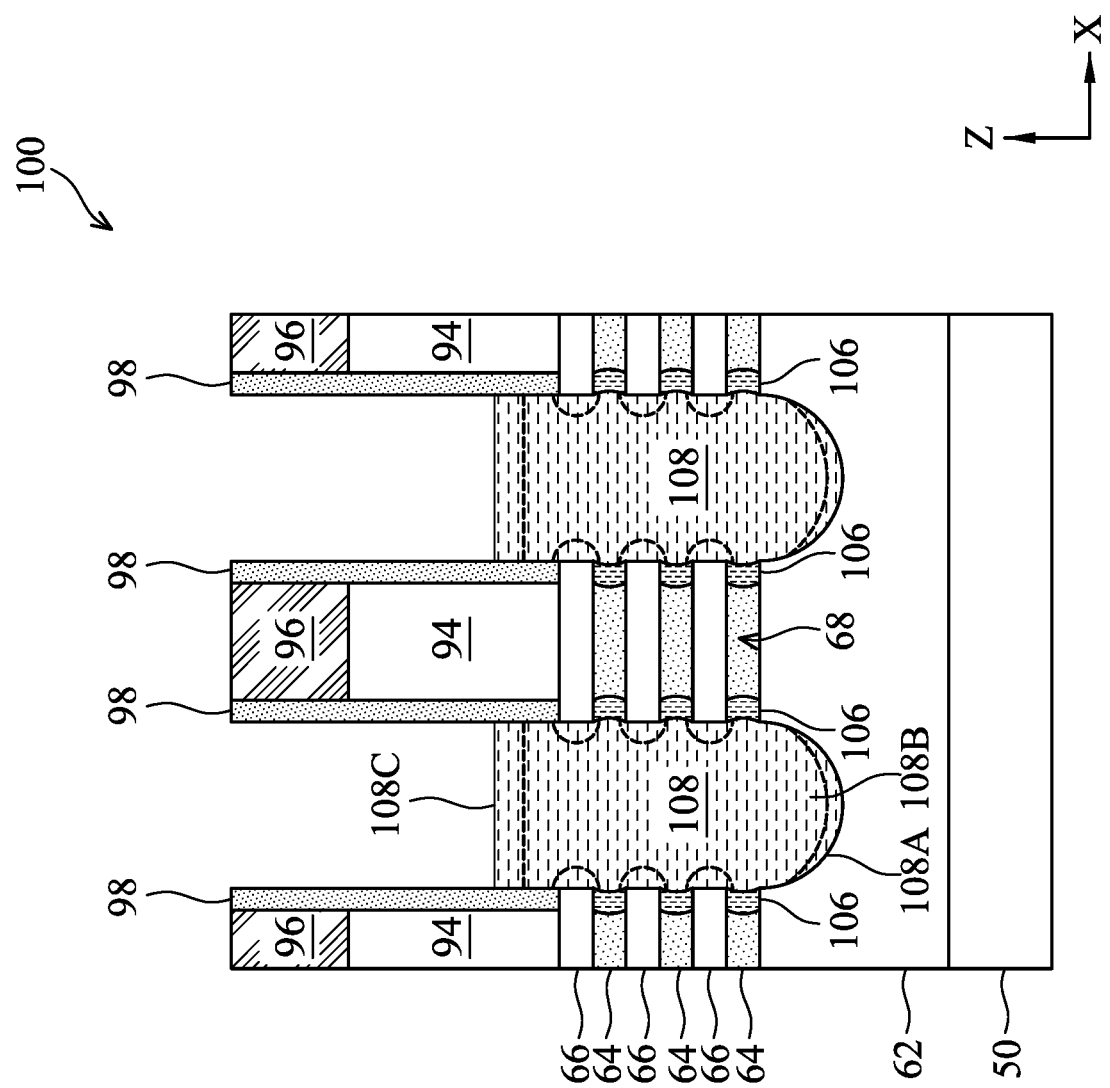

In FIGS. 14A-C, the epitaxial source/drain regions 108 are formed in the source/drain recesses 104 such that each dummy gate 94 (and corresponding channel region 68) is disposed between respective adjacent pairs of the epitaxial source/drain regions 108. In some embodiments, the gate spacers 98 and the inner spacers 106 are used to separate the epitaxial source/drain regions 108 from, respectively, the dummy gates 94 and the nanostructures 64 by an appropriate lateral distance so that the epitaxial source/drain regions 108 do not short out with subsequently formed gates of the resulting nanostructure-FETs 100. A material of the epitaxial source/drain regions 108 may be selected to exert stress in the respective channel regions 68, thereby improving performance.

The epitaxial source/drain regions 108 are epitaxially grown in the source/drain recesses 104. The epitaxial source/drain regions 108 may include any acceptable material, such as appropriate for the n-type or p-type device. For example, when n-type devices are formed and the nanostructures 66 are silicon, the epitaxial source/drain regions 108 may include materials exerting a tensile strain in the channel regions, such as silicon, SiC, SiCP, SiP, or the like. Likewise, when p-type devices are formed and the nanostructures 66 are silicon, the epitaxial source/drain regions 108 may include materials exerting a compressive strain in the channel regions, such as SiGe, SiGeB, Ge, GeSn, or the like.

The epitaxial source/drain regions 108 and/or the fins 62 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 108 may be in situ doped during growth.

The epitaxial source/drain regions 108 may include one or more semiconductor material layers. For example, the epitaxial source/drain regions 108 may each include a liner layer 108A, a main layer 108B, and a finishing layer 108C (or more generally, a first semiconductor material layer, a second semiconductor material layer, and a third semiconductor material layer). Any number of semiconductor material layers may be used for the epitaxial source/drain regions 108. Each of the liner layer 108A, the main layer 108B, and the finishing layer 108C may be formed of different semiconductor materials and may be doped to different impurity concentrations. In some embodiments, the liner layer 108A may have a lesser concentration of impurities than the main layer 108B, and the finishing layer 108C may have a greater concentration of impurities than the liner layer 108A and a lesser concentration of impurities than the main layer 108B. In embodiments in which the epitaxial source/drain regions include three semiconductor material layers, the liner layers 108A may be grown in the source/drain recesses 104, the main layers 108B may be grown on the liner layers 108A, and the finishing layers 108C may be grown on the main layers 108B.

As a result of the epitaxy processes used to form the epitaxial source/drain regions 108, upper surfaces of the epitaxial source/drain regions have facets which expand laterally outward beyond sidewalls of the semiconductor fins 62 and the nanostructures 64, 66. However, the insulating fins 82 block the lateral epitaxial growth. Therefore, adjacent epitaxial source/drain regions 108 remain separated after the epitaxy process is completed as illustrated by FIG. 14C. The epitaxial source/drain regions 108 contact the sidewalls of the insulating fins 82. In the illustrated embodiment, the epitaxial source/drain regions 108 are grown so that the upper surfaces of the epitaxial source/drain regions 108 are disposed below the top surfaces of the insulating fins 82. In various embodiments, the upper surfaces of the epitaxial source/drain regions 108 are disposed above the top surfaces of the insulating fins 82; the upper surfaces of the epitaxial source/drain regions 108 have portions disposed above and below the top surfaces of the insulating fins 82; or the like.

Figure 15A:
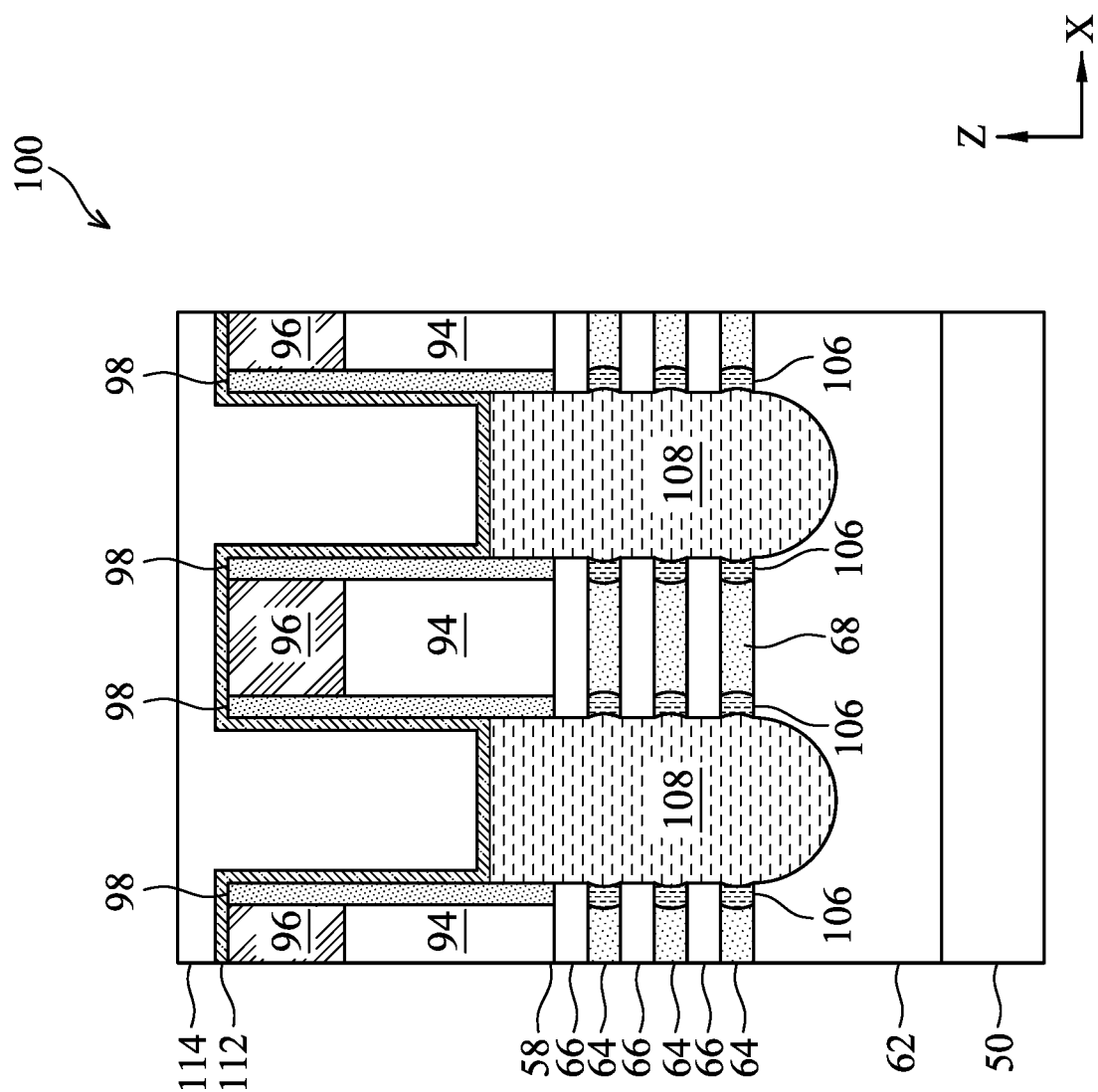
Figure 15C:
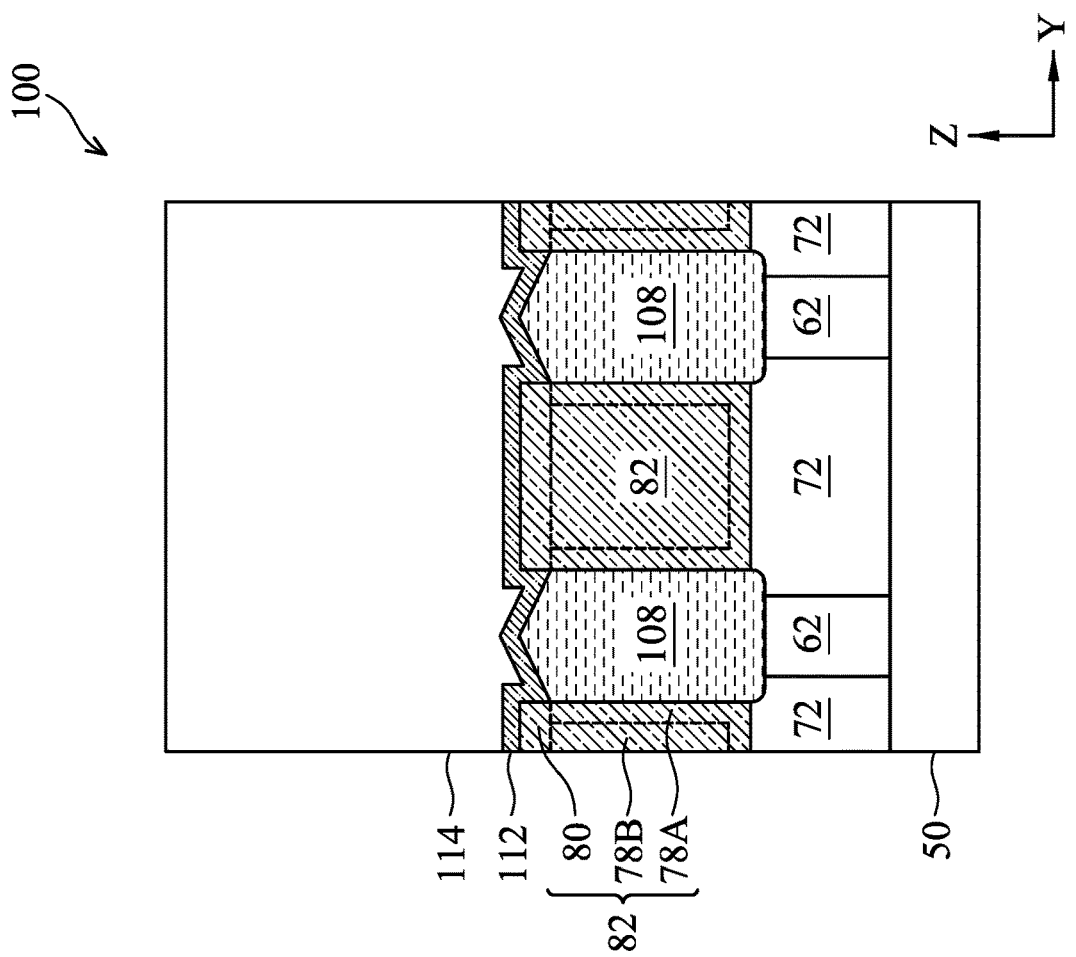
Figure 15B:
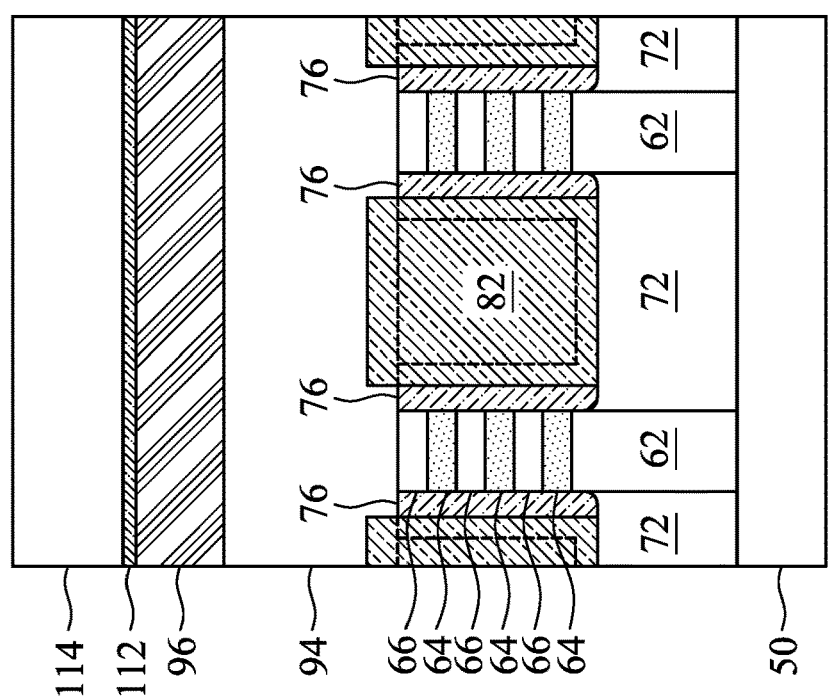

In FIGS. 15A-C, a first inter-layer dielectric (ILD) 114 is deposited over the epitaxial source/drain regions 108, the gate spacers 98, the masks 96 (if present) or the dummy gates 94. The first ILD 114 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed over the epitaxial source/drain regions 108, the gate spacers 98, and the masks 96 (if present) or the dummy gates 94, and the first ILD 114 is formed over the CESL 112. The CESL 112 may be formed of a dielectric material, such as silicon nitride, silicon oxide, silicon oxynitride, or the like, having a high etch selectivity from the etching of the first ILD 114. The CESL 112 may be formed by any suitable method, such as CVD, ALD, or the like.

Figure 16A:
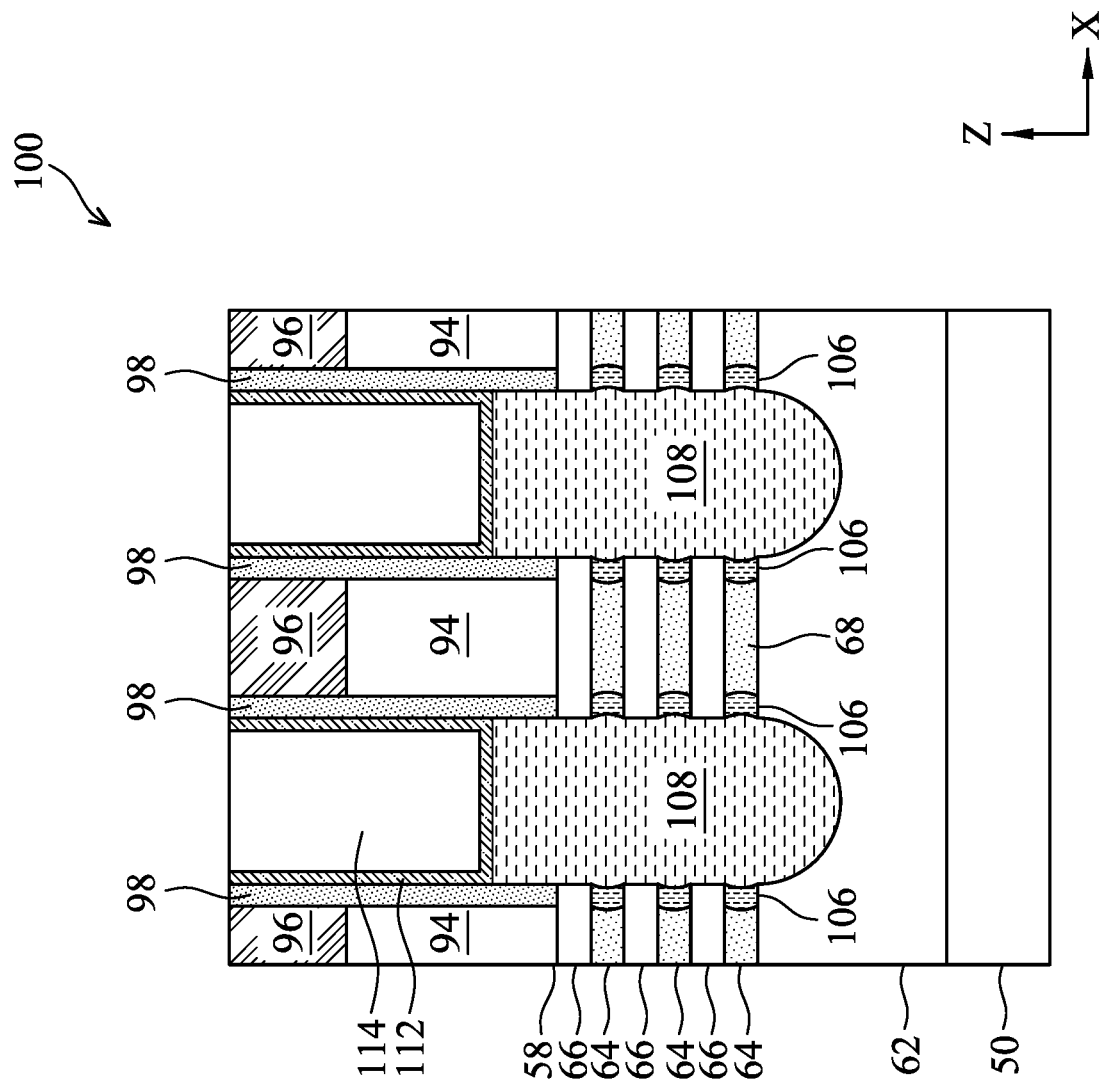
Figure 16C:
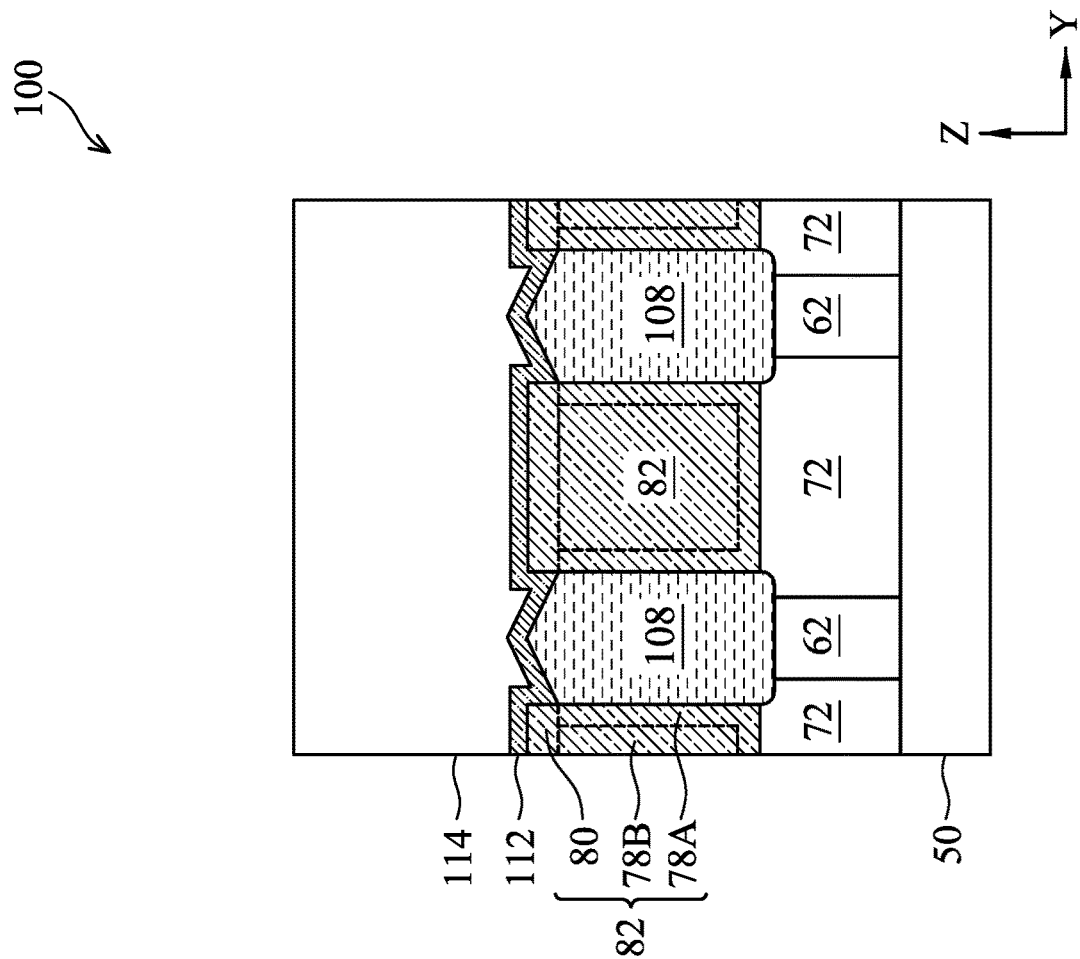
Figure 16B:
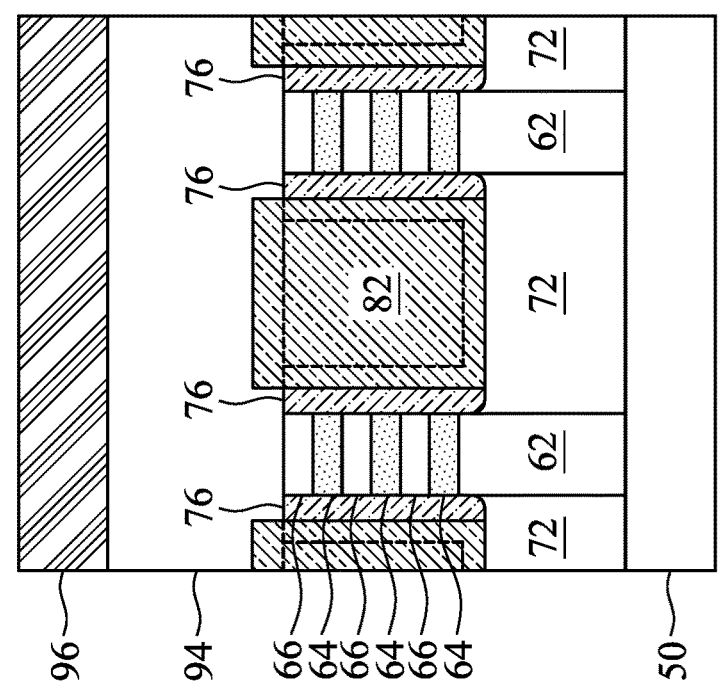

In FIGS. 16A-C, a removal process is performed to level the top surfaces of the first ILD 114 with the top surfaces of the masks 96 (if present) or the dummy gates 94. In some embodiments, a planarization process such as a chemical mechanical polish (CMP), an etch-back process, combinations thereof, or the like may be utilized. The planarization process may also remove the masks 96 on the dummy gates 94, and portions of the gate spacers 98 along sidewalls of the masks 96. After the planarization process, the top surfaces of the gate spacers 98, the first ILD 114, the CESL 112, and the masks 96 (if present) or the dummy gates 94 are coplanar (within process variations). Accordingly, the top surfaces of the masks 96 (if present) or the dummy gates 94 are exposed through the first ILD 114. In the illustrated embodiment, the masks 96 remain, and the planarization process levels the top surfaces of the first ILD 114 with the top surfaces of the masks 96.

Figure 17A:
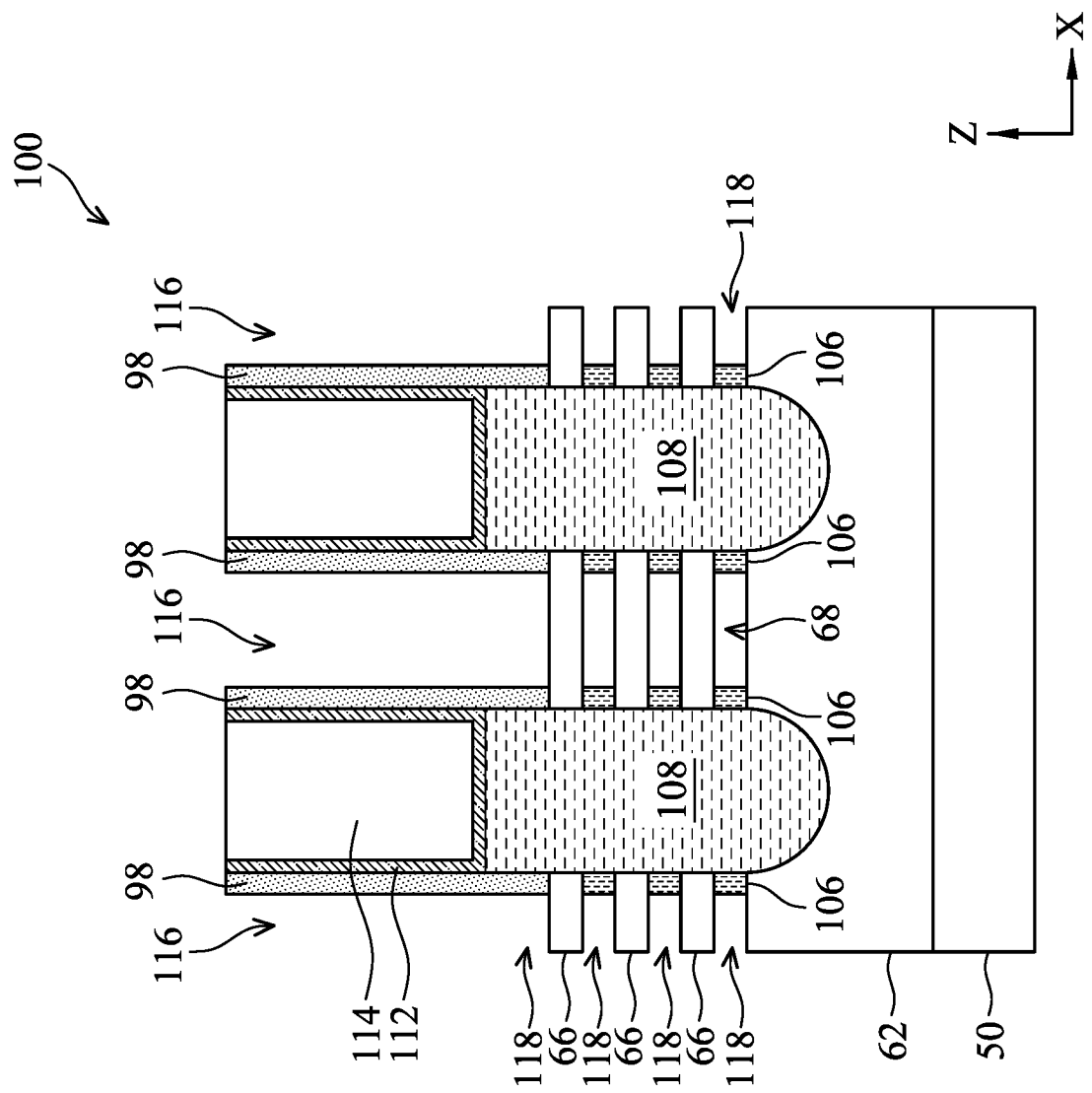
Figure 17C:
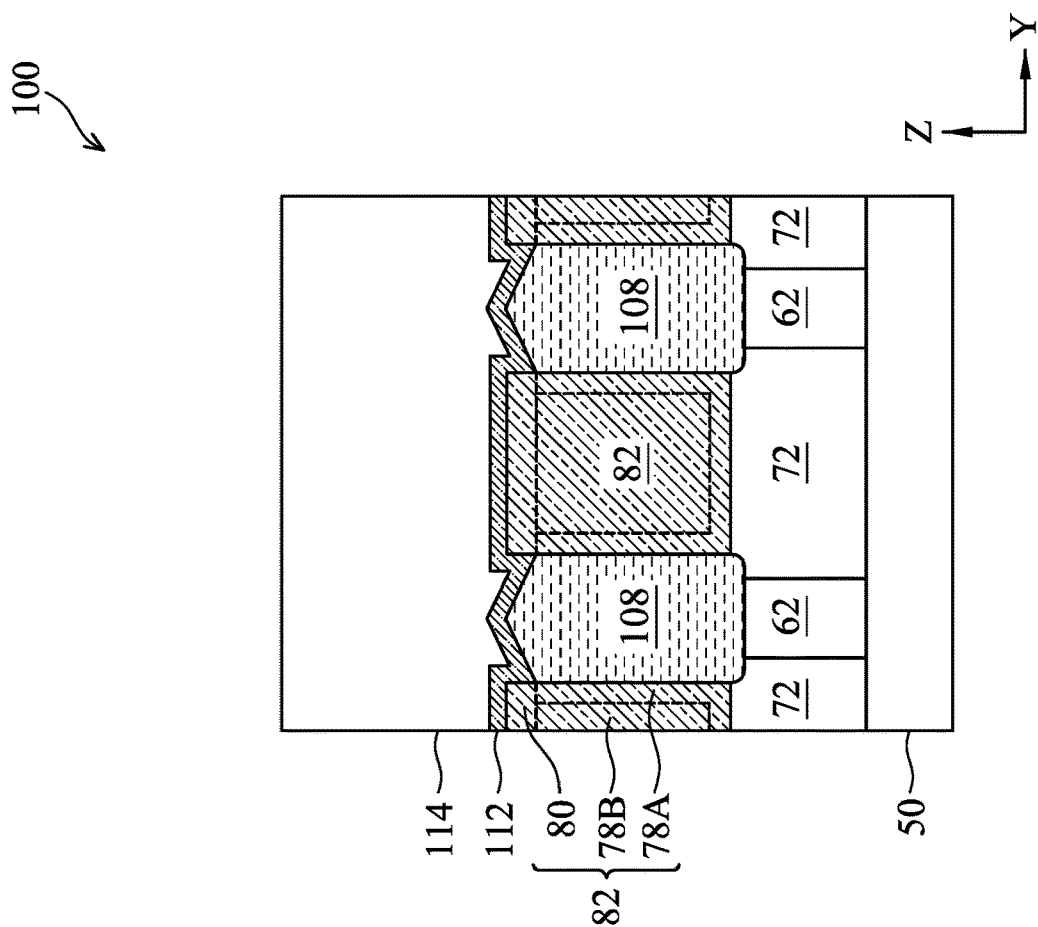
Figure 17B:
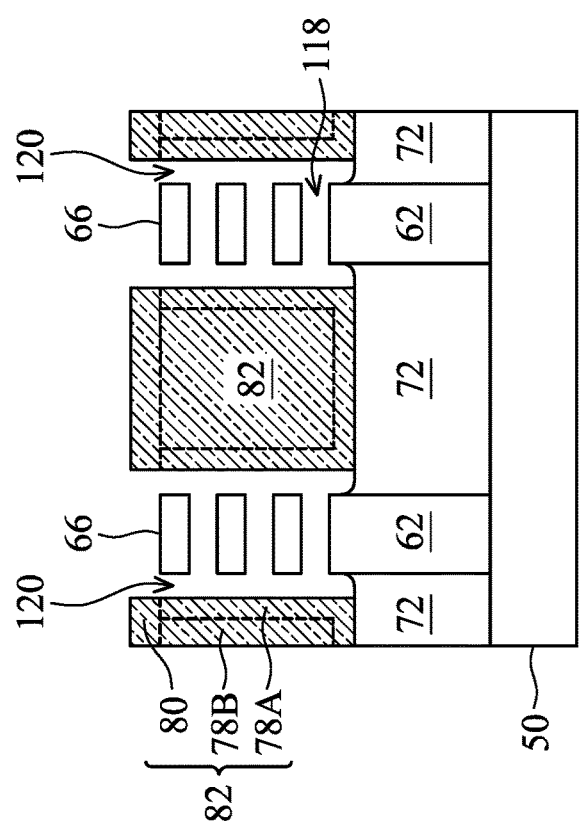

In FIGS. 17A-C, the masks 96 (if present) and the dummy gates 94 are removed in an etching process, so that recesses 116 are formed, thereby exposing channel regions 68. Portions of the nanostructures 66, which act as the channel regions 68, are disposed between adjacent pairs of the epitaxial source/drain regions 108. In some embodiments, the dummy gates 94 are removed by an anisotropic dry etch process. For example, the etching process may include a dry etch process using reaction gas(es) that selectively etch the dummy gates 94 at a faster rate than the first ILD 114 or the gate spacers 98.

The remaining portions of the cladding spacers 76 are then removed to expand the recesses 116, such that openings 120 are formed in regions between semiconductor fins 62 and the insulating fins 82, and the remaining portions of the nanostructures 64 are also removed to expand the recesses 116, such that openings 118 are formed in regions between the nanostructures 66. The remaining portions of the nanostructures 64 and the cladding spacers 76 can be removed by any acceptable etching process that selectively etches the material(s) of the nanostructures 64 and the cladding spacers 76 at a faster rate than the material of the nanostructures 66. The etching may be isotropic. For example, when the nanostructures 64 and the cladding spacers 76 are formed of silicon germanium and the nanostructures 66 are formed of silicon, the etching process may be a wet etch using tetramethylammonium hydroxide (TMAH), ammonium hydroxide (NH$_4$OH), or the like. In some embodiments, a trim process (not separately illustrated) is performed to decrease the thicknesses of the exposed portions of the nanostructures 66.

Figure 18A:
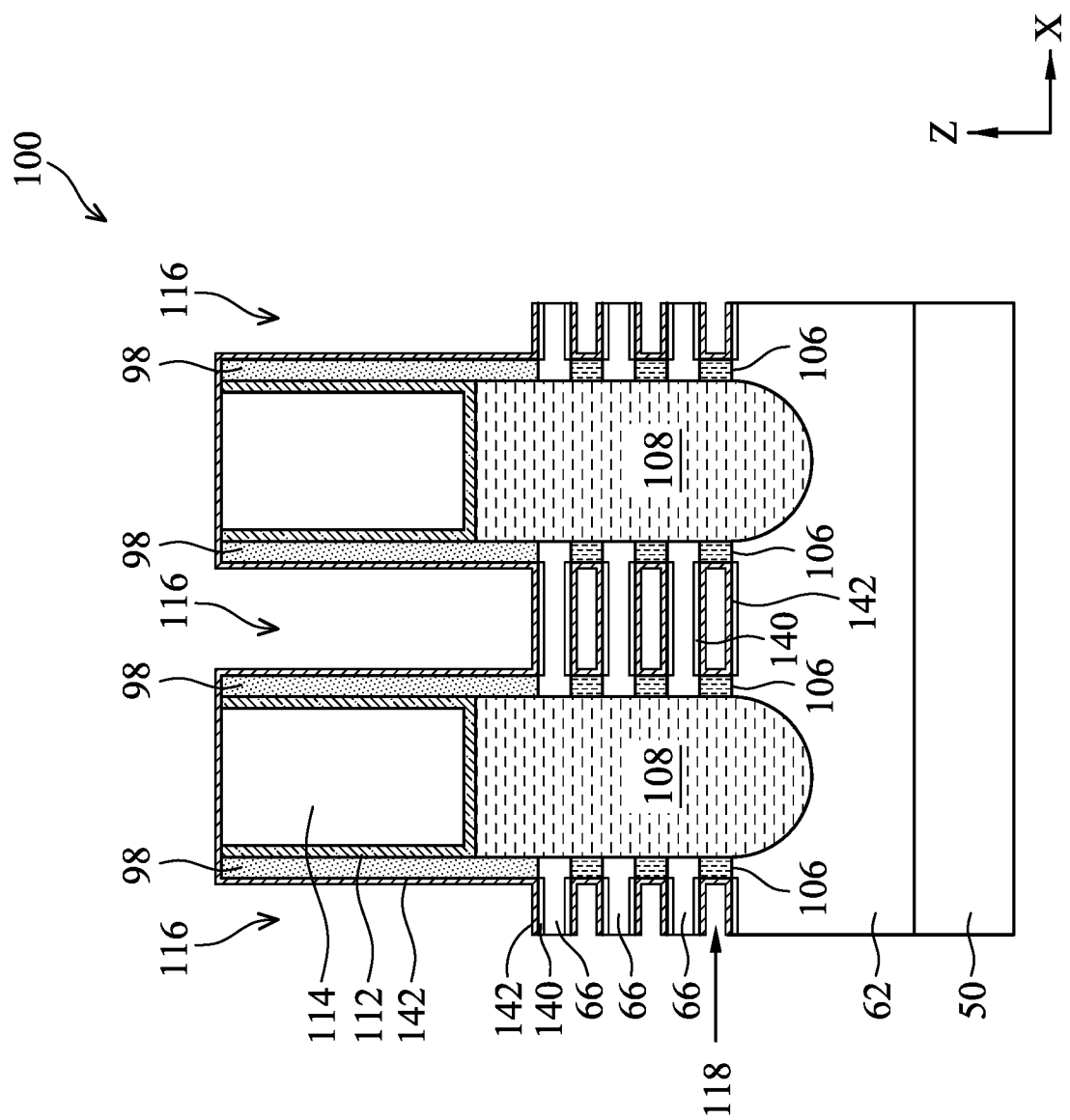
Figure 18B:
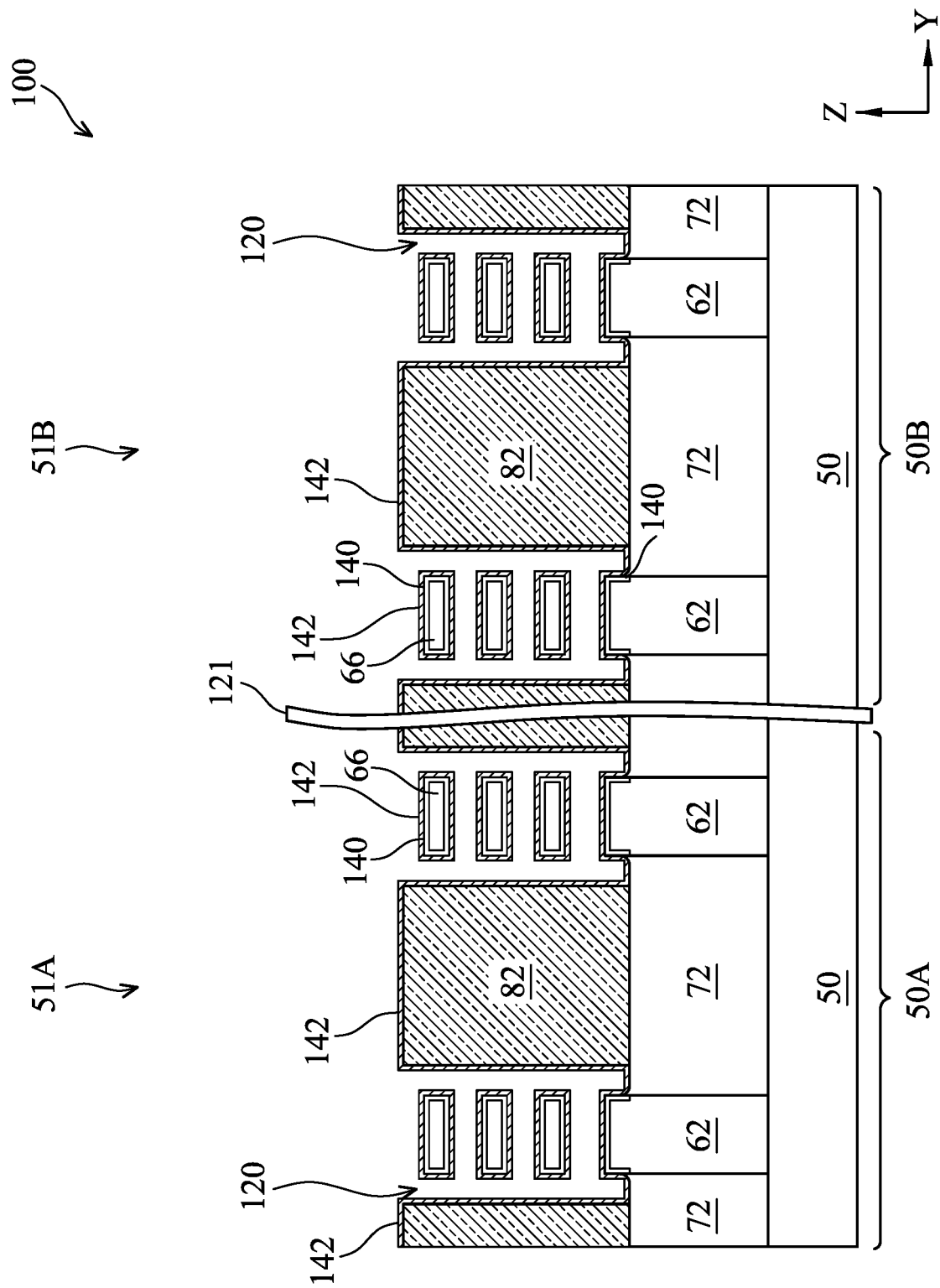

In FIGS. 18A and 18B, an interfacial layer 140 is formed over surfaces of the nanostructures 66 that are exposed by the recesses 116 and the openings 118 and 120. The interfacial layer 140 may also be formed over surfaces of the semiconductor fins 62 that are exposed by the openings 118. In some embodiments, the interfacial layer 140 is a dielectric material, and in particular, an oxide layer formed by oxidizing exterior portions (e.g., surface portions) of the nanostructures 66 (and/or the fins 62). In other words, the interfacial layer 140 is an oxide of the nanostructures 66, in some embodiments. Note that in the illustrated embodiment, the fins 62 and the nanostructures 66 are formed of the same material (e.g., silicon), although the fins 62 and the nanostructures 66 may comprise different materials in other embodiments. The interfacial layer 140 may be silicon oxide, silicon oxynitride, silicon germanium oxynitride, or the like. The interfacial layer 140 may be formed by thermal oxidization or chemical oxidization. In the illustrated embodiment, the interfacial layer 140 is formed by converting (e.g., oxidizing) the exterior portions of the nanostructure 66 and the semiconductor fins 62 into an oxide, and therefore, the interfacial layer 140 is selectively formed over the exposed surfaces of the nano structures 66 and the semiconductor fins 62, and is not formed over other surfaces, such as the sidewalls of the inner spacers 106 and the gate spacers 98. In some embodiments, the interfacial layer 140 may be omitted. The first region 50A and the second region 50B may be immediately adjacent to each other, or may be separated from each other, as shown by divider 121 in FIG. 18B.

A gate dielectric layer 142 is formed (e.g., conformally) over the interfacial layer 140 (e.g., wrapping around the nanostructures 66), along sidewalls of the gate spacers 98, and along the upper surface of the first ILD 114. In an example embodiment, the gate dielectric layer 142 includes a high-k dielectric material, and in these embodiments, the high-k dielectric material may have a k value greater than about 7.0 and may include a metal oxide or a metal silicate, such as the oxide or the silicate of Hf, Al, Zr, combinations thereof, or the like. A thickness of the gate dielectric layer 142 may be between about 8 angstroms and about 20 angstroms. The formation methods of the gate dielectric layer 142 may include Molecular-Beam Deposition (MBD), ALD, PECVD, and the like. In an embodiment, the gate dielectric layer 142 is formed by ALD at a temperature between about 200° C. and about 400° C.

Figure 19A:
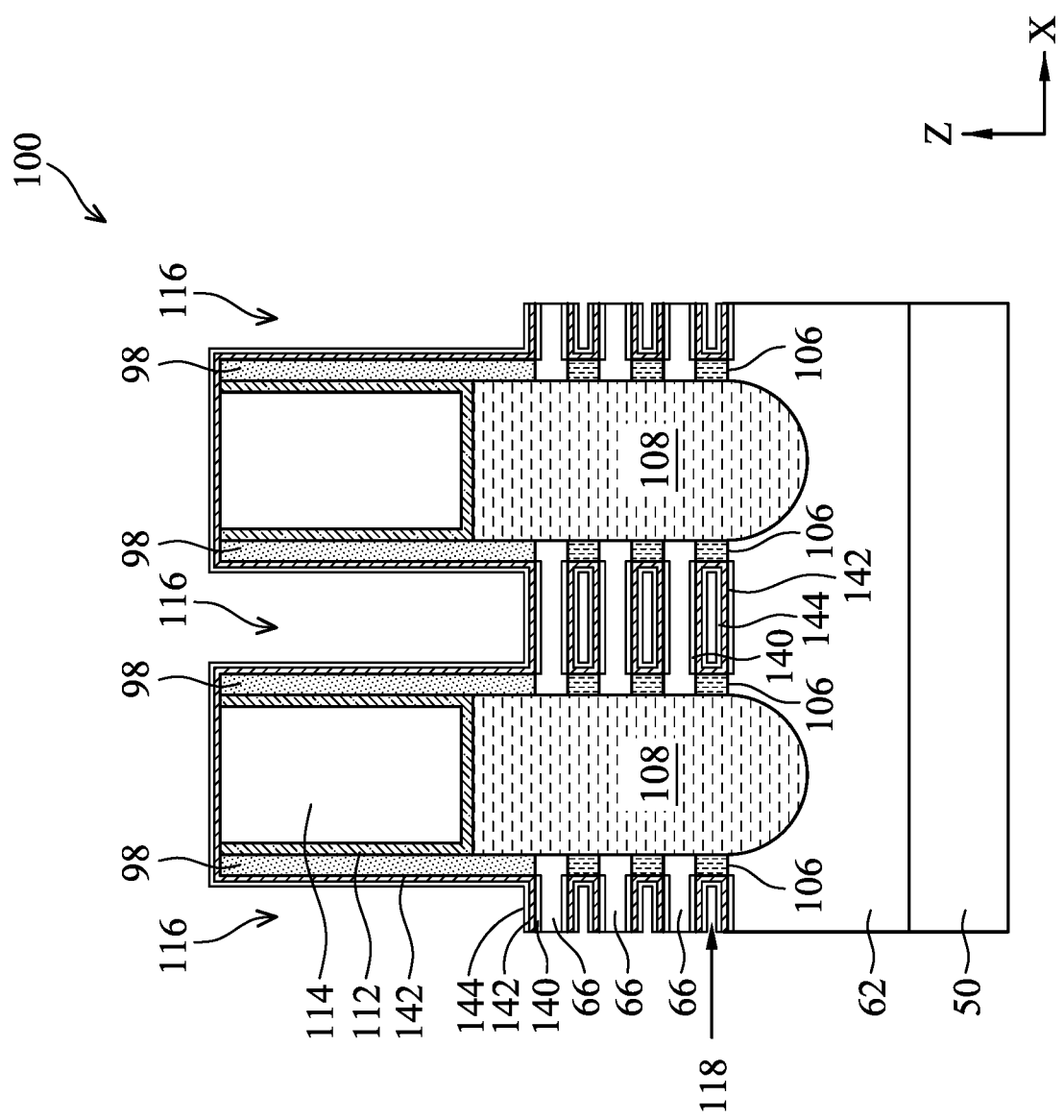
Figure 19B:
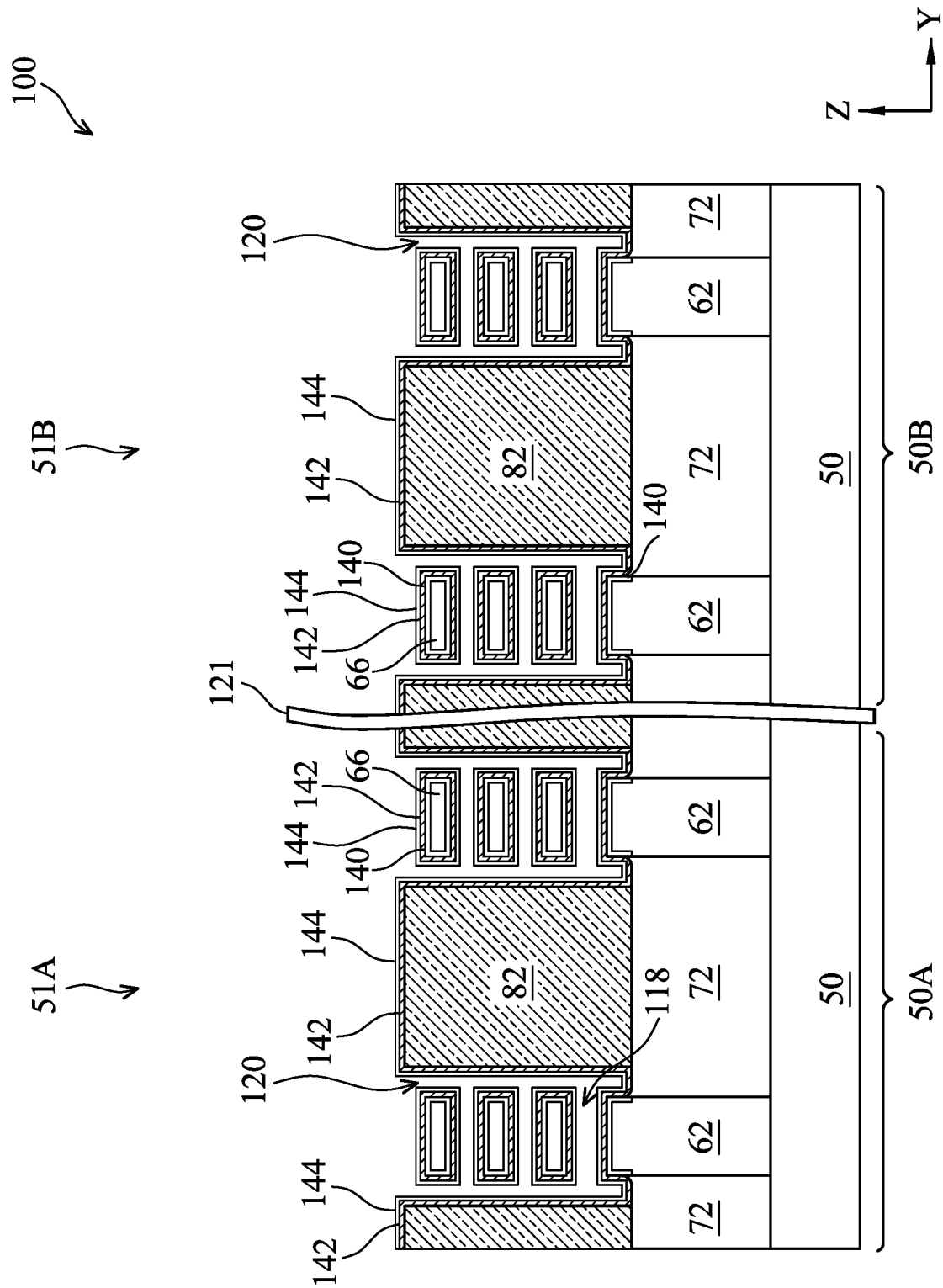

In FIGS. 19A and 19B, a dipole layer 144 is formed (e.g., conformally) over the gate dielectric layer 142 in accordance with some embodiments. The dipole layer 144 may be an oxide of a dipole element, and the dipole element may be a metal element. For example, the dipole element may be an n-type dipole element that may reduce the threshold voltage for an NMOS device and increase the threshold voltage for a PMOS device. Alternatively, the dipole element may be a p-type dipole element that may increase the threshold voltage for an NMOS device and reduce the threshold voltage for a PMOS device. In some embodiments, the n-type dipole element includes La, Y, Ti, or a combination thereof. In some embodiments, the p-type dipole includes Ge, Al, Ga, Zn, or a combination thereof. Exemplary materials for the n-type dipole layer 144 include LaO$_x$, YO$_x$, TiO$_x$, and etc. Exemplary materials for the p-type dipole layer 144 include GeO$_x$, AlO$_x$, GaO$_x$, ZnO$_x$, and etc. The dipole layer 144 may be formed any suitable deposition methods such as ALD or CVD. A thickness of the dipole layer 144 may be less than about 1 nm, for example, between about 2 angstroms and about 9 angstroms.

Figure 20A:
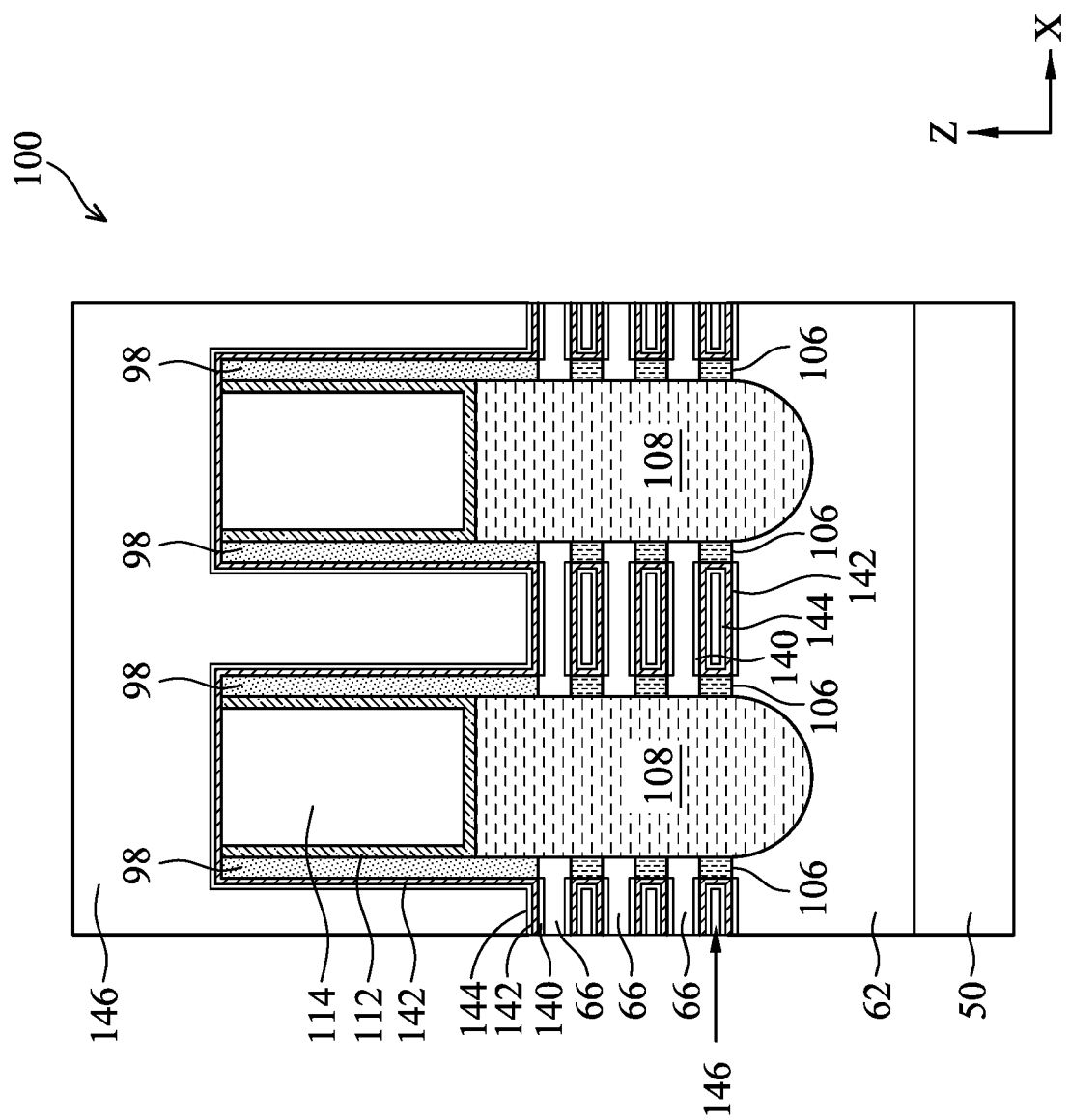
Figure 20B:
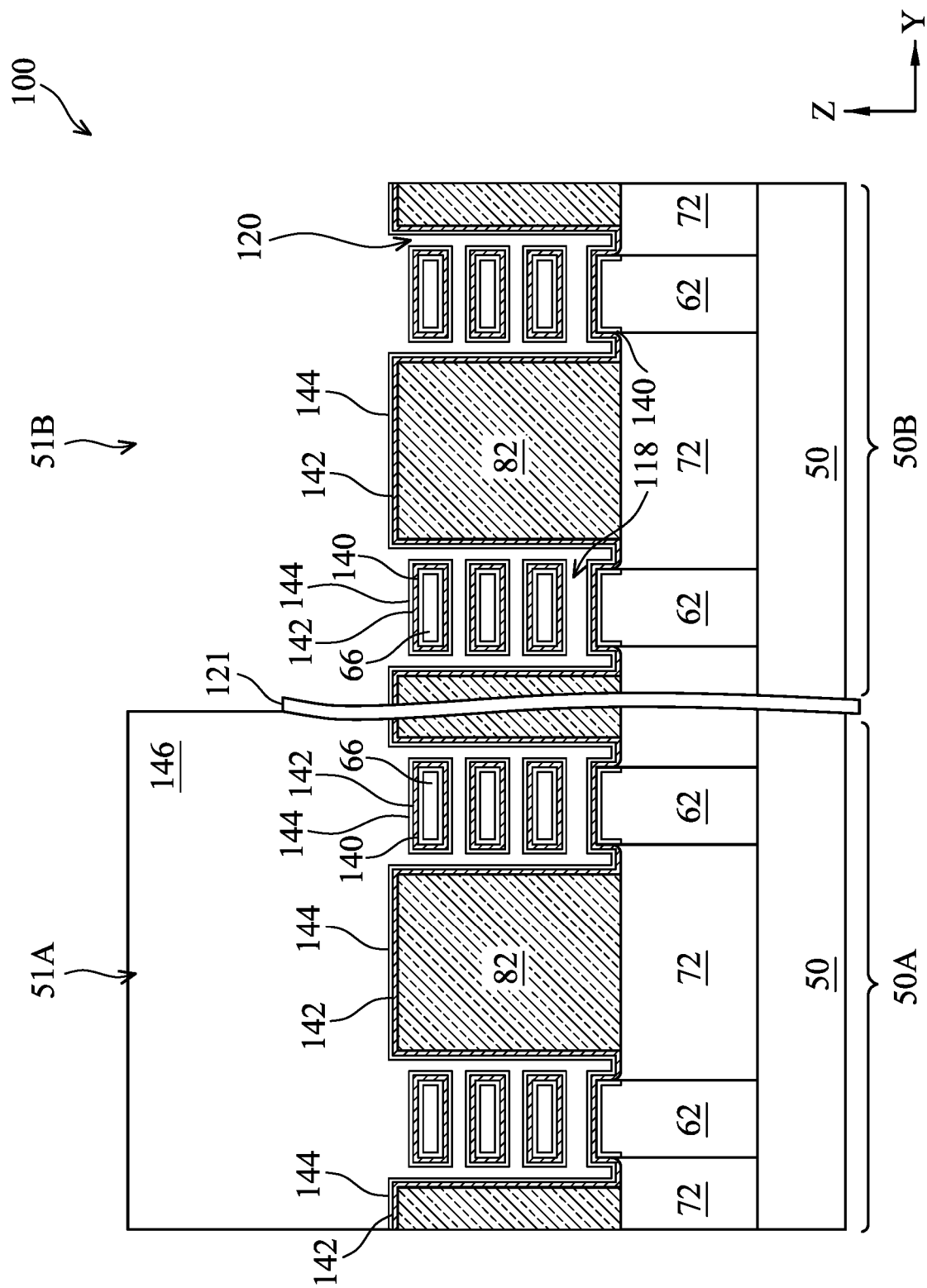

In FIGS. 20A and 20B, a patterned mask layer 146 is formed to cover the first region 50A and to expose the second region 50B. As explained below, the dipole layer 144 will be removed in the second region 50B. Accordingly, the patterned mask layer 146 is formed and patterned to expose the dipole layer 144 in the second region 50B while protecting the dipole layer 144 in the first region 50A from removal. In some embodiments, the patterned mask layer 146 is formed by forming a mask layer covering the nanostructures 66 and the dipole layer 144. A photoresist layer may be formed over the mask layer in the first region 50A and the second region 50B. The photoresist layer is then patterned, such that portions of the photoresist layer disposed in the second region 50B are removed while exposing portions of the mask layer in the second region 50B. Portions of the mask layer in the second region 50B are then etched. The photoresist layer is removed after the mask layer in the second region 50B is removed by an ashing process and/or a wet clean process. As illustrated in FIG. 20B, the dipole layer 144 in the second region 50B is exposed by the patterned mask layer 146, while the dipole layer 144 in the first region 50A is covered by the patterned mask layer 146. Note that FIG. 20A illustrates the cross-section along a longitudinal axis of a semiconductor fin 62 in the first region 50A, and thus the patterned mask layer 146 covers the dipole layer 144. Although not shown, the cross-section along a longitudinal axis of a semiconductor fin 62 in the second region 50B is similar to FIG. 20A, but without the patterned mask layer 146.

Figure 21A:
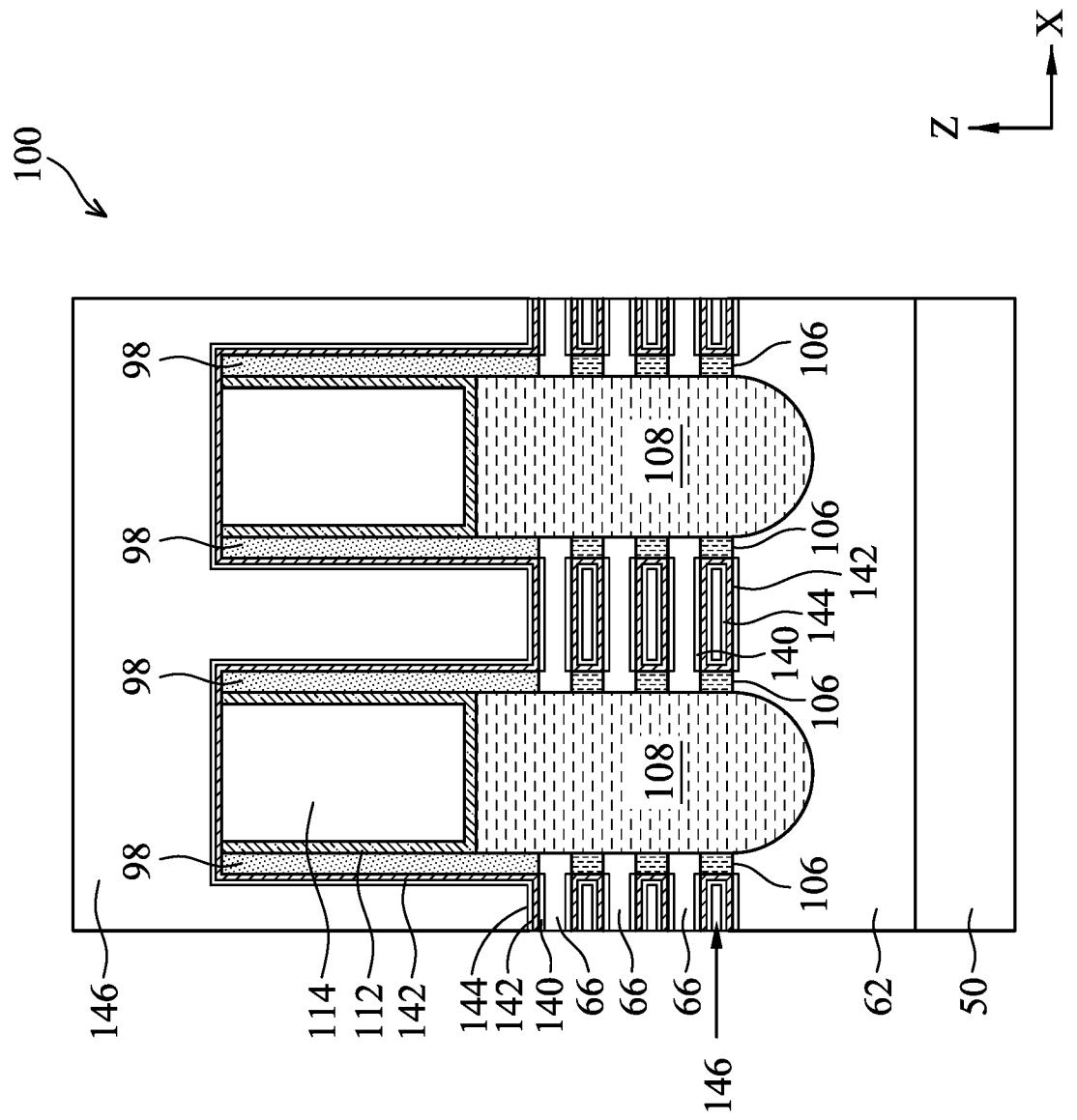
Figure 21B:
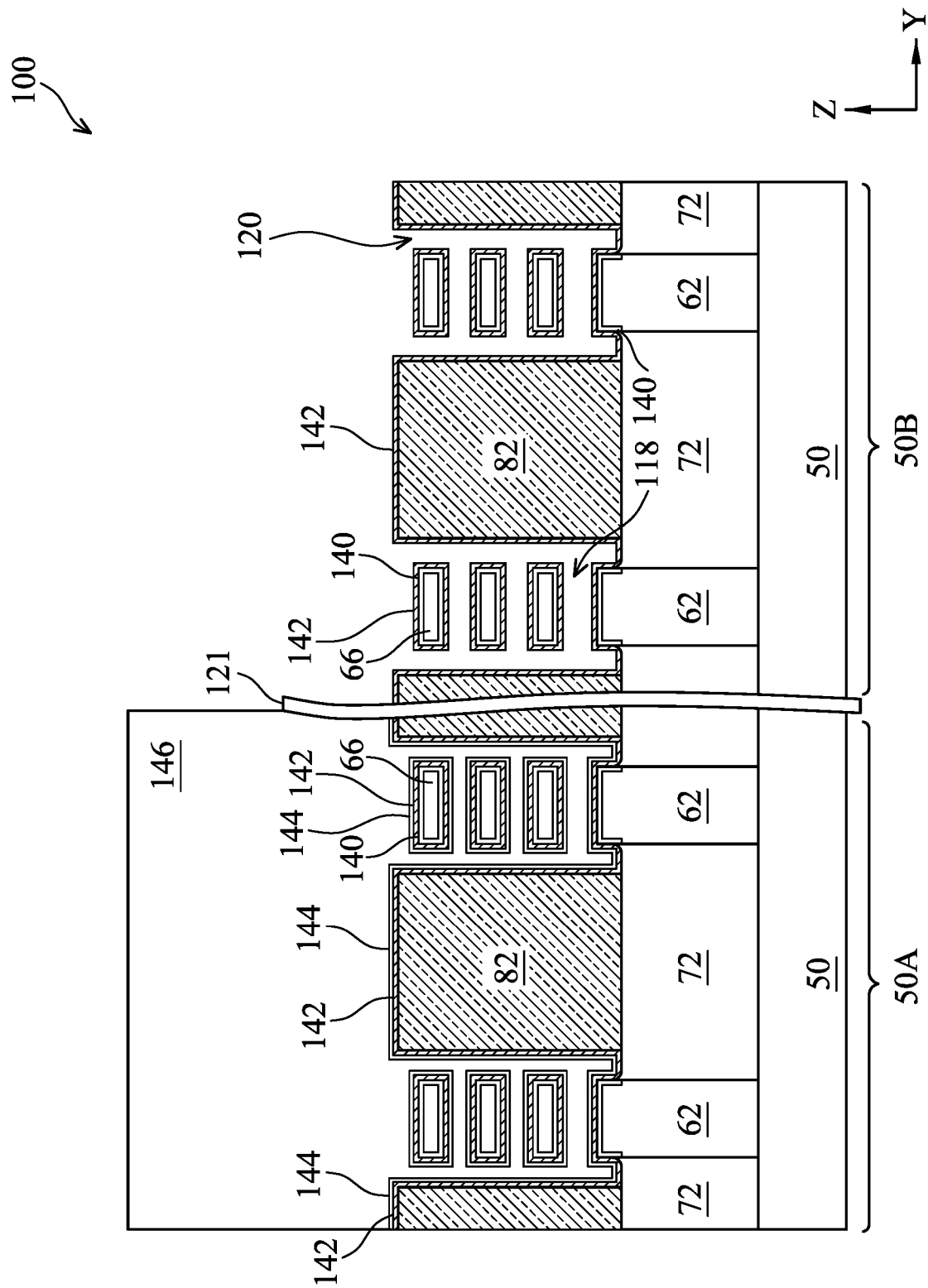

In FIGS. 21A and 21B, the dipole layer 144 in the second region 50B is removed, in accordance with some embodiments. As illustrated in FIG. 21B, a suitable etching process may be performed to remove the exposed dipole layer 144 in the second region 50B, while the patterned mask layer 146 shields (e.g., protects) the first region 50A from the etching process. The dipole layer 144 in the second region 50B may be removed by any suitable etching methods. For example, the dipole layer 144 may be removed by an etching process that uses an etchant having a higher etch rate for the material of the dipole layer 144 than an etch rate of the material of the patterned mask layer 146 and the gate dielectric layer 142. After the dipole layer 144 in the second region 50B is removed, the patterned mask layer 146 may be removed by a suitable process, for example, by a wet etch process.

Figure 22A:
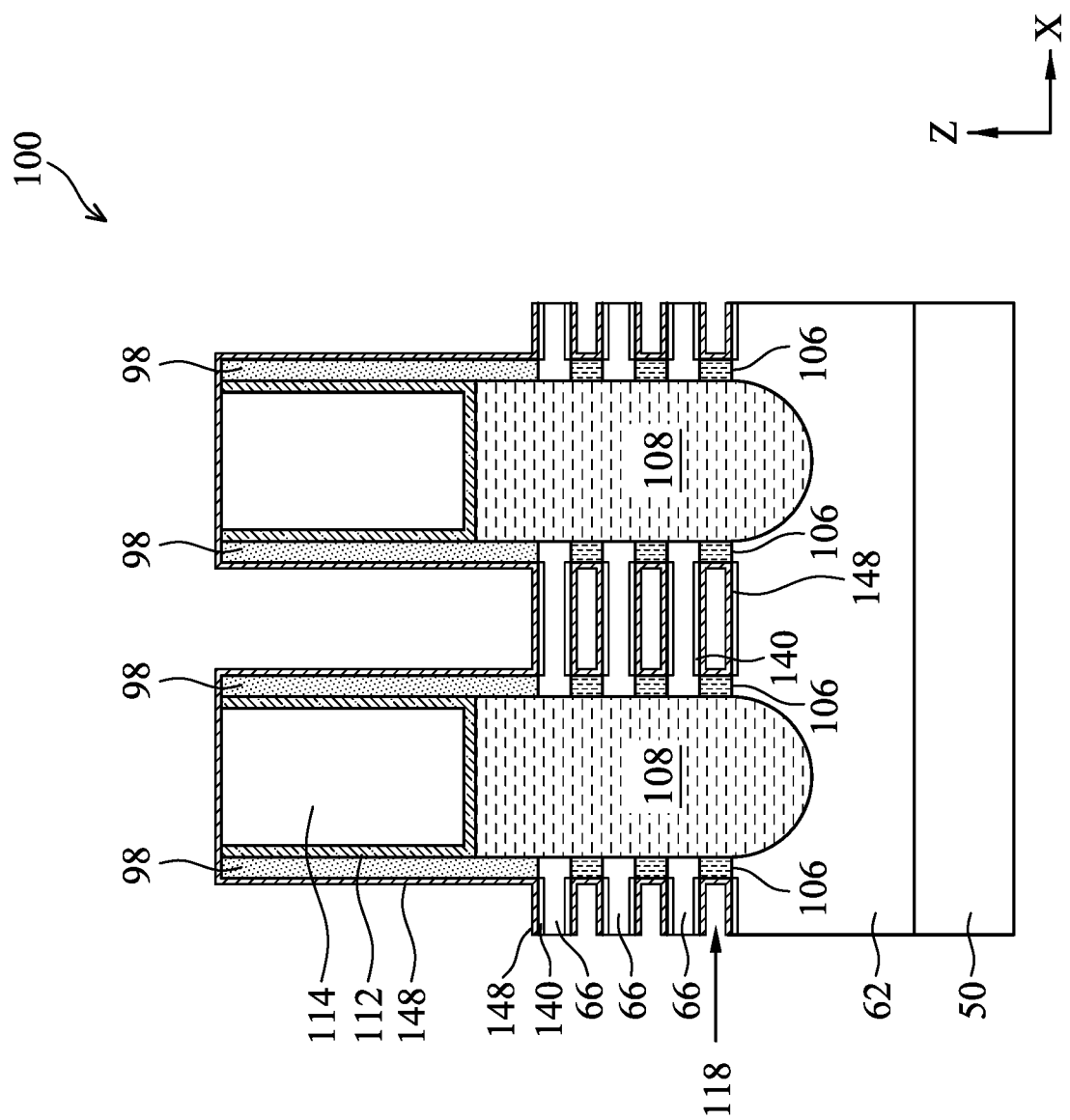
Figure 22B:
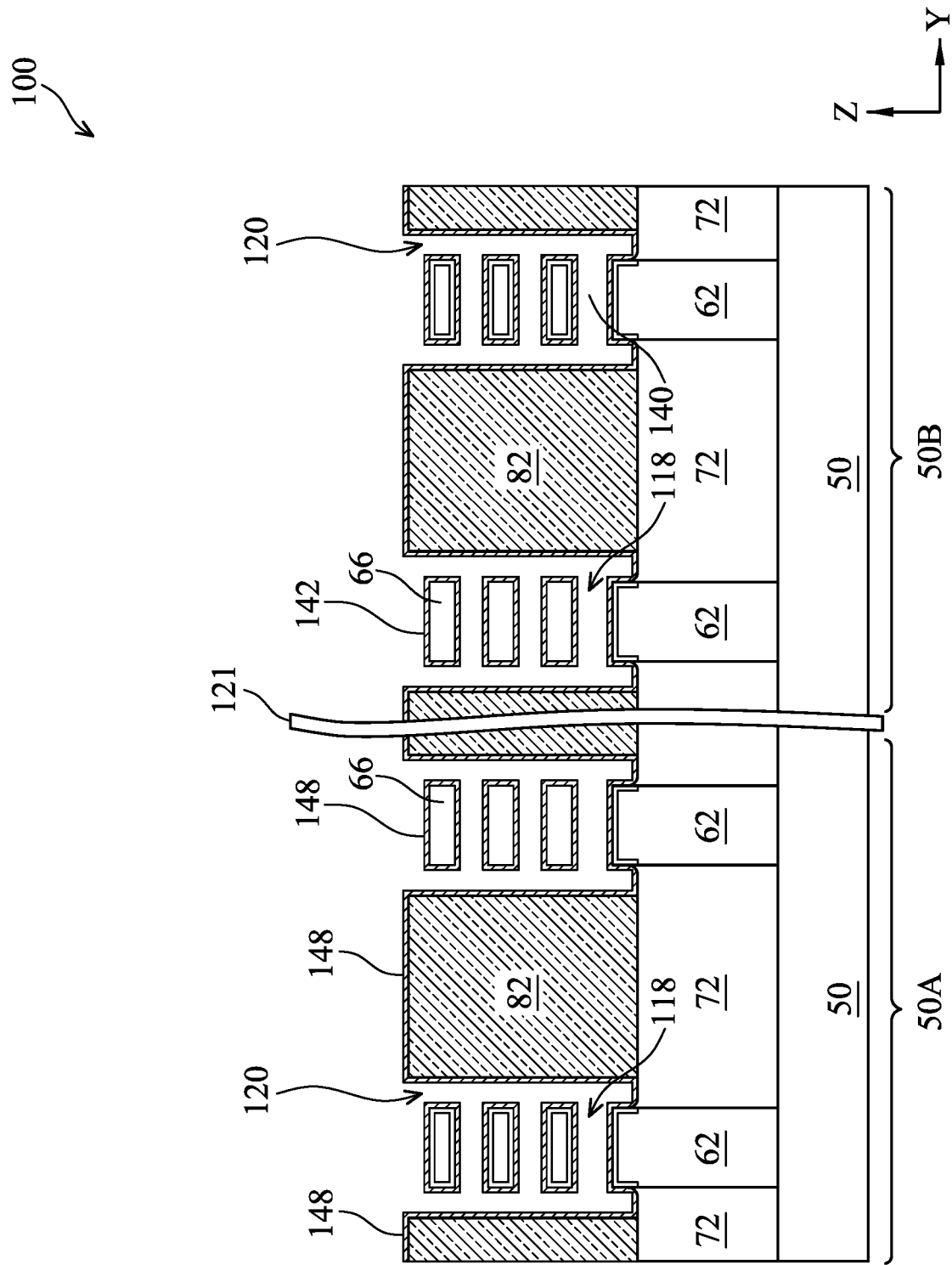

In FIGS. 22A and 22B, a thermal treatment is applied to the nanostructure-FETs 100 (e.g., applies a thermal treatment to the dipole layer 144) to introduce the dipole elements of the dipole layer 144 into the gate dielectric layer 142 in the first region 50A in accordance with some embodiments. As such, a doped gate dielectric layer 148 (e.g., the first-step-formed gate dielectric layer), with the dipole elements of the dipole layer 144 incorporated in it, is formed (e.g., converted) from the gate dielectric layer 142 in the first region 50A. In some embodiments, during the thermal treatment, the dipole elements in the dipole layer 144 diffuse into the gate dielectric layer 142, while the metal elements of the gate dielectric layer 142 may generally stay in the gate dielectric layer 142. Exemplary material of the doped gate dielectric layer 148 may be oxide or the silicate of Hf, Al, or Zr doped with La, Y, Ti, Ge, Al, Ga, Zn, or a combination thereof. In some embodiments, the doped gate dielectric layer 148 is HfLaO, HfLaSiO, HfAlO, HfAlSiO, HfZnO, or HfZnSiO. In the illustrated embodiment, the doped gate dielectric layer 148 may have a substantially same thickness as the gate dielectric layer 142. In some embodiments, the thermal treatment is performed at a temperature of about 500° C. to about 1250° C. or at a temperature of about 900° C. to about 1200° C. for about 0.01 seconds to about 1 second. In some embodiments, the thermal treatment is performed at an ambient containing $NH_3$, $N_2$, or a combination thereof.

In accordance with some embodiments, the dipole elements are dispersed throughout a thickness of the doped gate dielectric layer 148. The doped gate dielectric layer 148 may have a higher dipole element concentration at its center portion than its edge portions (e.g., the top portion or the bottom portion) along its thickness direction. In some embodiments, the atomic ratio between the metal elements of the high-k material and the dipole elements in the doped gate dielectric layer 148 is between about 0.2% to about 20%. After the thermal treatment, remaining portions of the dipole layer 144 over the doped gate dielectric layer 148 may be removed. In accordance with some embodiments, the remaining portions of the dipole layer 144 are removed by a suitable etching method, for example, by a wet etch process. The etching process may use an etchant that etches the dipole layer 144 at a faster rate than the doped gate dielectric layer 148 in the first region 50A and the gate dielectric layer 142 in the second region 50B.

Figure 23A:
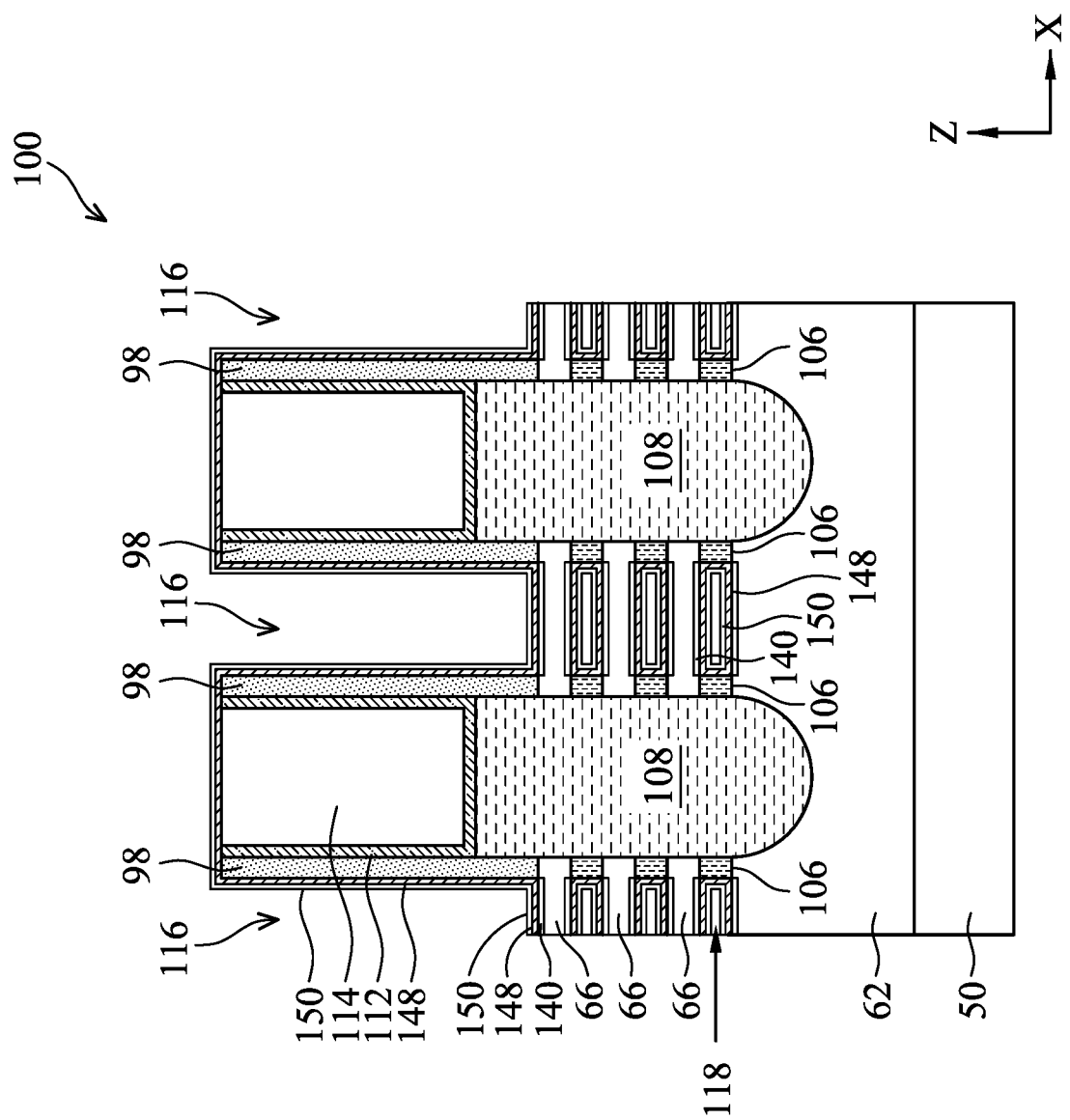
Figure 23B:
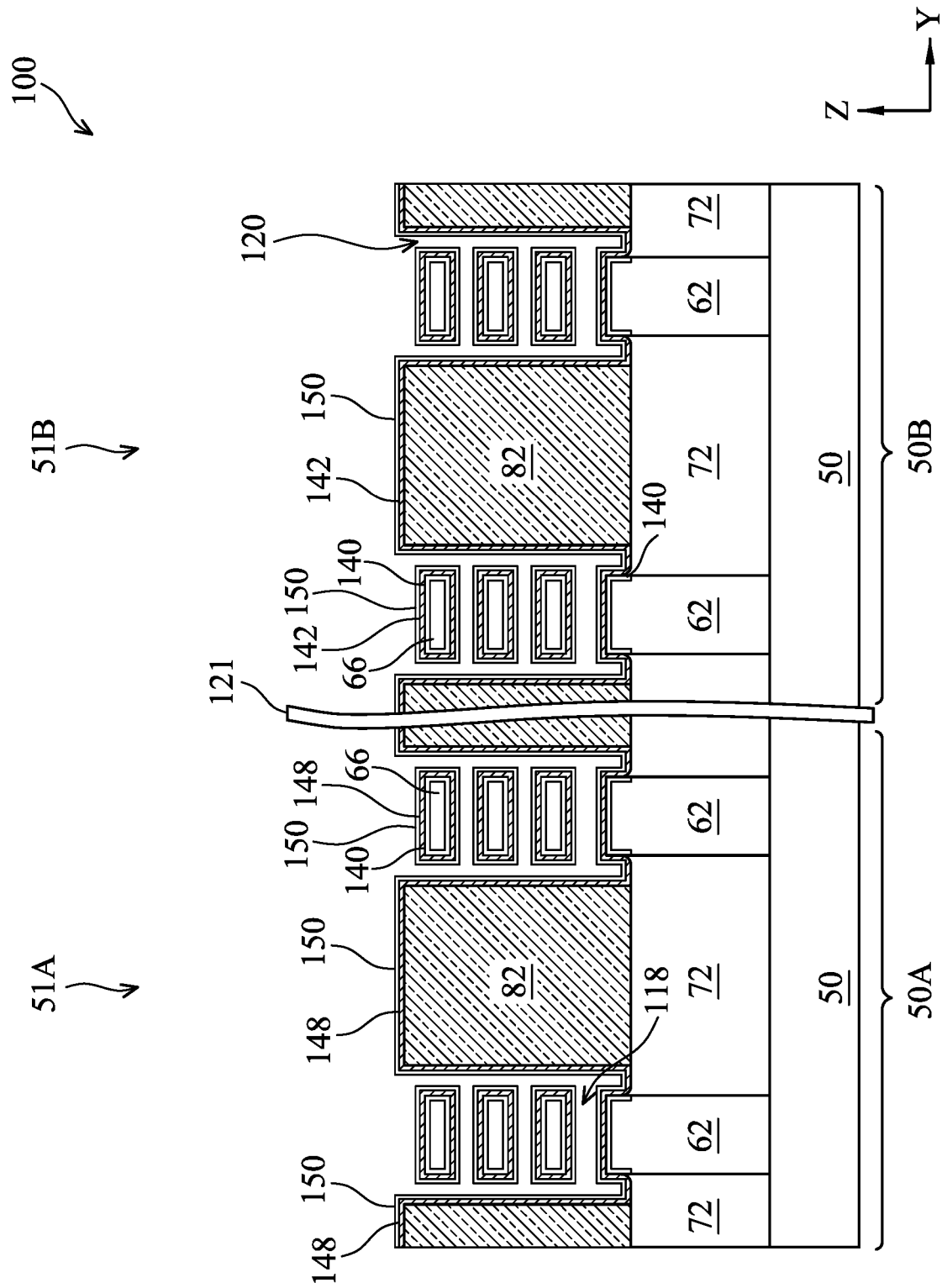

In FIGS. 23A and 23B, a dielectric layer 150 is formed (e.g., conformally) over the doped gate dielectric layer 148 in the first region 50A and over the gate dielectric layer 142 in the second region 50B, in accordance with some embodiments. As discussed in greater detail below, the dielectric layer 150 may be subsequently doped with fluorine and will act as another layer of a gate dielectric layer. In an example embodiment, the dielectric layer 150 includes a high-k dielectric material, and in these embodiments, the high-k dielectric material may have a k value greater than about 7.0 and may include a metal oxide or a metal silicate, such as the oxide or the silicate of Hf, Al, Zr, or combinations thereof. In some embodiments, the dielectric layer 150 and the gate dielectric layer 142 are formed of the same material. In some embodiments, the dielectric layer 150 and the gate dielectric layer 142 are formed of different materials. A thickness of the dielectric layer 150 may be between about 8 angstroms and about 20 angstroms. In some embodiments, the dielectric layer 150 may have a thickness substantially the same as the thickness of the doped gate dielectric layer 148 or the gate dielectric layer 142. In some embodiments, the thickness of the dielectric layer 150 is greater than the thickness of the doped gate dielectric layer 148. The formation methods of the dielectric layer 150 may include MBD, ALD, PECVD, or the like. In an embodiment, the dielectric layer 150 is formed by ALD at a temperature between about 200° C. and about 400° C.

Figure 24A:
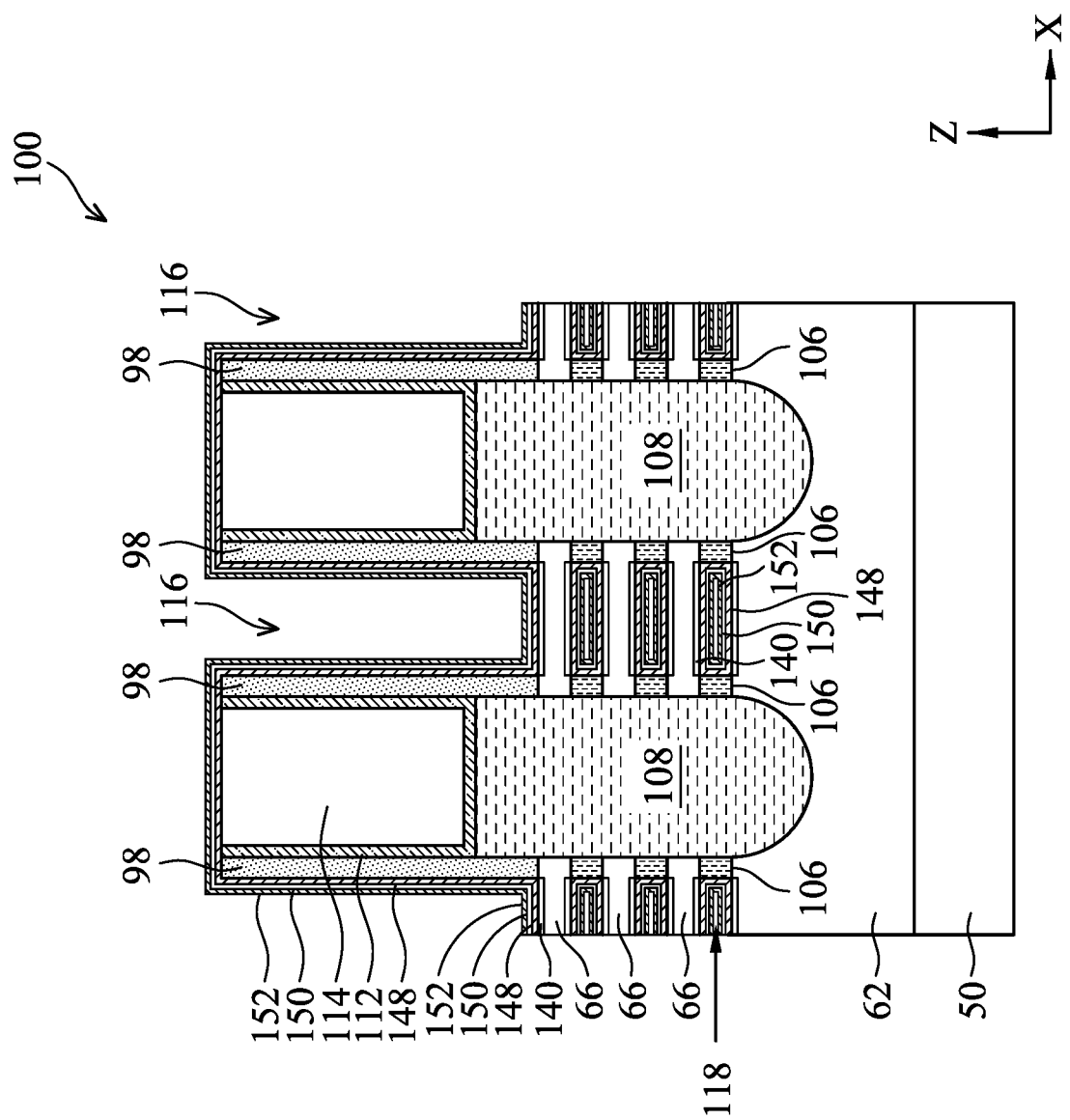
Figure 24B:
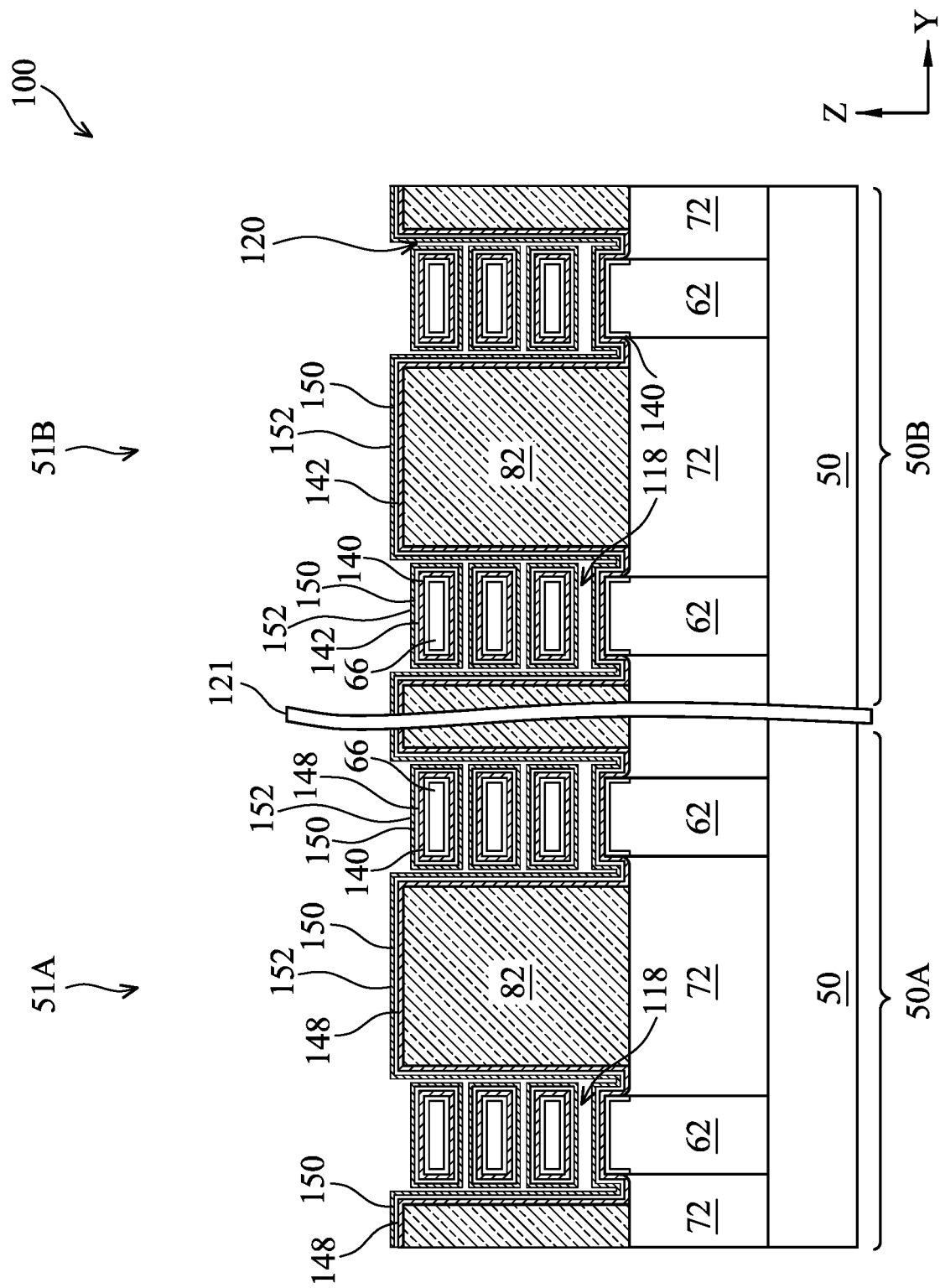
Figures 25A, 25C:
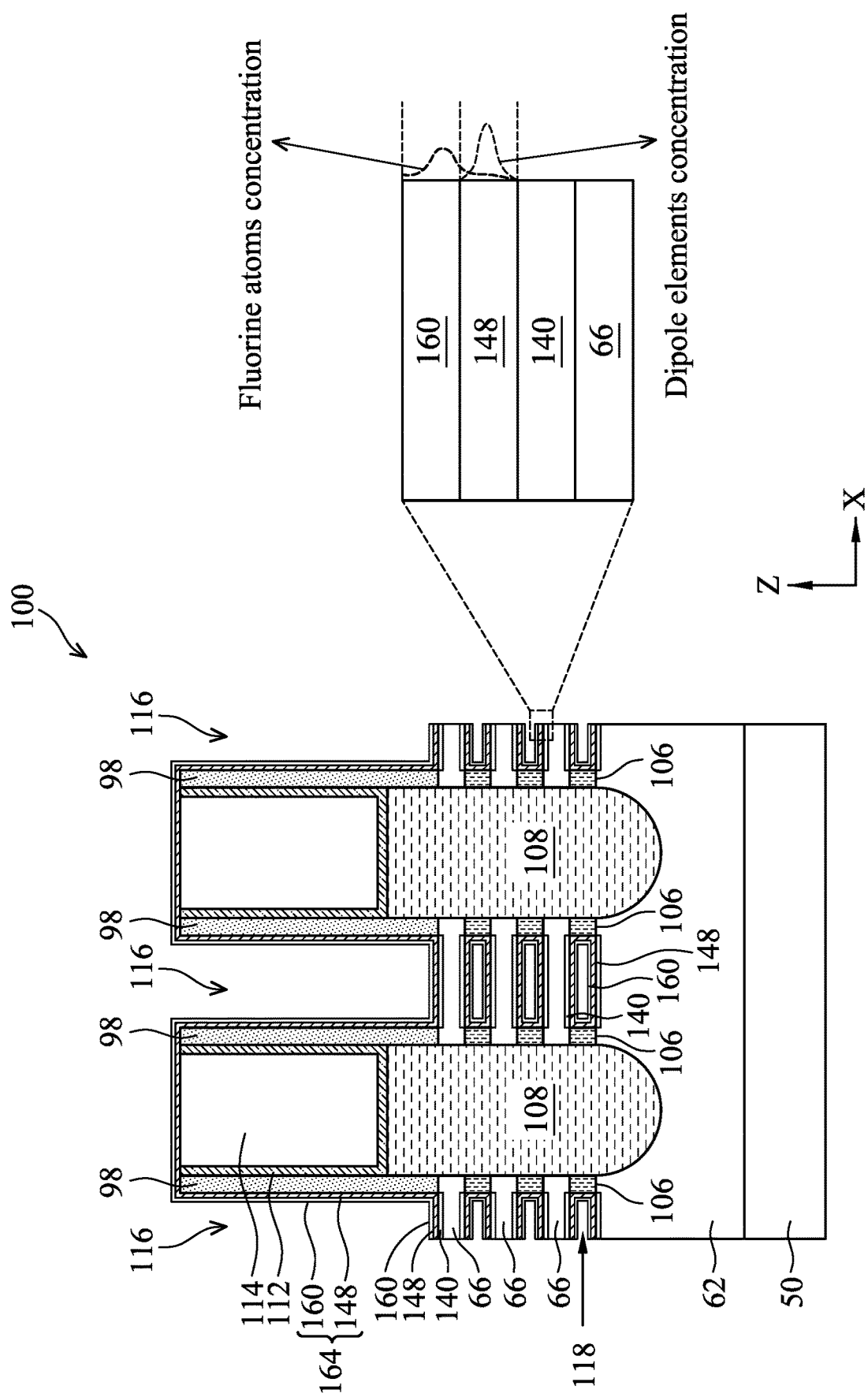

In FIGS. 24A and 24B, a barrier layer 152 is formed over the dielectric layer 150 (e.g., conformally) in the first region 50A and the second region 50B in accordance with some embodiments. The barrier layer 152 may prevent or reduce the dielectric layer 150 from being etched by fluorine in the subsequent fluorine diffusing process. In some embodiments, the barrier layer 152 includes TiN, AlO, TiSN, TaN, or a combination thereof. In some embodiments, the barrier layer 152 has a thickness of about 1 nm to about 3 nm. The formation methods of the barrier layer 152 may include MBD, ALD, PECVD, or the like. In some embodiments, the barrier layer 152 may be omitted.

Figure 25B:
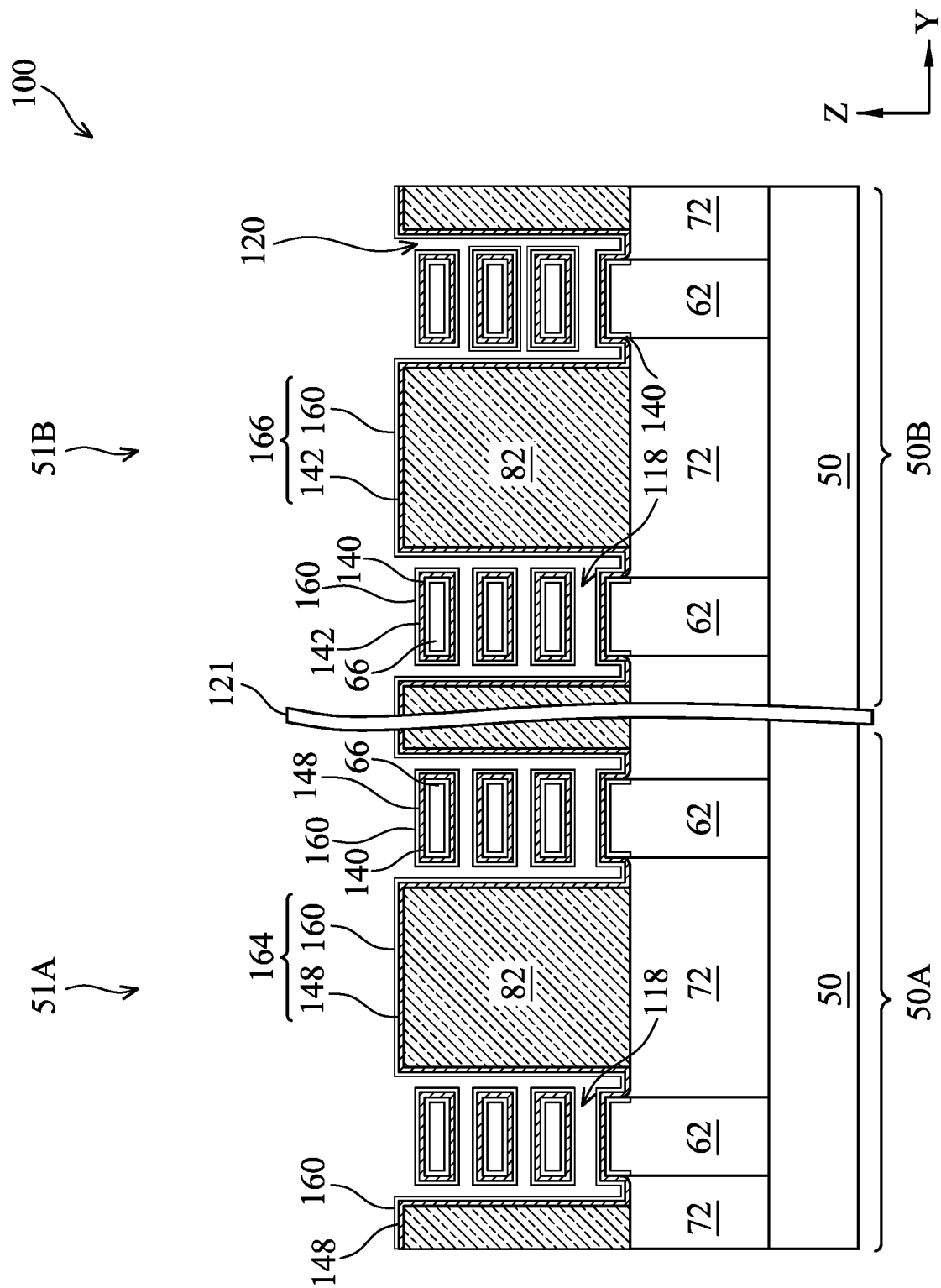

In FIGS. 25A and 25B, fluorine atoms are introduced into the dielectric layer 150, thereby forming a fluorine-containing gate dielectric layer 160 (e.g., the second-step-formed gate dielectric layer) in accordance with some embodiments. The fluorine atoms may passivate oxygen vacancy and/or reduce silicon dangling bonds in the dielectric layers 150, 142, 148, and/or the interfacial layer 140 so as to increase the mobility of the nanostructure-FETs 100. The doped gate dielectric layer 148 and the fluorine-containing gate dielectric layer 160 in the first region 50A may be collectively referred to as gate dielectric layer 164, and the gate dielectric layer 142 and the fluorine-containing gate dielectric layer 160 in the second region 50B may be collectively referred to as gate dielectric layer 166.

In some embodiments, the fluorine atoms are diffused into the dielectric layer 150 by a direct soaking in a gaseous environment or by diffusing fluorine from a fluorine-containing layer formed over the dielectric layer 150 or the barrier layer 152 (if present). In some embodiments, when using the direct soaking method, the dielectric layer 150 (or the barrier layer 152 if present) may be soaked in the fluorine-containing gas at a pressure of about 0.1 torrs to about 500 torrs and at a temperature of about 200° C. to about 500° C., for about 1 min to about 2 hours. In some embodiments, the fluorine-containing gas includes $NF_3$, $WF_6$, $CF_4$, or other similar materials.

In some embodiments, the fluorine atoms are introduced into the dielectric layer 150 by forming a fluorine-containing layer (not shown) over the dielectric layer 150 (or the barrier layer 152 if present), followed by a thermal treatment. The fluorine-containing layer may be a metal layer with non-bonded fluorine atoms dispersed therein. The deposition of the fluorine-containing layer may include introducing a metal precursor and a reacting gas to occur a reaction. In some embodiments, the metal precursor includes a metal fluoride, such as $WF_6$, and the reacting gas may include $SiH_4$, $B_2H_6$, $H_2$, or other similar materials. The reaction may include breaking the bonds within the metal fluoride to release non-bonded metal atoms and non-bonded fluorine atoms and depositing the non-bonded metal atoms to form a metal layer with non-bonded fluorine atoms dispersed therein. In some embodiments, the reaction occurs at a temperature of about 200° C. to about 500° C. After the fluorine-containing layer (e.g., a fluorine-containing tungsten layer) is formed, a thermal treatment is applied, and the fluorine atoms are diffused from the fluorine-containing layer into the dielectric layer 150, thereby forming a fluorine-containing gate dielectric layer 160. In some embodiments, the thermal treatment may be performed at a temperature of about 200° C. to about 800° C. in $N_2$ or $H_2$ ambient for about 0.5 seconds to about 30 seconds.

In some embodiments, the fluorine atoms may further diffuse into the doped gate dielectric layer 148 in the first region 50A and the gate dielectric layer 142 in the second region 50B. Because the fluorine atoms are diffused from a side of the dielectric layer 150 away from gate dielectric layer 142 and the doped gate dielectric layer 148, the fluorine atoms diffuse through the barrier layer 152 (if present) and/or the dielectric layer 150 before reaching the gate dielectric layer 142 or the doped gate dielectric layer 148. The amount of the fluorine atoms that are diffused into the gate dielectric layer 142 or the doped gate dielectric layer 148 may thus be adjusted by controlling the diffusing distance of the fluorine atoms. In some embodiments, the diffusing distance of the fluorine atoms may be controlled by increasing or decreasing the thermal treatment time period.

FIG. 25C shows an enlarged view of the gate dielectric layers 148 and 160, interfacial layer 140, and the nanostructures 66, as well as distribution profiles of the fluorine atoms and the dipole elements along a thickness direction of the gate dielectric layers 148 and 160, in accordance with some embodiments. In some embodiments, the manufacturing processes are controlled to distribute the fluorine atoms primarily within the fluorine-containing gate dielectric layer 160. As a result, in the gate dielectric layer 164, the peak concentration of fluorine atoms is located within the fluorine-containing gate dielectric layer 160, and the peak concentration of dipole elements is located within the doped gate dielectric layer 148. A majority of dipole elements may be located within the doped gate dielectric layer 148, and a majority of the fluorine atoms may be located within the fluorine-containing gate dielectric layer 160. In some embodiments, in the gate dielectric layer 164 or the gate dielectric layer 166, over 60% of the fluorine atoms are distributed in the fluorine-containing gate dielectric layer 160. In some embodiments, the fluorine-containing gate dielectric layer 160 has a fluorine atomic concentration of between about 0.01% and about 10%. In an example embodiment, the amount of fluorine atoms at the top portions of the doped gate dielectric layer 148 or the gate dielectric layer 142 are greater than the amount of fluorine atoms at the center portions of the doped gate dielectric layer 148 or the gate dielectric layer 142 along the thickness direction, respectively.

Because the amount of fluorine atoms diffusing into the gate dielectric layer 142 or the doped gate dielectric layer 148 can be well controlled, the intermix (or the overlapping region) of the fluorine atoms and the dipole elements can be reduced. While the intermix (e.g., overlapping regions) of the fluorine atoms and the dipole elements may interfere the threshold voltage tuning performance of the dipole elements in the semiconductor device 51A, the gate dielectric layer 164 that comprises separated peak concentrations of fluorine atoms and dipole elements may provide both of greater control of the threshold voltage and improved device mobility for the nanostructure-FETs 100.

The barrier layer 152, if present, may be removed after the fluorine-containing gate dielectric layer 160 is formed, in accordance with some embodiments. The barrier layer 152 may be removed by any suitable etching process, such as being etched by a mixture of $NH_4OH$, $H_2O_2$, and $H_2O$, a mixture of HCl, $H_2O_2$, and $H_2O$, a mixture of $H_2SO_4$, $H_2O_2$, and $H_2O$, or combinations thereof. In embodiments that the fluorine-containing layer is formed, the remaining fluorine-containing layer is removed after the fluorine diffusion. For example, the fluorine-containing layer may be removed by an etchant containing phosphoric acid.

In FIGS. 26A and 26B, a gate electrode layer 170 is deposited over and around the gate dielectric layer 164 in the first region 50A and the gate dielectric layer 166 in the second region 50B, and fills the openings 118 and 120 and the remaining portions of the recesses 116. The gate electrode layer 170 may include a metal-containing material such as TiN, TiO, TaN, TaC, Co, Ru, Al, W, combinations thereof, or multi-layers thereof. For example, although a single layer gate electrode layer 170 is illustrated, the gate electrode layer 170 may comprise any number of liner layers (e.g., barrier layers), any number of work function tuning layers, and a fill material. After the gate electrode layer 170 is formed, a planarization process, such as a CMP, may be performed to remove excess portions of the gate dielectric layers 164 and 166 and the gate electrode layer 170, which excess portions are over the top surface of the first ILD 114.

Figure 27A:
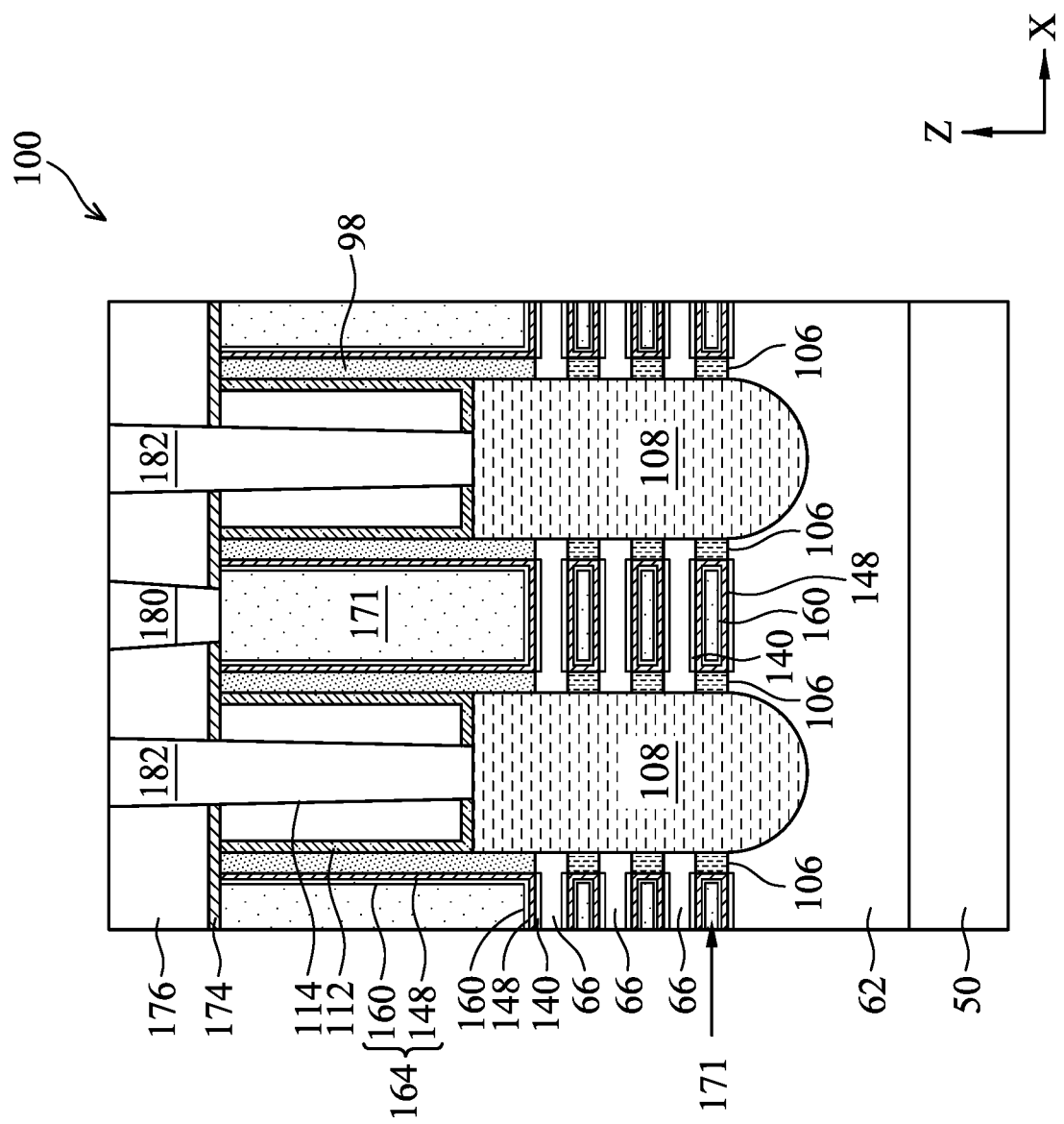
Figure 27B:
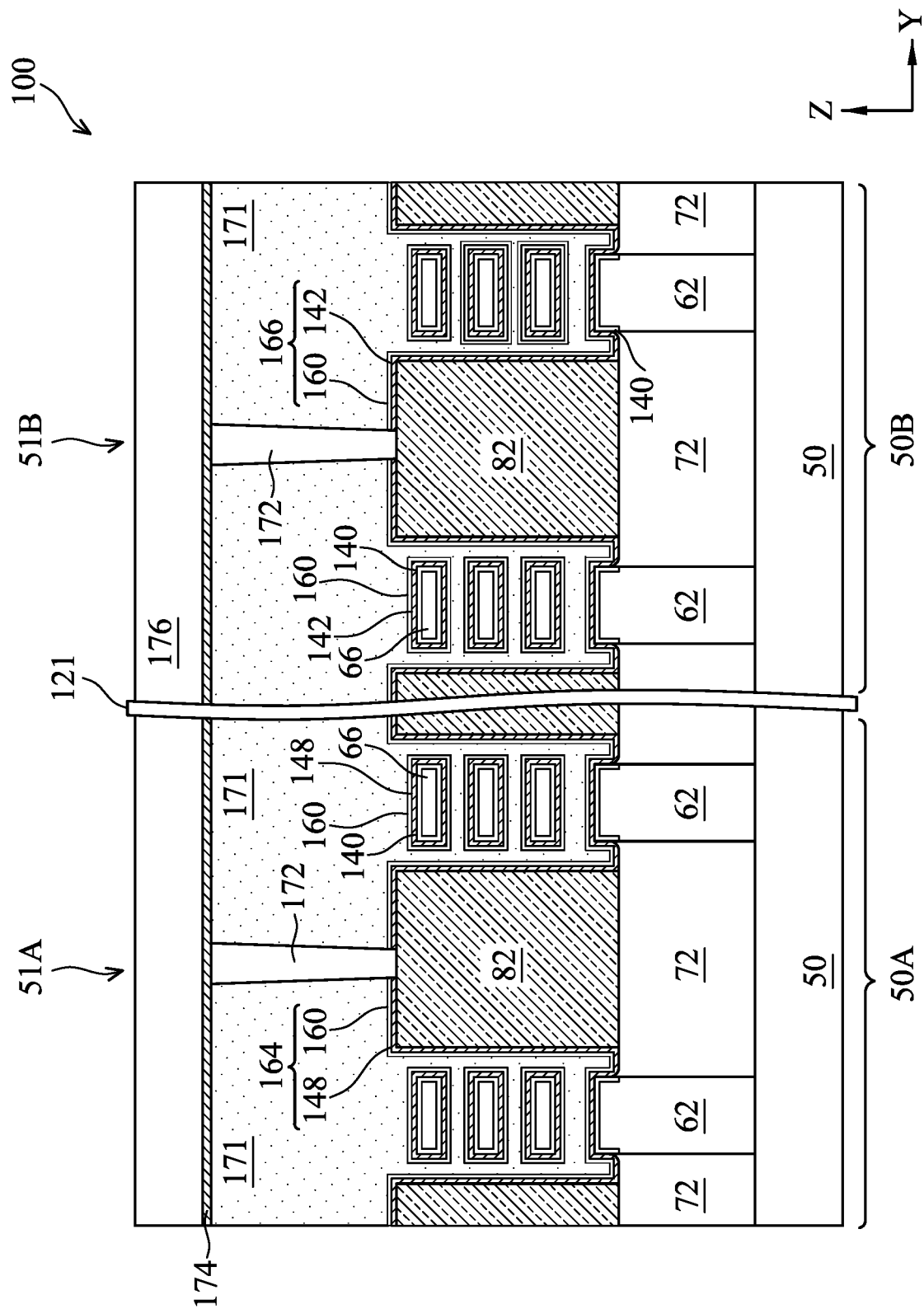

Additional processing may be performed to finish the fabrication of the nanostructure-FETs 100, as one of ordinary skill readily appreciates, and thus details may not be repeated here. For example, in FIGS. 27A and 27B, isolation regions 172 are formed extending through gate electrode layer 170. An isolation region 172 is formed to divide (e.g., cut) the gate electrode layer 170 into multiple gate electrodes 171. Each gate electrode 171 and the corresponding interfacial layer 140, with the corresponding gate dielectric layer 164 or the corresponding gate dielectric layer 166, may be collectively referred to as a gate stack, a replacement gate structure, or a metal gate structure. Each gate stack extends over and around the respective nano structures 66.

The isolation region 172 may be formed of a dielectric material, such as silicon nitride, silicon oxide, silicon oxynitride, or the like, which may be formed by a deposition process such as CVD, ALD, or the like. In some embodiments, one or more layers of dielectric material may be deposited over the gate electrodes 171 and the isolation regions 172. For example, an optional etch stop layer (ESL) 174 is formed over the gate spacers 98, the CESL 112, the first ILD 114, and the gate electrodes 171, and a second ILD 176 is deposited over the ESL 174. Gate contacts 180 and source/drain contacts 182 are formed through the second ILD 176, the ESL 174, the first ILD 114, and the CESL 112 to electrically connect to the gate electrodes 171 and the epitaxial source/drain regions 108, respectively.

In the illustrated embodiments, the semiconductor device 51A in the first region 50A has a threshold voltage that may be reduced (by using n-type dipole elements) or increased (by using p-type dipole elements), while the semiconductor device 51B has a threshold voltage is not affected by the dipole element. In some embodiments, the semiconductor device 51A in the first region 50A has a threshold voltage that is about 20 mV to about 450 mV lower than the threshold voltage of the semiconductor device 51B in the second region 50B. In other embodiments, the semiconductor device 51A in the first region 50A has a threshold voltage that is about 20 mV to about 450 mV higher than the threshold voltage of the semiconductor device 51B in the second region 50B.

FIGS. 28A, 28B, 29A, 29B, 30A, 30B, 31A, 31B, 32A, 32B, 33A, 33B, 34A, 34B, 35A, 35B, 36A, and 36B are cross-sectional views of a nanostructure-FETs 200 at certain stages of manufacturing in accordance with some embodiments. The nanostructure-FETs 200 formed in a first region 50C and a second region 50D may include similar processing steps for the nanostructure-FETs 100 in the first region 50A and the second region 50B, respectively, but with incorporating another dipole element into the device in the second region 50D. In this embodiment, the same features are designated the same numeral references as in the previous embodiments. FIGS. 28A, 29A, 30A, 31A, 32A, 33A, 34A, 35A, and 36A are cross-sectional views along cross-section A-A' in FIG. 1. FIGS. 28B, 29B, 30B, 31B, 32B, 33B, 34B, 35B, and 36B are cross-sectional views along cross-section B-B' in FIG. 1.

The nanostructure-FETs 200 may be formed using similar processing steps for the nanostructure-FETs 100, but with incorporating another dipole element into the semiconductor device 51D (see FIG. 35B) in the second region 50D. In particular, the processing illustrated in FIGS. 28A-36B to form the nanostructure-FETs 200 assume the processing illustrated in FIGS. 2 through 23B performed prior. In these embodiments, the semiconductor device 51C and the first region 50C are similar to the semiconductor device 51A and the first region 50A, respectively. The semiconductor device 51D and the second region 50D are similar to the semiconductor device 51D and the second region 50D, respectively, except that another dipole element is introduced into the semiconductor device 51D in the second region 50D.

Figure 28A:
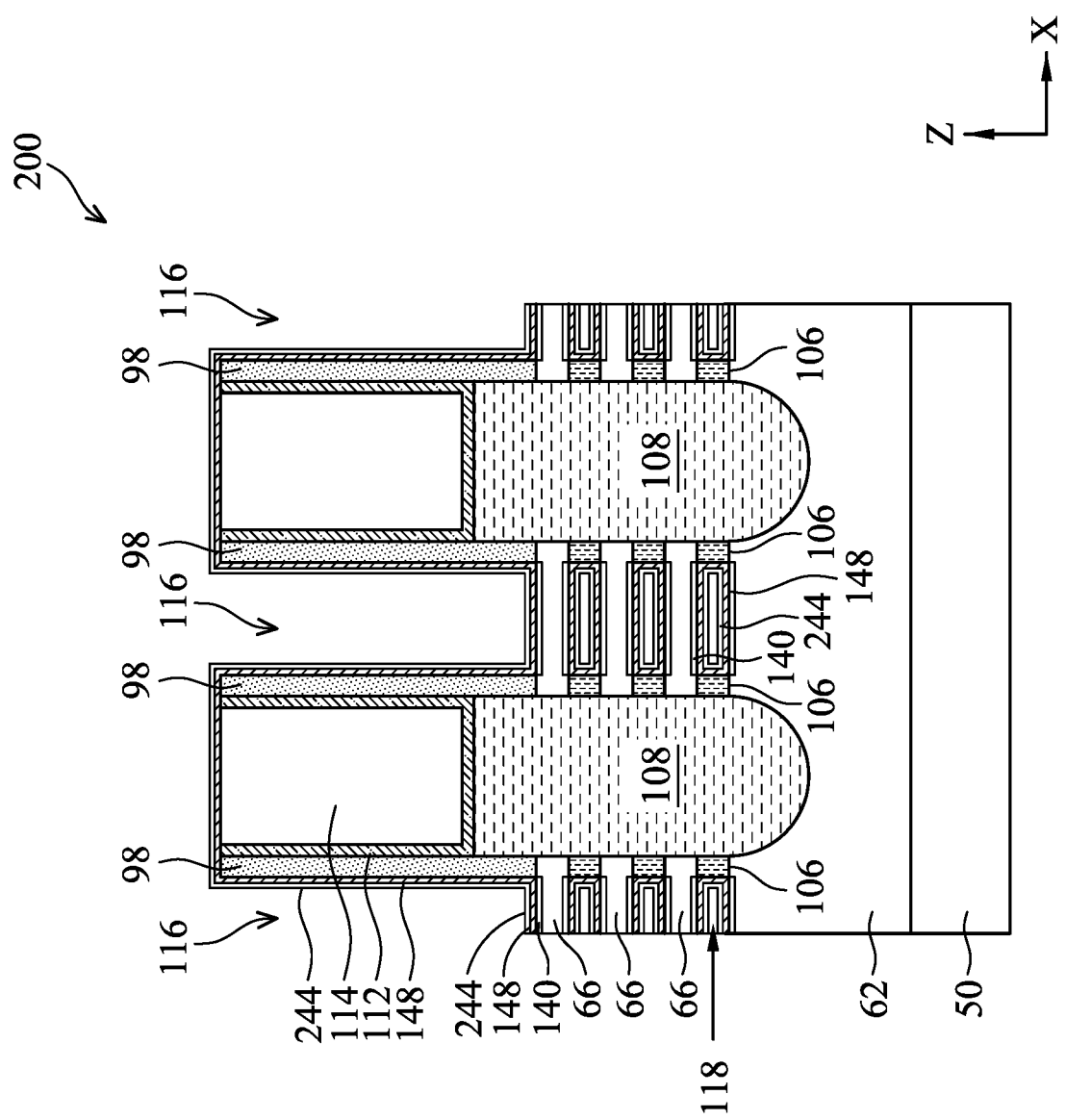
FIGS. 28A, 28B, 29A, 29B, 30A, 30B, 31A, 31B, 32A, 32B, 33A, 33B, 34A, 34B, 35A, 35B, 36A, and 36B are cross-sectional views of a nanostructure field-effect transistor device at various stages of manufacturing, in accordance with some embodiments.
Figure 28B:
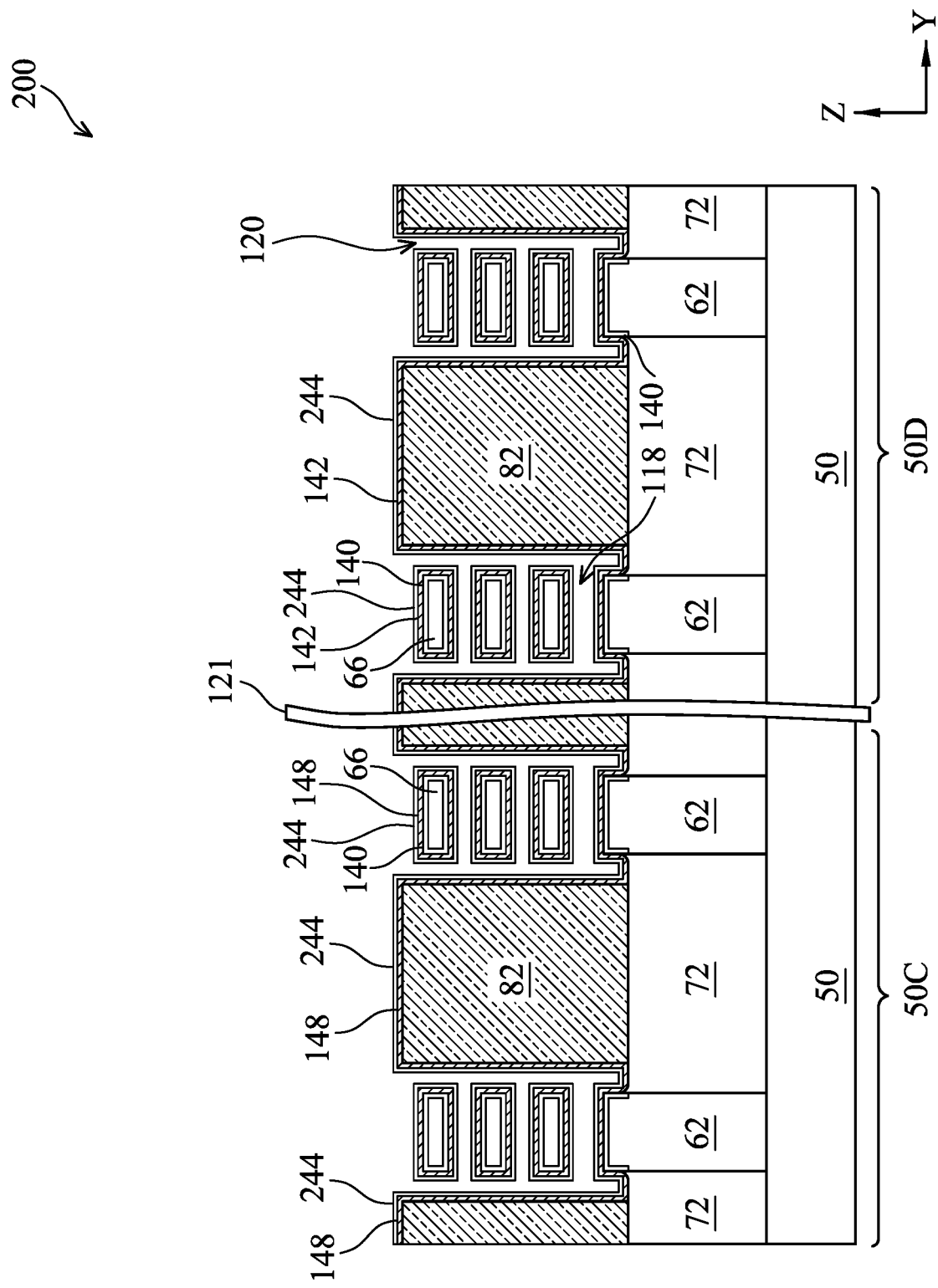

Accordingly, after the processing discussed above with reference to FIGS. 1-23B, processing may proceed to FIG. 28A, wherein a dipole layer 244 is formed over the doped gate dielectric layer 148 in the first region 50C and the gate dielectric layer 142 in the second region 50D. As discussed in greater detail below, the dipole layer 244 will be removed from the first region 50C (which was previously doped as discussed above with reference to FIGS. 2-23B) and used to dope the gate dielectric layer 142 in the second region 50D, thereby individually adjusting the threshold voltage of the devices in the first region 50C and the second region 50D.

The dipole layer 244 may be formed using similar materials and processes as the dipole layer 144. In some embodiments, the dipole element of the dipole layer 244 and the dipole element of the doped gate dielectric layer 148 are the same type (e.g., the n-type or the p-type) but different materials. In some embodiments, the dipole element of the dipole layer 244 and the dipole element of the doped gate dielectric layer 148 are materials of different types.

Figure 29A:
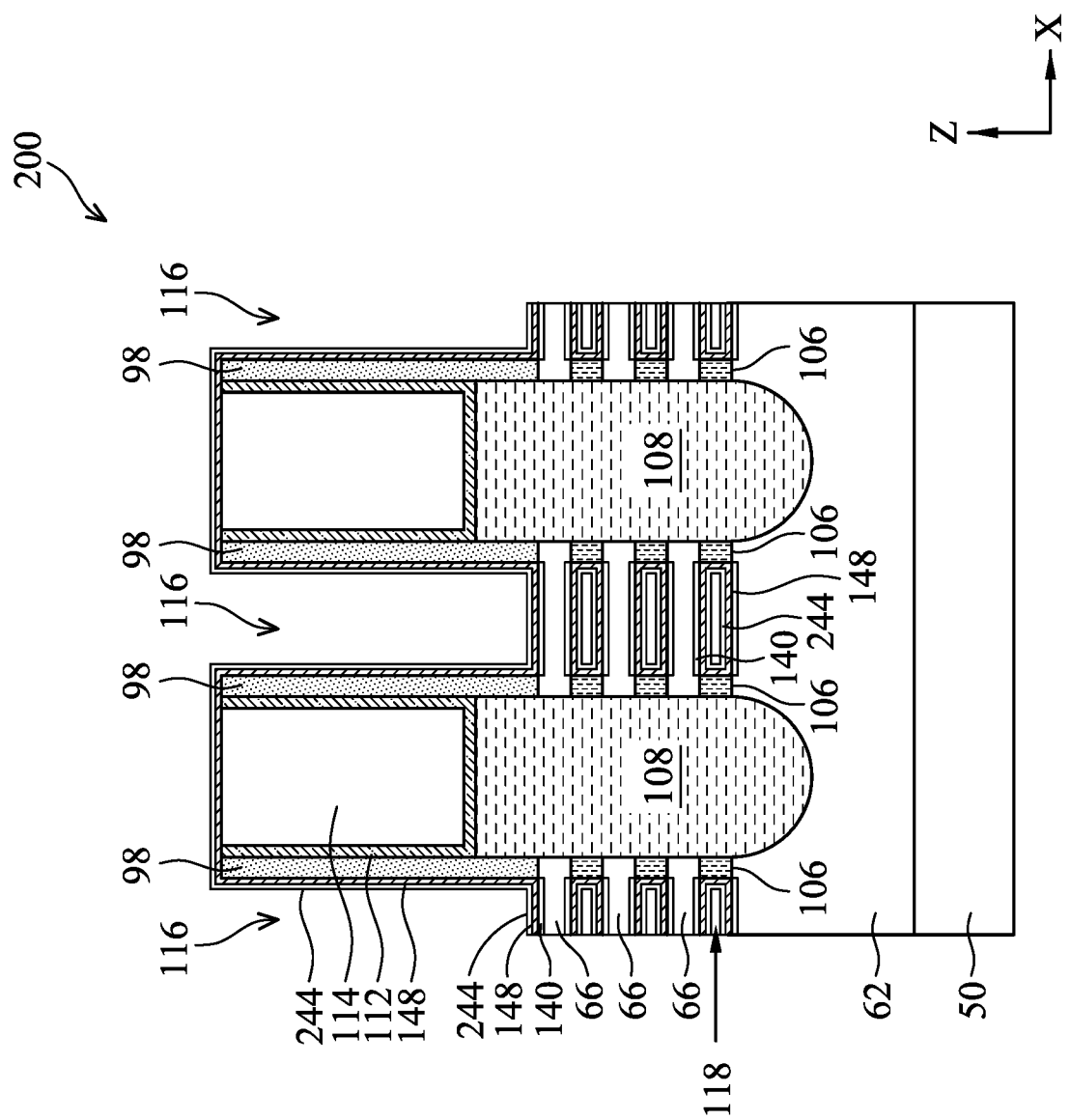
Figure 29B:
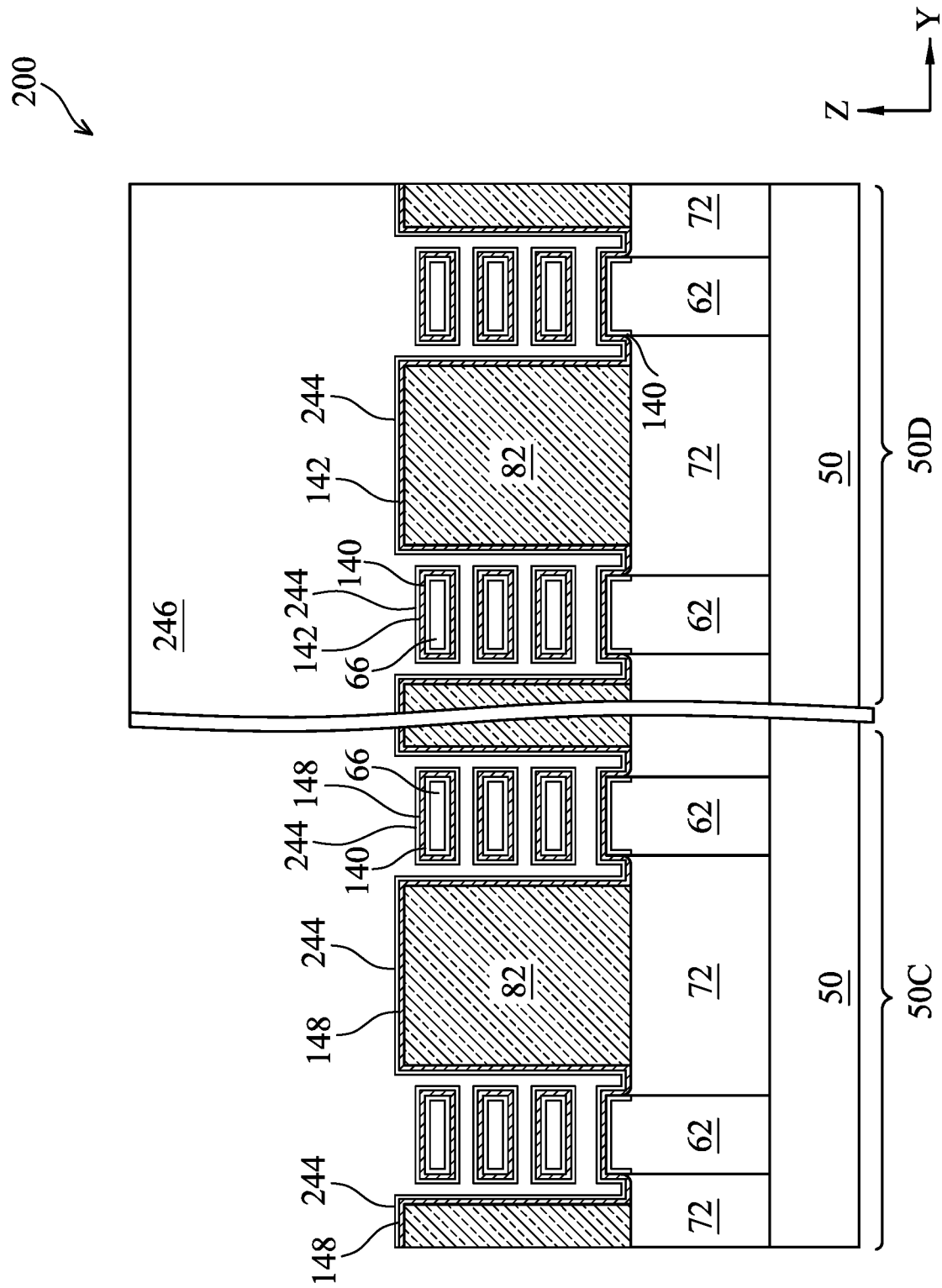

In FIGS. 29A and 29B, a patterned mask layer 246 is formed to cover the second region 50D and to expose the first region 50C. In some embodiments, the patterned mask layer 246 is formed by forming a mask layer covering the dipole layer 244 in the first region 50C and the second region 50D. A photoresist layer (not shown) may be formed over the mask layer in the first region 50C and the second region 50D. The photoresist layer is then patterned, such that portions of the photoresist layer disposed over the first region 50C are removed while exposing portions of the mask layer over the second region 50D. Portions of the mask layer over the first region 50C are then etched. The photoresist layer may be removed after the mask layer over the second region 50D is removed by an ashing process and/or a wet clean process. As illustrated in FIG. 29B, the dipole layer 244 in the first region 50C is exposed by the patterned mask layer 246, while the dipole layer 244 in the second region 50D is covered by the patterned mask layer 246. Note that FIG. 29A illustrates the cross-section along a longitudinal axis of a semiconductor fin 62 in the first region 50C, and thus the patterned mask layer 246 is not shown. Although not shown, the cross-section along a longitudinal axis of a semiconductor fin 62 in the second region 50D is similar to FIG. 29A, but with the patterned mask layer 246 and the gate dielectric layer 142 that replaces with the doped gate dielectric layer 148.

Figure 30A:
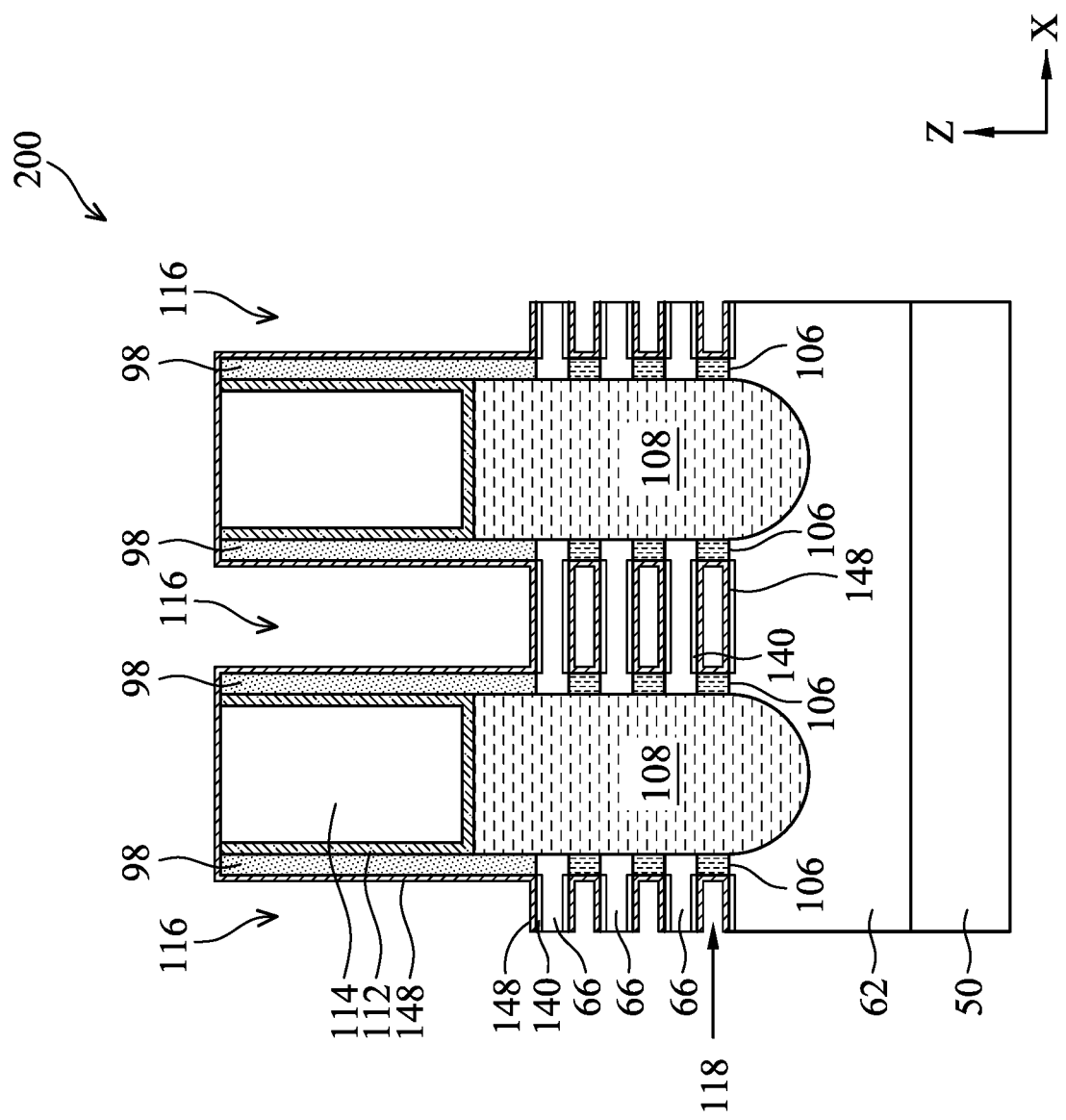
Figure 30B:
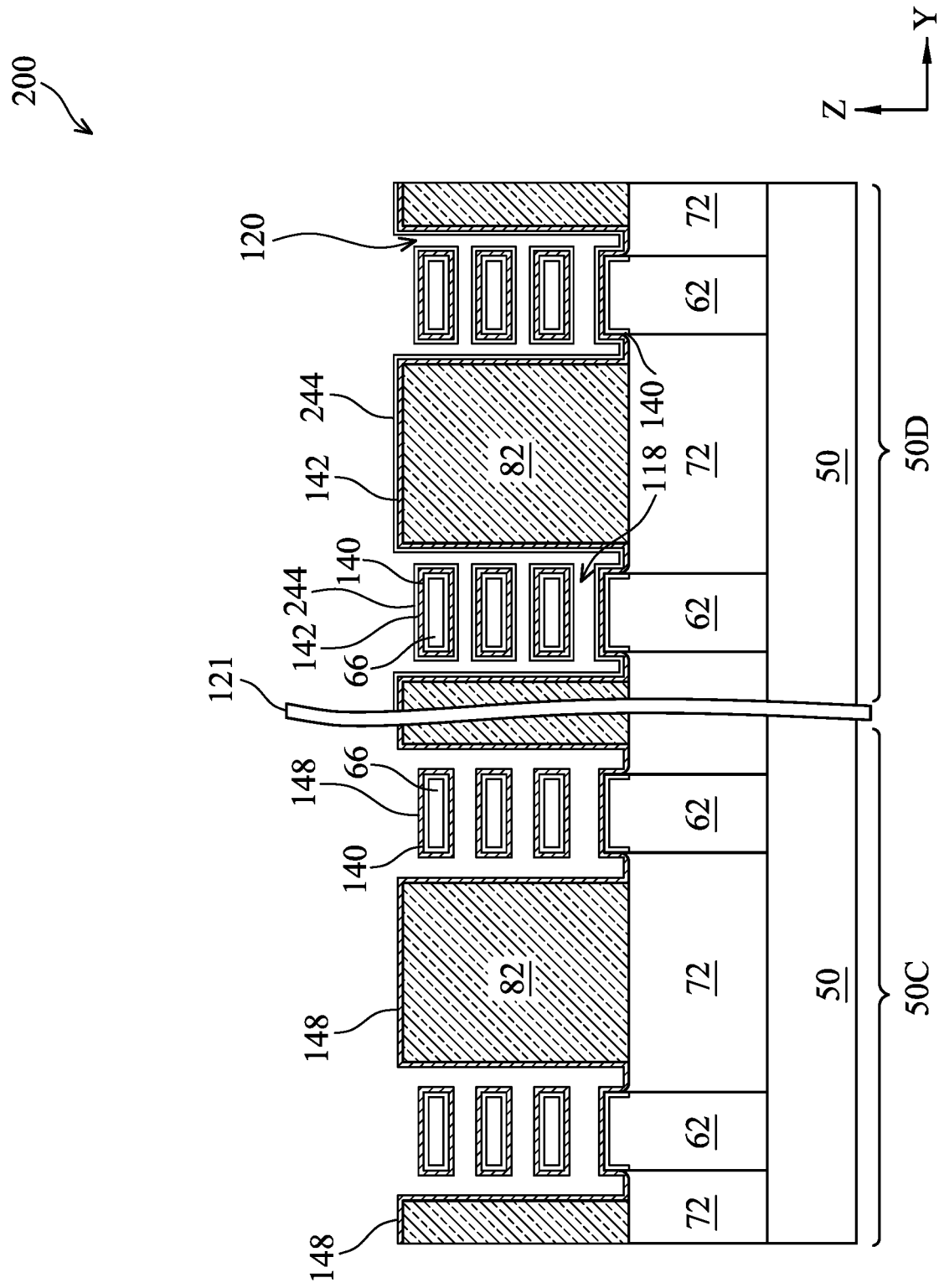

In FIGS. 30A and 30B, the dipole layer 244 in the first region 50C is removed in accordance with some embodiments. As illustrated in FIG. 30B, a suitable etching process may be performed to remove the exposed dipole layer 244 in the first region 50C, while the patterned mask layer 246 shields (e.g., protects) the dipole layer 244 in the second region 50D from the etching process. The dipole layer 244 may be removed by any suitable etching methods. For example, the dipole layer 244 may be removed by a wet etch process. The etch process may use an etchant that etches the dipole layer 244 at a faster rate than the patterned mask layer 246 and the doped gate dielectric layers 148. After the dipole layer 244 in the first region 50C is removed, the patterned mask layer 246 may be removed by a suitable process, for example, by a wet etch process.

Figure 31A:
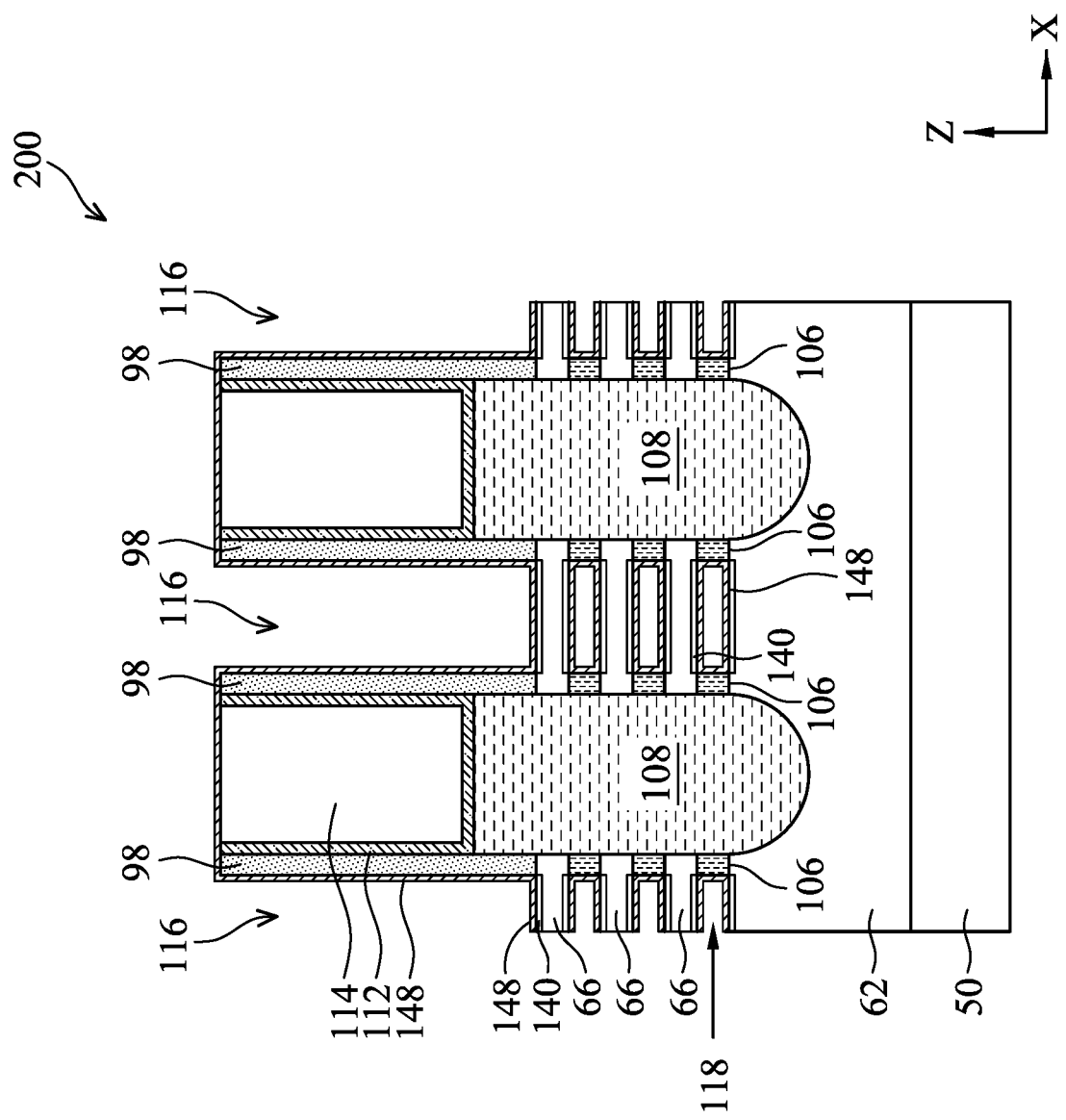
Figure 31B:
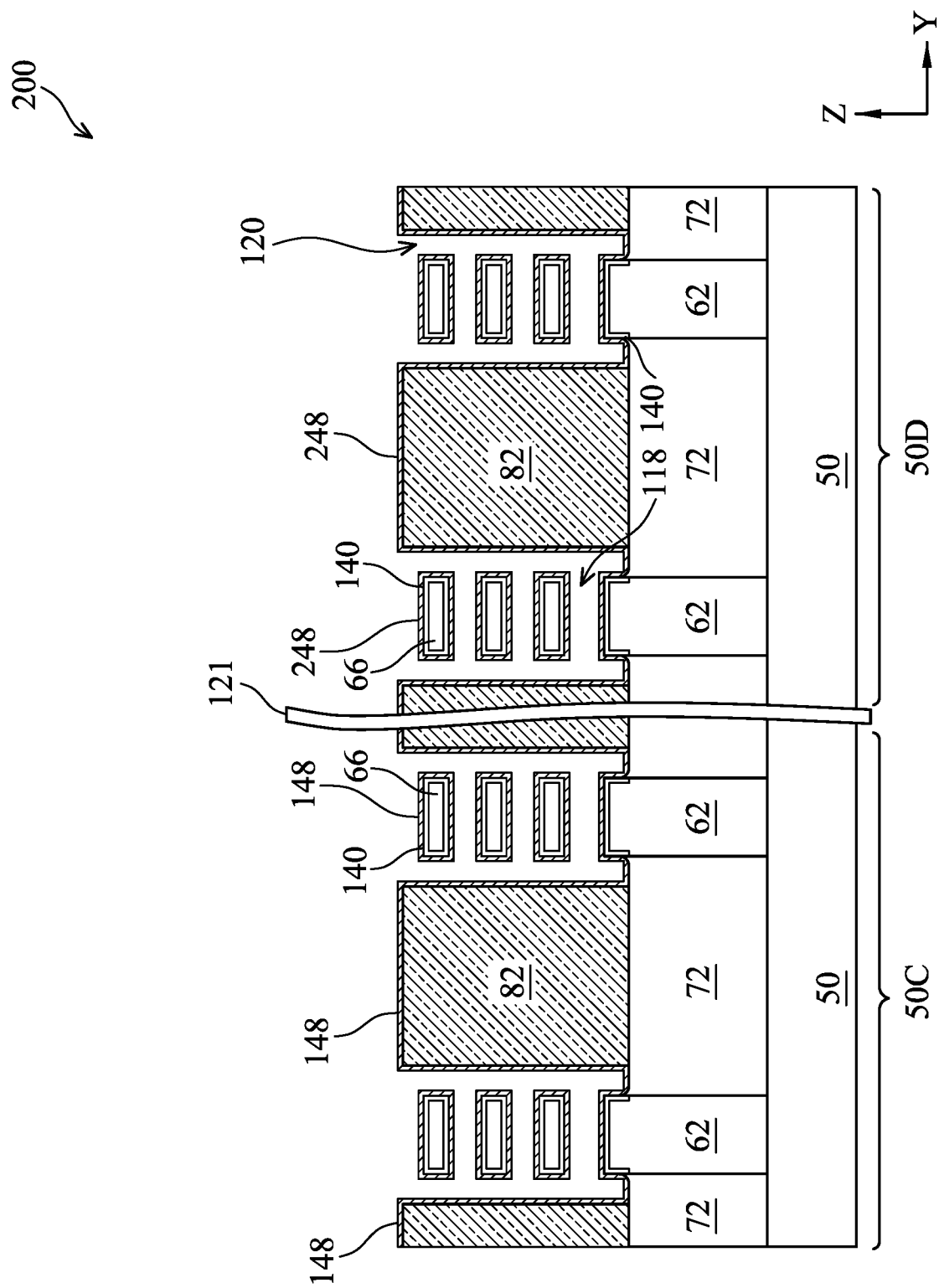

Next, in FIGS. 31A and 31B, a thermal treatment is applied to the nanostructure-FETs 200 (e.g., applies to the dipole layer 244) to introduce the dipole elements of the dipole layer 244 into the gate dielectric layer 142 in the second region 50D. As such, a doped gate dielectric layer 248 (e.g., the first-step formed gate dielectric layer), with the dipole elements of the dipole layer 244 incorporated in it, is formed (e.g., converted) from the gate dielectric layer 142 in the second region 50D. Exemplary material of the doped gate dielectric layer 248 may be an oxide or the silicate of Hf, Al, or Zr doped with La, Y, Ti, Ge, Al, Ga, Zn, or a combination thereof. In some embodiments, the doped gate dielectric layer 248 is HfLaO, HfLaSiO, HfAlO, HfAlSiO, HfZnO, or HfZnSiO. In some embodiments, during the thermal treatment, the dipole elements in the dipole layer 244 may diffuse into the gate dielectric layer 142, while the metal elements of the gate dielectric layer 142 may generally stay in the gate dielectric layer 142. In the illustrated embodiment, the doped gate dielectric layer 248 may have a substantially same thickness as the thickness of the gate dielectric layer 142 or the thickness of the doped gate dielectric layer 148. In some embodiments, the thermal treatment is performed at a temperature of about 500° C. to about 1250° C. or at a temperature of about 900° C. to about 1200° C. for about 0.05 seconds to about 5 seconds. In some embodiments, the thermal treatment is performed at an ambient containing NH₃, N₂, or a combination thereof.

In some embodiments, the dipole elements are dispersed throughout a thickness of the doped gate dielectric layer 248. In accordance with some embodiments, the doped gate dielectric layer 248 has a higher dipole element concentration at its center portion than its edge portions (e.g., the top portion or the bottom portion) along its thickness direction. In some embodiments, the atomic ratio between the metal elements of the high-k material and the dipole elements in the doped gate dielectric layer 248 may be between about 0.2% to about 20%.

In some embodiments, after the thermal treatment, the remaining portions of the dipole layer 244 over the doped gate dielectric layer 248 are removed. In accordance with some embodiments, the remaining portions of the dipole layer 244 are removed by a suitable etching method, for example, a wet etch process. The etching process may use an etchant that etches the material of the dipole layer 244 at a faster rate than the material of the doped gate dielectric layer 148 in the first region 50C and the doped gate dielectric layer 248 in the second region 50D.

Figure 32A:
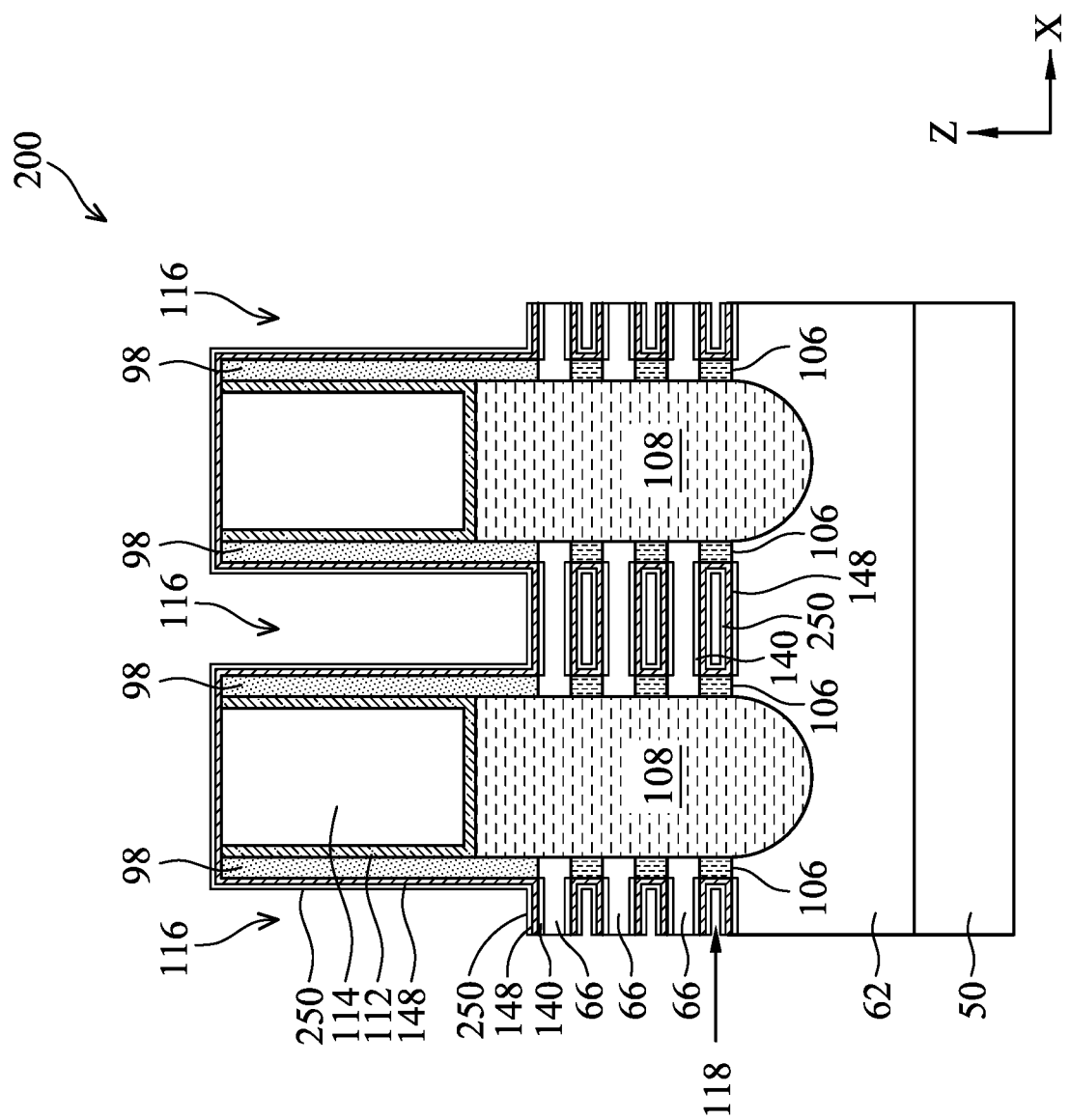
Figure 32B:
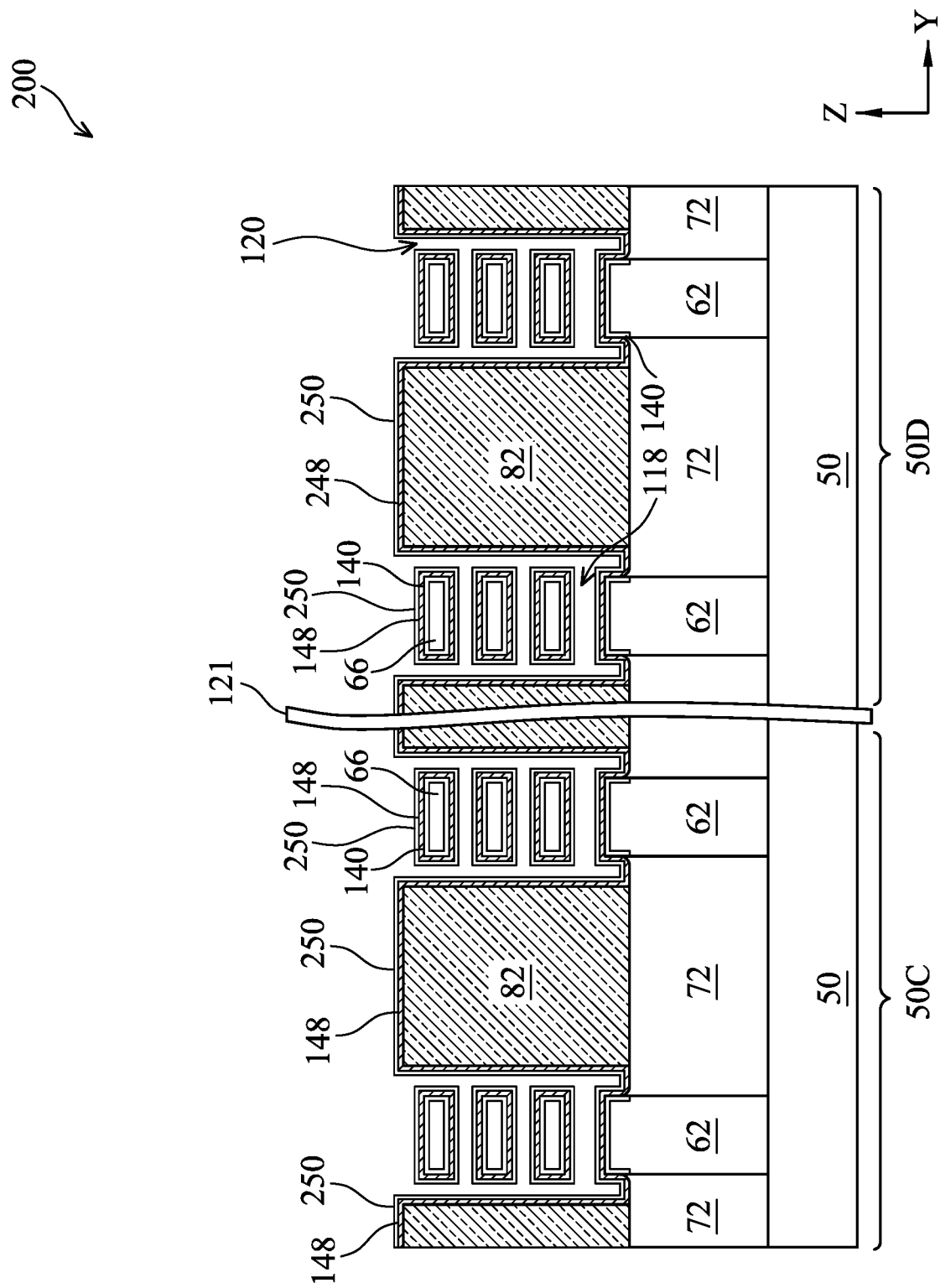

Next, in FIGS. 32A and 32B, a dielectric layer 250 is formed over the doped gate dielectric layer 148 in the first region 50C and the doped gate dielectric layer 248 in the second region 50D. As discussed in greater detail below, the dielectric layer 250 may be subsequently doped with fluorine and will act as another layer of a gate dielectric layer. The dielectric layer 250 may be formed of a same or similar material as the dielectric layer 150 using a same or similar formation method, and thus details are not repeated. In some embodiments, the thickness of the dielectric layer 250 is the same as the thickness of the doped gate dielectric layer 148 or doped gate dielectric layer 248. In other embodiments, the thickness of the dielectric layer 250 is greater than the thickness of the doped gate dielectric layer 148 or doped gate dielectric layer 248.

Figure 33A:
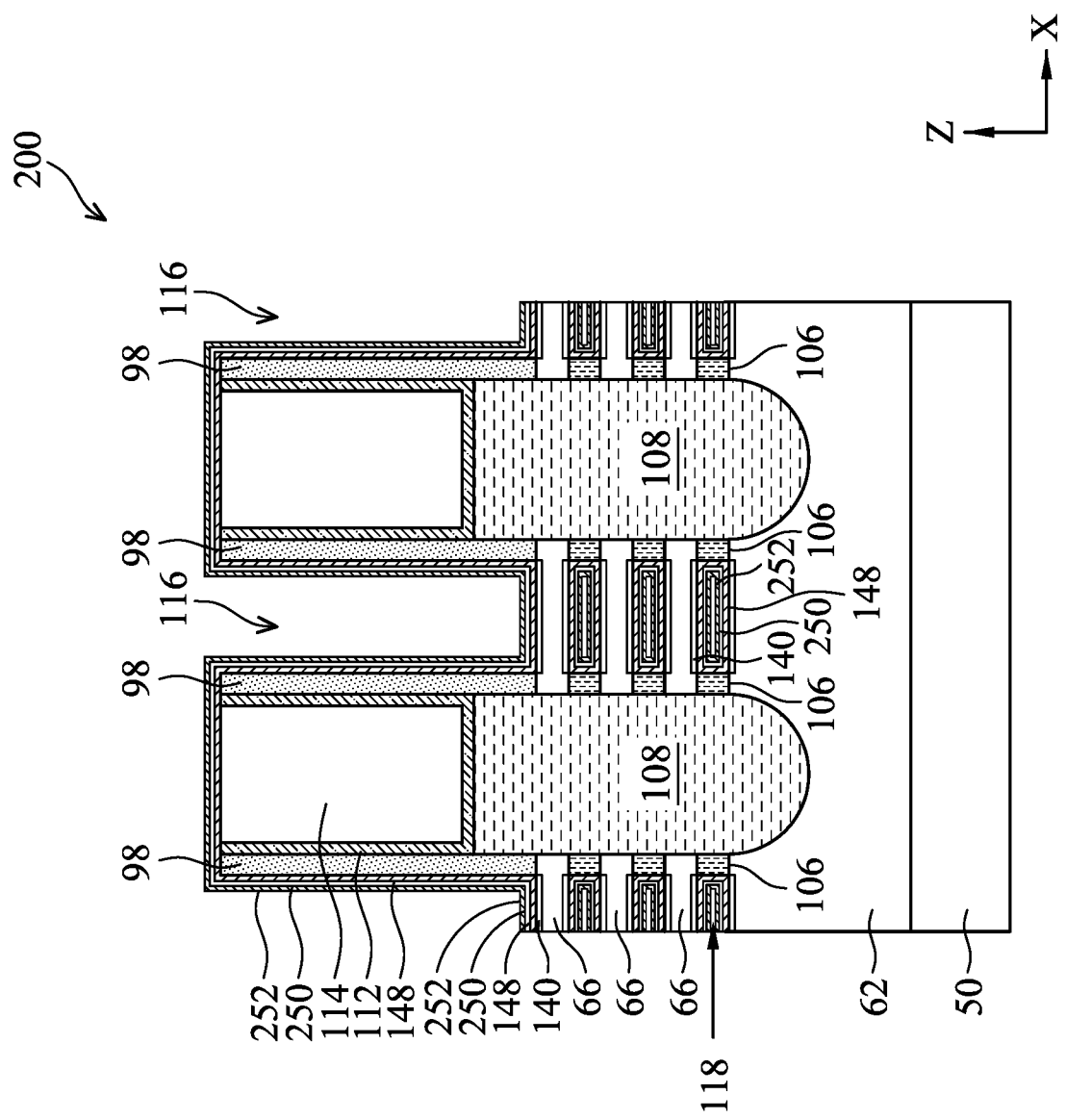
Figure 33B:
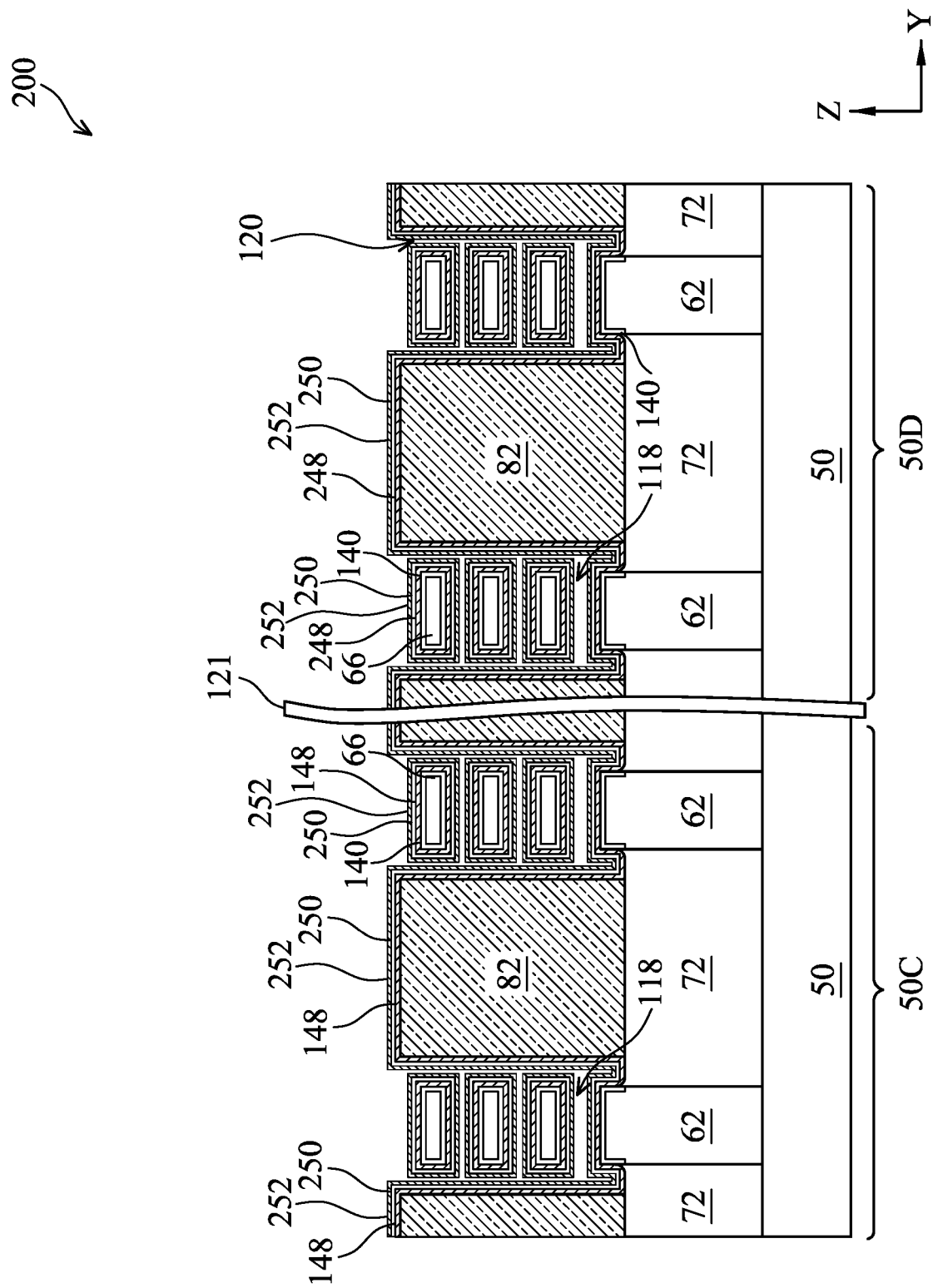

In FIGS. 33A and 33B, a barrier layer 252 is formed over the dielectric layer 230 in the first region 50C and the second region 50D, in accordance with some embodiments. The barrier layer 252 may be formed of a same or similar material as the barrier layer 152 using a same or similar formation method, thus details are not repeated. In some embodiments, the barrier layer 252 may be omitted.

Figure 34A:
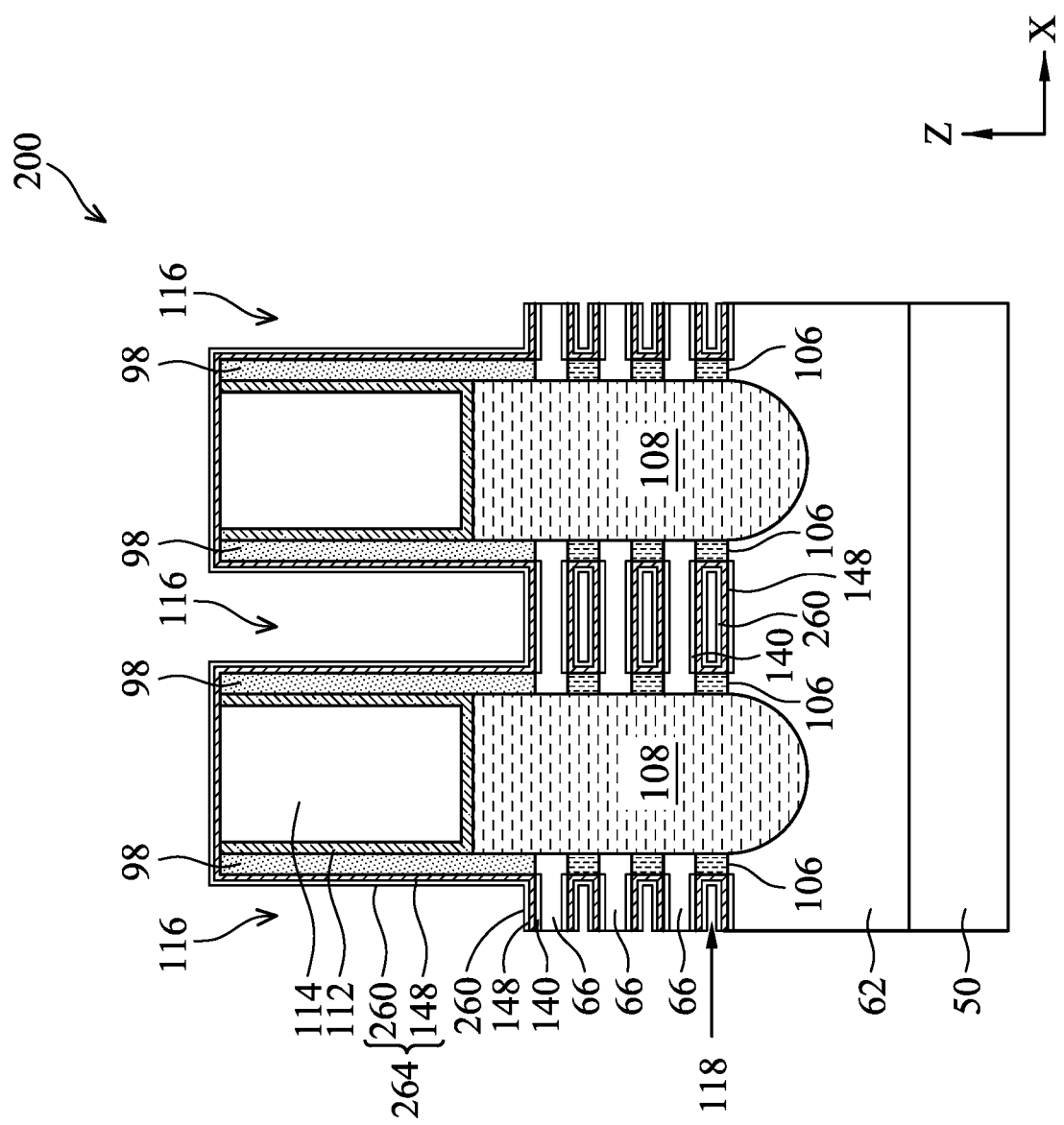
Figure 34B:
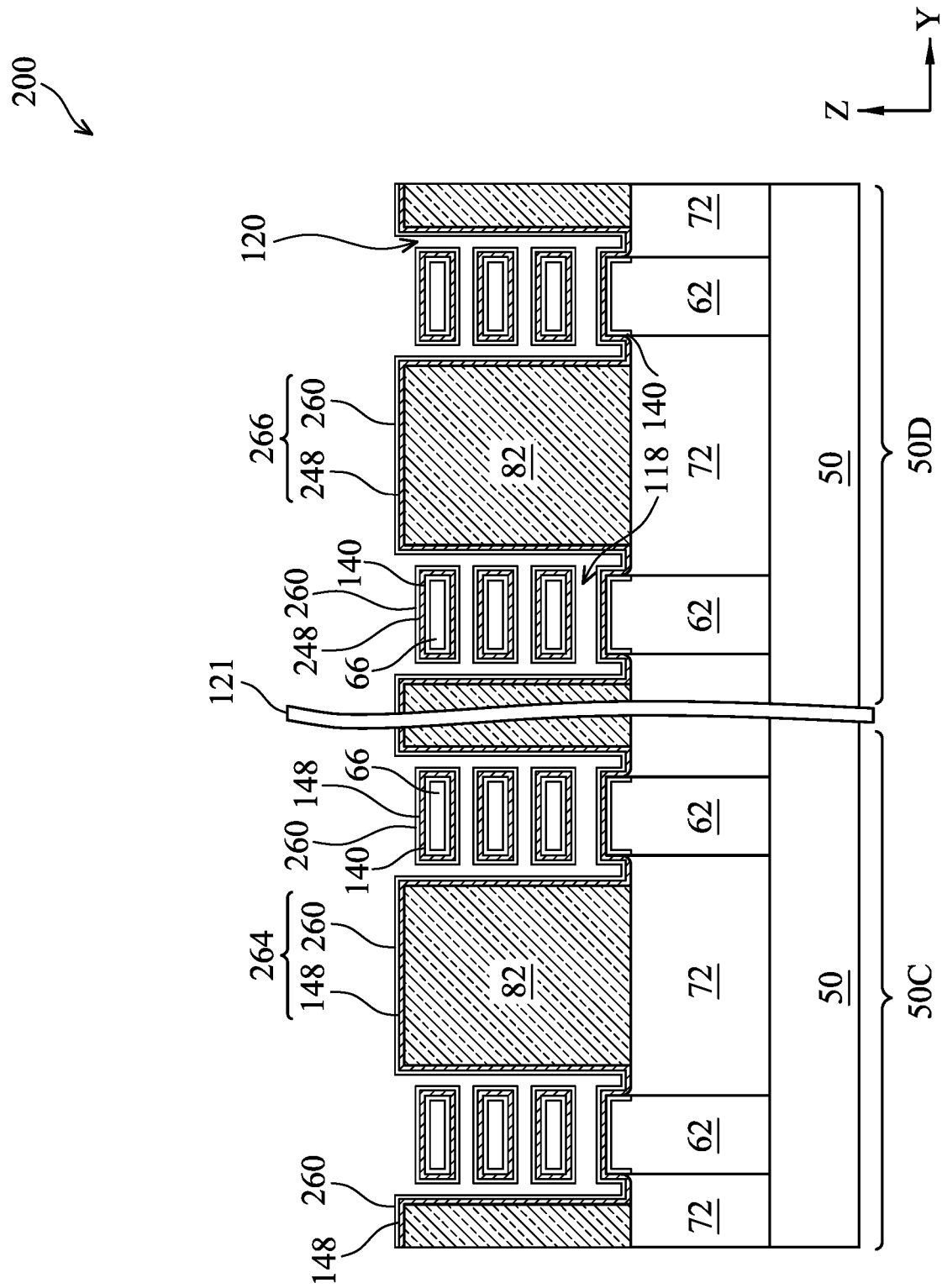

In FIGS. 34A and 34B, fluorine atoms are introduced into the dielectric layer 250 in accordance with some embodiments, thereby forming a fluorine-containing gate dielectric layer 260 in the first region 50C and the second region 50D. The fluorine atoms may passivate the oxygen vacancy and/or reduce silicon dangling bonds in the gate dielectric layers 250, 148, 248, and/or the interfacial layer 140 so as to increase the mobility of the nanostructure-FETs 200. The doped gate dielectric layer 148 and the fluorine-containing gate dielectric layer 260 in the first region 50C are collectively referred to as gate dielectric layer 264, and the doped gate dielectric layer 248 and the fluorine-containing gate dielectric layer 260 in the second region 50D are collectively referred to as gate dielectric layer 266.

Figure 35A:
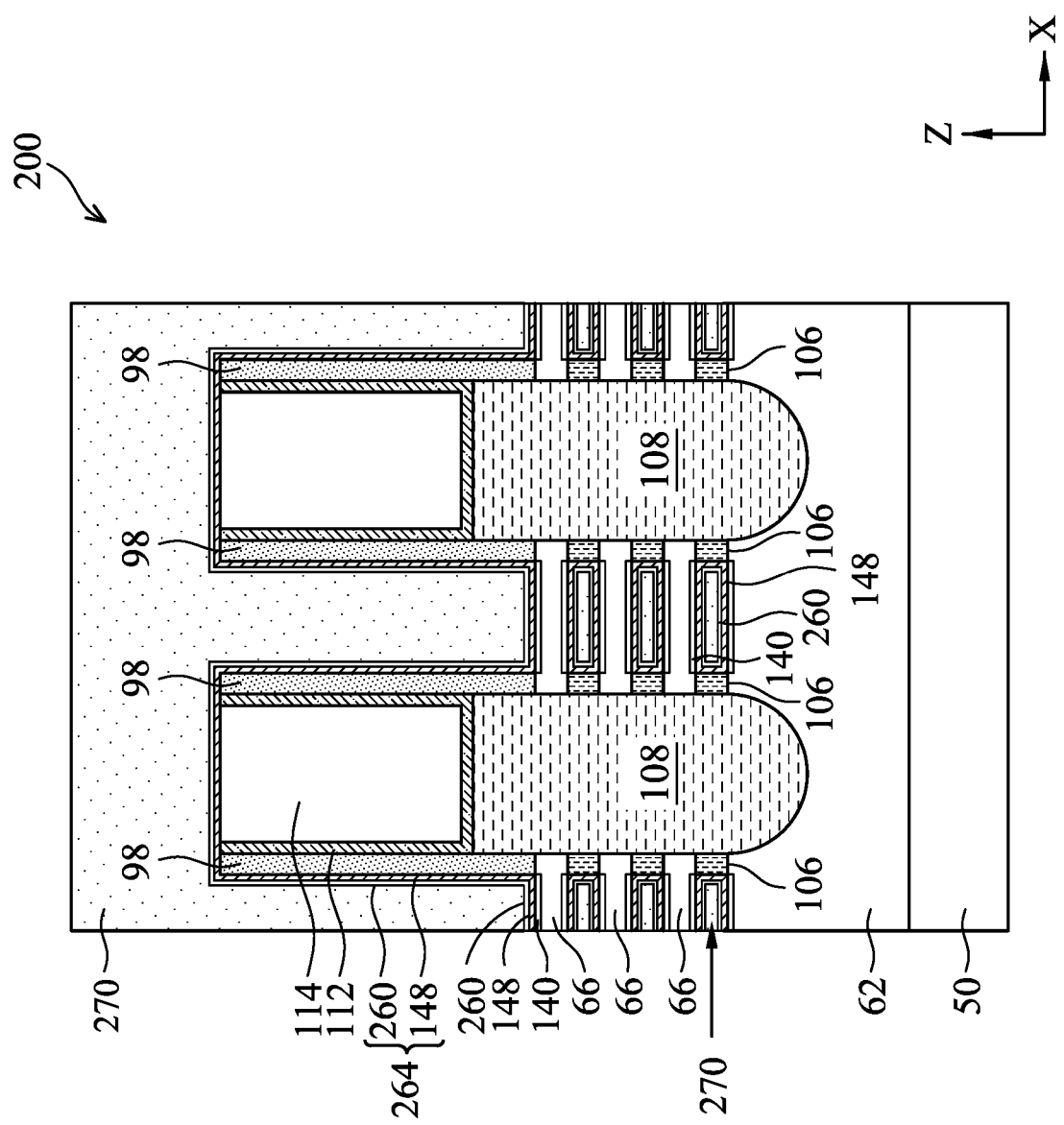
Figure 35B:
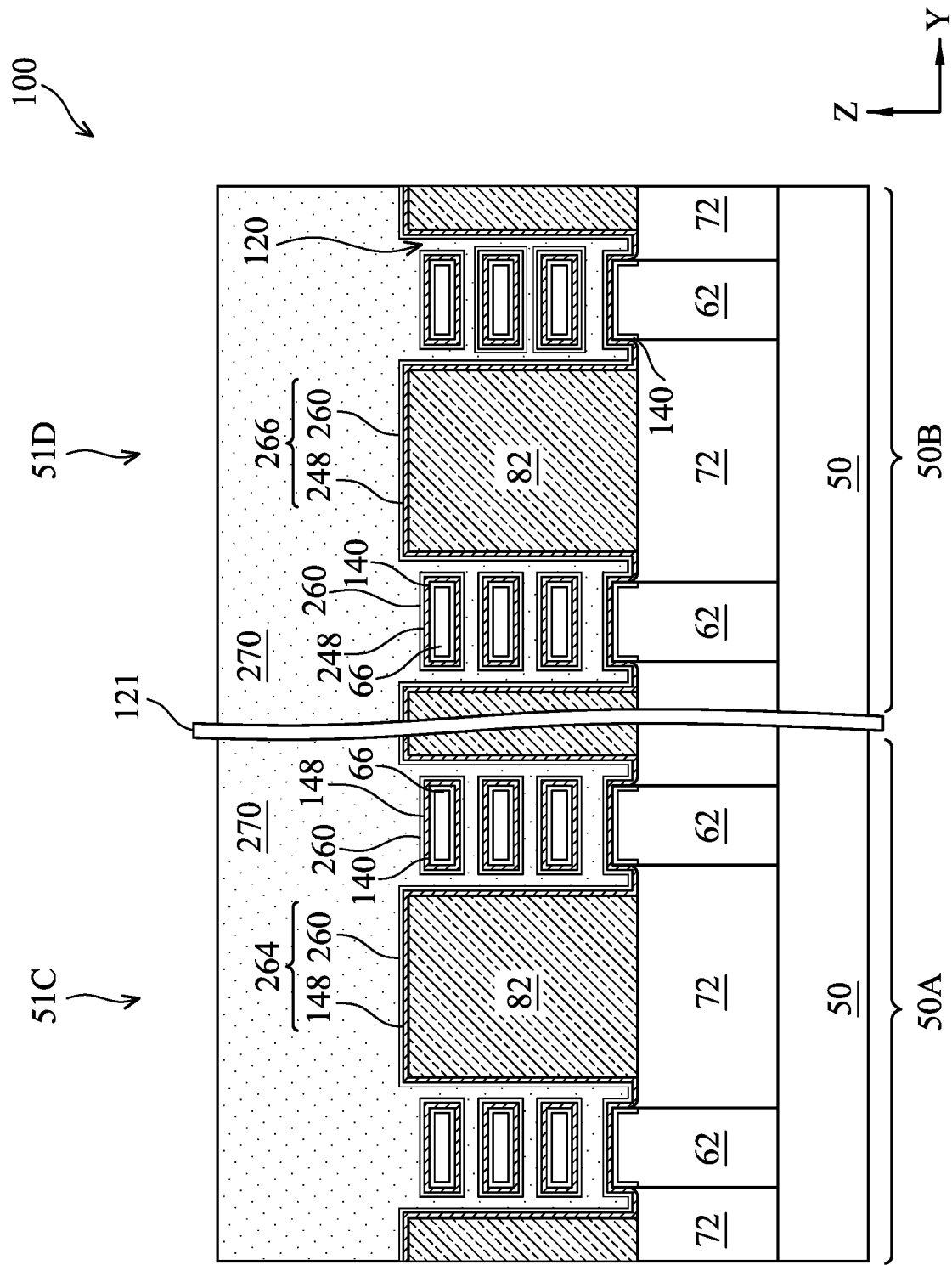

In FIGS. 35A and 35B, a gate electrode layer 270 is deposited over and around the gate dielectric layer 264 in the first region 50A and the gate dielectric layer 266 in the second region 50B, and fills the openings 118 and 120 and the remaining portions of the recesses 116. The gate electrode layer 270 may be formed of the same material as the gate electrode layer 170 using the same or similar formation method. After the gate electrode layer 270 is formed, a planarization process, such as a CMP, may be performed to remove excess portions of the gate dielectric layers 264 and 266 and the gate electrode layer 270, which excess portions are over the top surface of the first ILD 114.

Figure 36A:
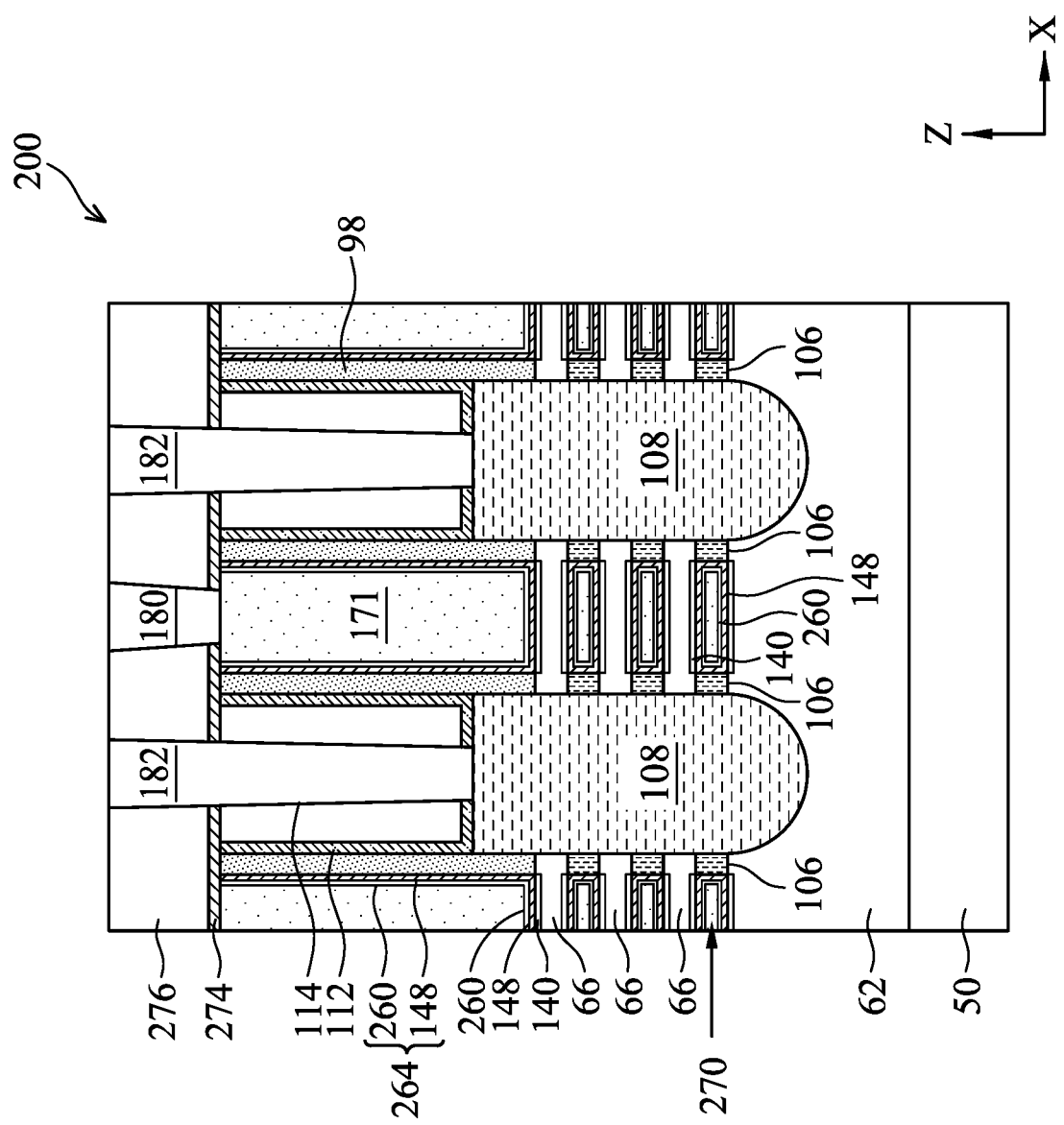
Figure 36B:
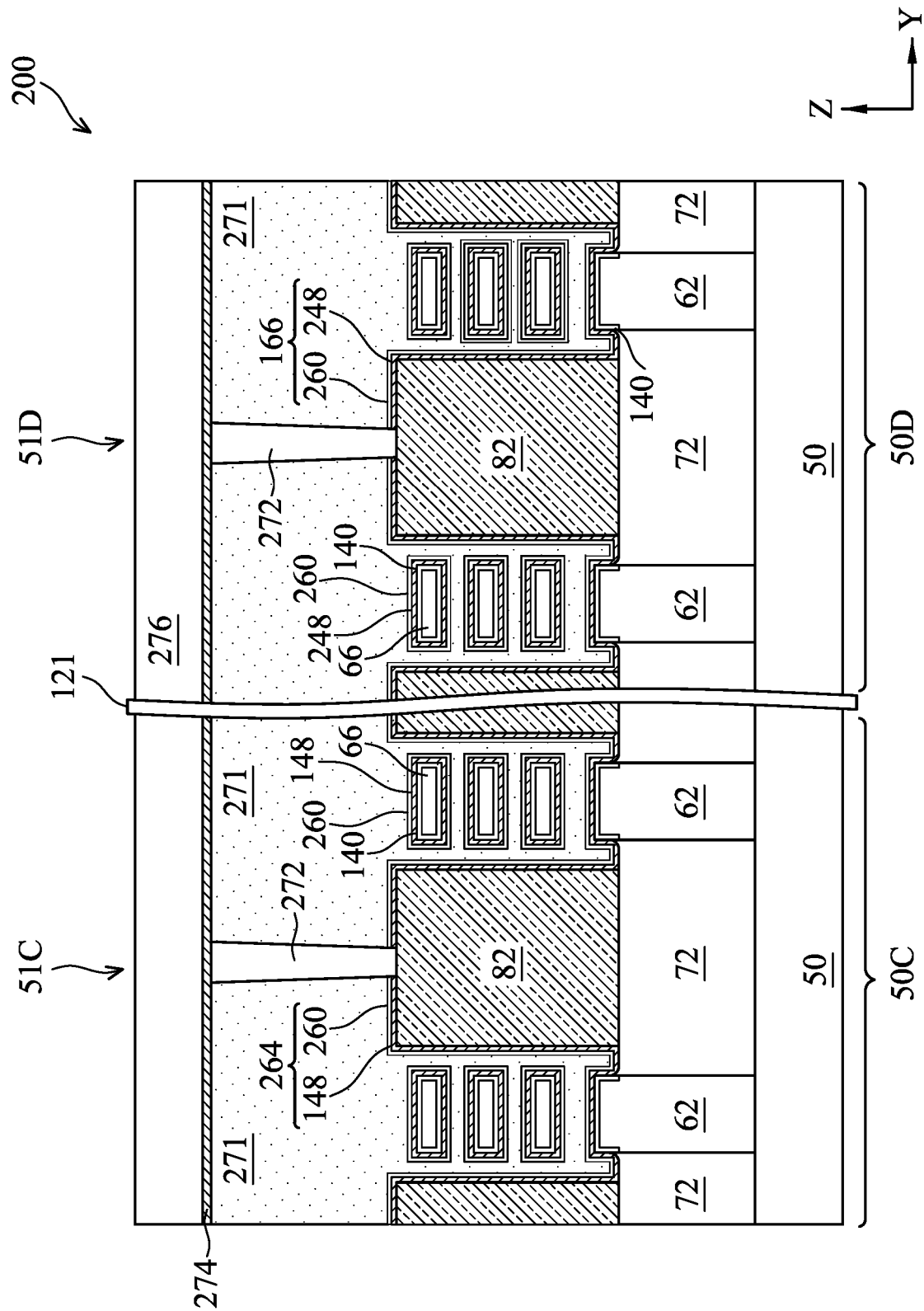

Additional processing may be performed to finish the fabrication of the nanostructure-FETs 200, as one of ordinary skill readily appreciates, and thus details may not be repeated here. For example, in FIGS. 36A and 36B, isolation regions 272 are formed extending through gate electrode layer 270. An isolation region 272 is formed to divide (e.g., cut) the gate electrode layer 270 into multiple gate electrodes 271. Each gate electrodes 271 and the corresponding interfacial layer 140, with the corresponding gate dielectric layer 264 or the corresponding gate dielectric layer 266, may be collectively referred to as a gate stack, a replacement gate structure, or a metal gate structure. Each gate stack extends over and around the respective nano structures 66.

The isolation region 272 may be formed of a dielectric material, such as silicon nitride, silicon oxide, silicon oxynitride, or the like, which may be formed by a deposition process such as CVD, ALD, or the like. In some embodiments, one or more layers of dielectric material may be deposited over the gate electrodes 271 and the isolation regions 272. For example, an optional etch stop layer (ESL) 274 is formed over the gate spacers 98, the CESL 112, the first ILD 114, and the gate electrodes 271, and a second ILD 276 is deposited over the ESL 274. Gate contacts 280 and source/drain contacts 282 are formed through the second ILD 276, the ESL 274, the first ILD 114, and the CESL 112 to electrically connect to the gate electrodes 271 and the epitaxial source/drain regions 108, respectively.

In some embodiments, the semiconductor device 51C in the first region 50C has a reduced threshold voltage by incorporating an n-type dipole element, and the semiconductor device 51D in the second region 50D has an increased threshold voltage by incorporating a p-type dipole element, or vice versa. In such embodiments, the semiconductor device 51C in the first region 50C has a threshold voltage that is about 40 mV to about 900 mV lower than the threshold voltage of the semiconductor device 51D in the second region 50D, or vice versa. In other embodiments, the semiconductor device 51C and the semiconductor device 51D may use the same type dipole element and has a threshold voltage difference of between 0 mV to about 430 mV.

FIGS. 37, 38A, 38B, 39A, 39B, 40A, 40B, 41A, 41B, 42A, 42B, 43A, 43B, 44A, and 44B illustrate a FinFET device 300 at certain stages of manufacturing, in accordance with an embodiment. In some embodiments, a two-step formed gate dielectric layer is provided in the FinFET device 300. In this embodiment, same features are designated same numeral references as in the previous embodiments. Note that although FIGS. 37, 38A, 38B, 39A, 39B, 40A, 40B, 41A, 41B, 42A, 42B, 43A, 43B, 44A, and 44B only illustrate one device region, this device region can be incorporated to various embodiments of the present disclosure. The illustrated device region may be integrated with other device regions that have two-step-formed gate dielectric layers of the previous embodiments, with or without other dipole elements incorporated therein, and may be compatible with their corresponding manufacturing processes. For example, gate dielectric layers on different fins may have different dipole elements.

Figure 37:
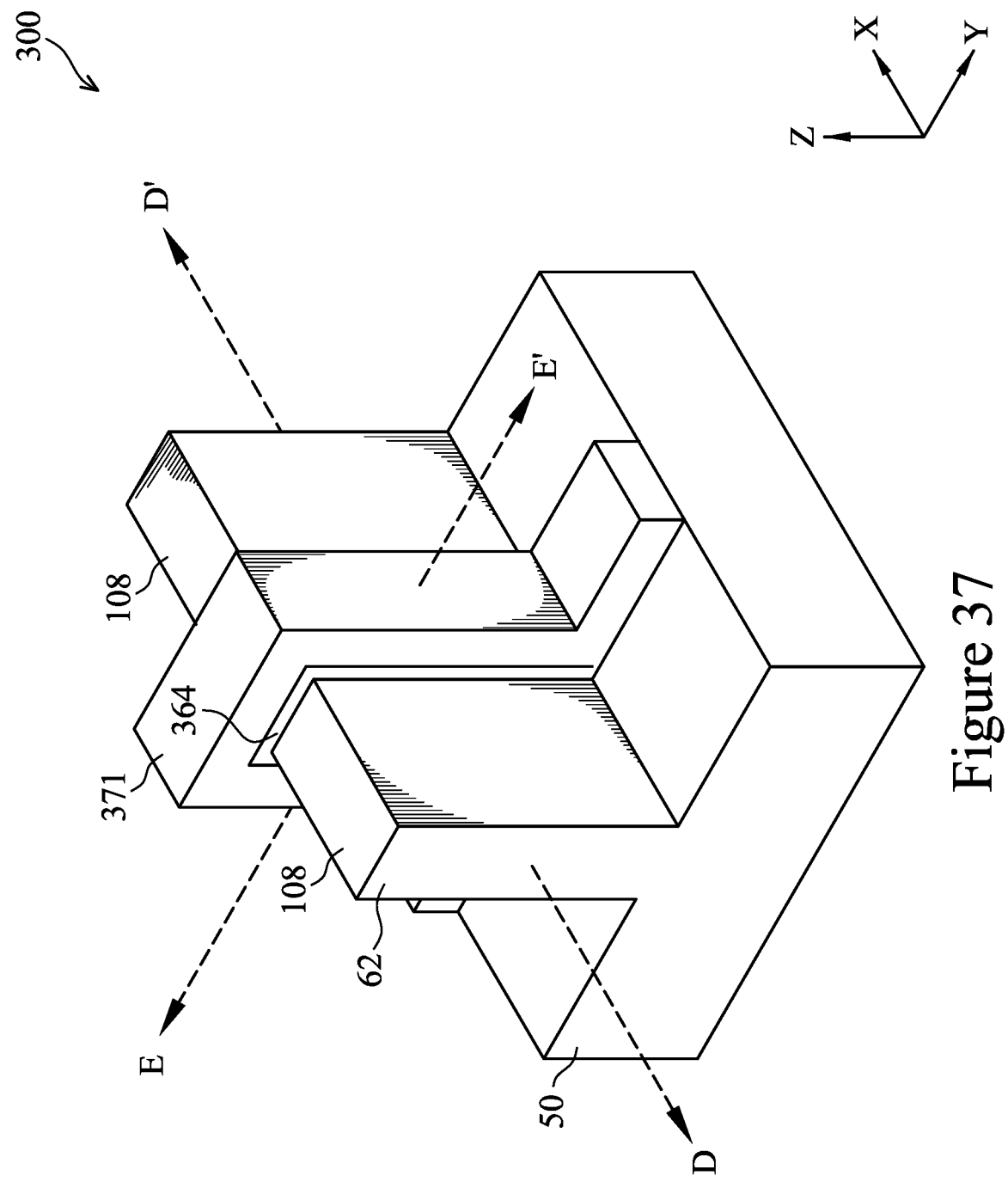
FIG. 37 illustrates an example of a fin field-effect transistor (FinFET) device in a three-dimensional view device, in accordance with some embodiments.

FIG. 37 illustrates an example of a FinFET in a three-dimensional view in accordance with some embodiments. The FinFET device 300 includes a semiconductor fin 62 over a substrate 50 (e.g., a semiconductor substrate). Isolation regions 72 are disposed in the substrate 50, and the semiconductor fin 62 protrudes above and from between neighboring Isolation regions 72. A gate dielectric layer 364 is along sidewalls and over a top surface of the semiconductor fin 62, and a gate electrode 371 is over the gate dielectric layer 364. Epitaxial source/drain regions 108 are disposed in opposite sides of the semiconductor fin 62 with respect to the gate dielectric layer 364 and gate electrode 371.

FIG. 37 further illustrates reference cross-sections that are used in later figures. Cross-section D-D' is along a longitudinal axis of the semiconductor fin 62 and in a direction of, for example, a current flow between epitaxial source/drain regions 108 of the FinFET device 300 (e.g., along the X-axis). Cross-section E-E' is perpendicular to cross-section D-D' and along a longitudinal axis of the gate electrode 371 and in a direction, for example, perpendicular to the direction of current flow between the epitaxial source/drain regions 108 of the FinFET device 300 (e.g., along the Y-axis). The semiconductor fin 62 under the gate electrode 371 and interposed between the epitaxial source/drain regions 108 act as the channel region of the FinFET device 300. FIGS. 38A, 39A, 40A, 41A, 42A, 43A and 44A illustrate reference cross-section E-E' illustrated in FIG. 37, except for multiple fins. FIGS. 38B, 39B, 40B, 41B, 42B, 43B, and 44B are illustrated along reference cross-section D-D' illustrated in FIG. 37. Subsequent figures refer to these reference cross-sections for clarity.

Figure 38B:
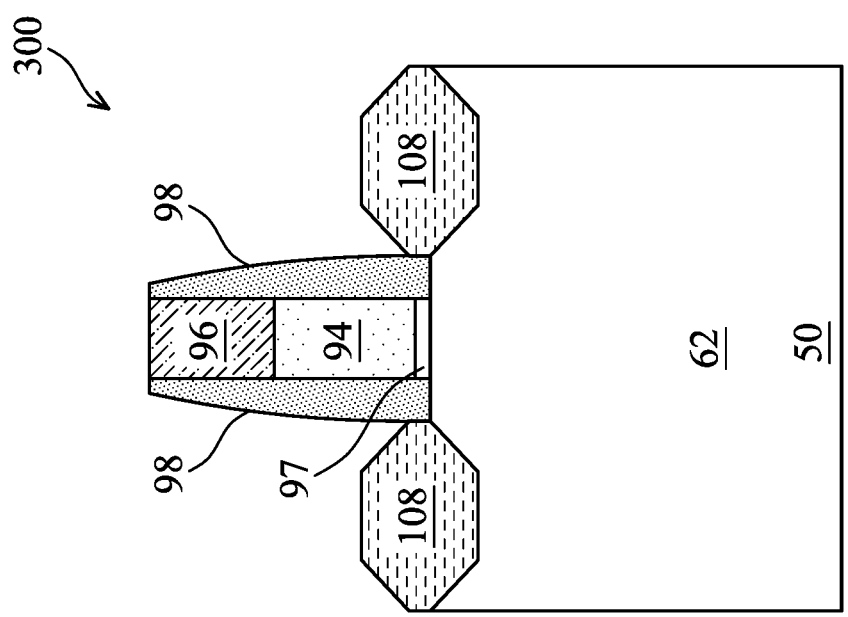
FIGS. 38A, 38B, 39A, 39B, 40A, 40B, 41A, 41B, 42A, 42B, 43A, 43B, 44A, and 44B are cross-sectional views of a FinFET device at various stages of manufacturing, in accordance with some embodiments.
Figure 38A:
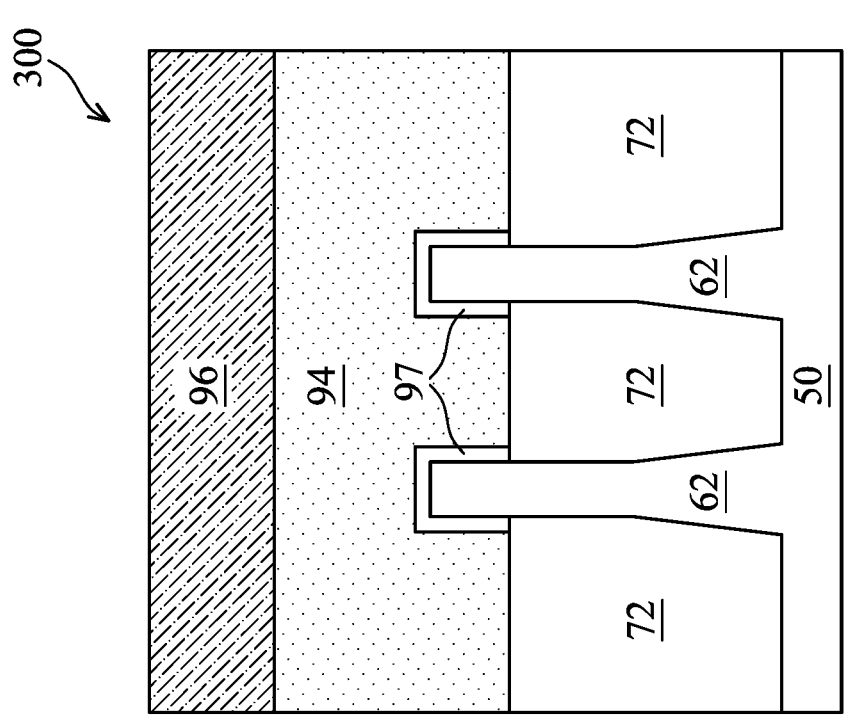
Figure 39B:
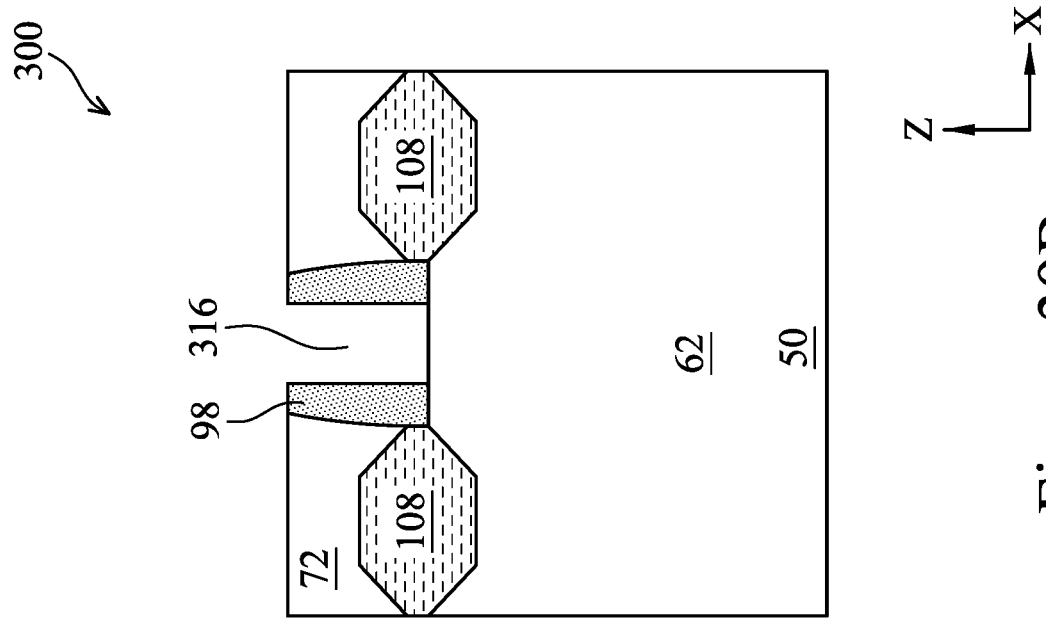
Figure 39A:
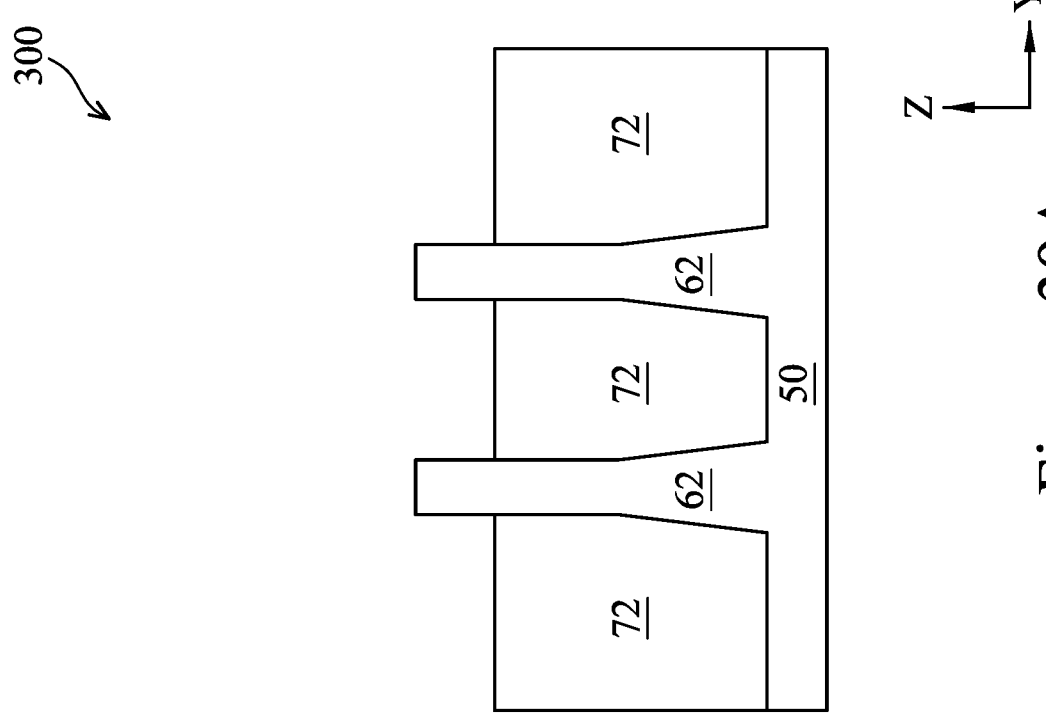

In FIGS. 38A and 38B, a FinFET device 300 is provided, in accordance with some embodiments. The FinFET device 300 includes semiconductor fins 62 protruding over the substrate 50. Isolation regions 72 are disposed between neighboring semiconductor fins 62. In some embodiments, dummy gate dielectric 97, dummy gates 94, masks 96 are disposed over the semiconductor fins 62, and the dummy gate dielectric 97 and the dummy gates 94 are across the semiconductor fins 62. Gate spacers 98 may extend along the sidewalls of the dummy gate dielectric 97, dummy gates 94, and the mask 96. In FIGS. 39A and 39B, the dummy gate dielectric 97, the dummy gates 94, and the mask 96 are removed in an etching step(s) so that recesses 316 are formed. In some embodiments, the dummy gate dielectric 97 and the dummy gates 94 are removed by an anisotropic dry etch process. For example, the etching process may include a dry etch process using reaction gas(es) that selectively etch the dummy gate dielectric 97 and the dummy gates 94 without etching the isolation regions 72 or the gate spacers 98. Each recess 316 exposes a respective semiconductor fin 62.

Figure 40B:
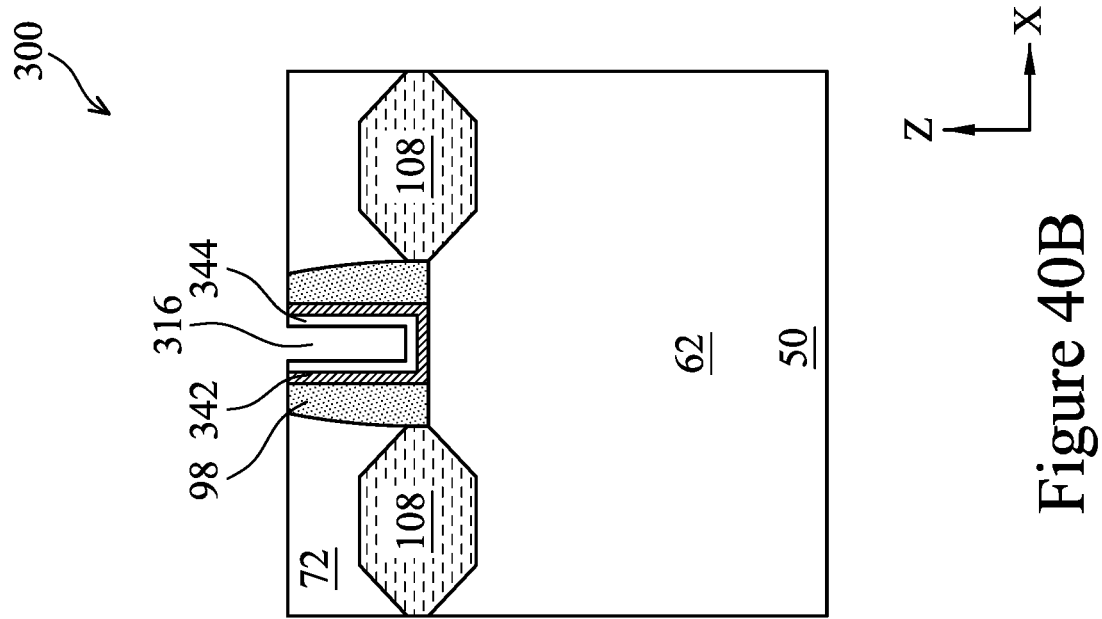
Figure 40A:
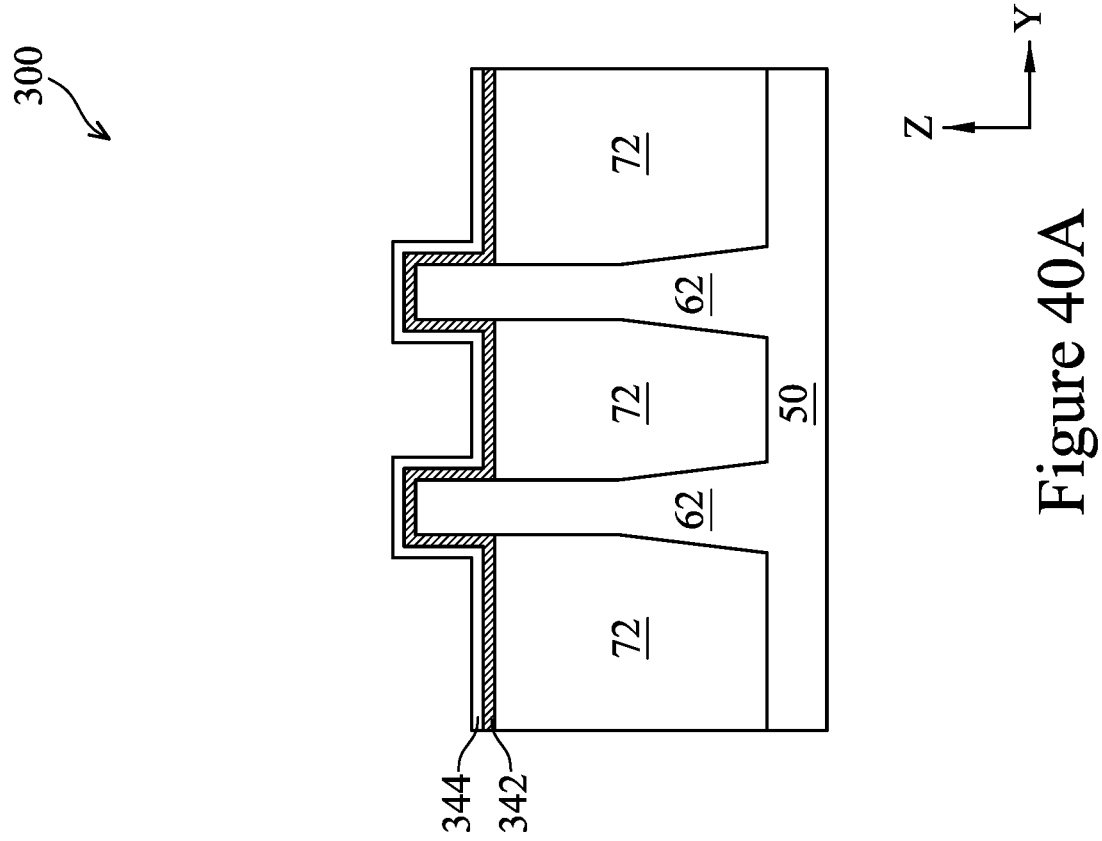

In FIGS. 40A and 40B, a dielectric layer 342 is conformally deposited in the recesses 316, such as over the top surfaces and the sidewalls of the semiconductor fins 62. In some embodiments, although it is not shown in FIGS. 40A and 40B, an interfacial layer may be formed before the dielectric layer 342 is deposited. In some embodiments, the dielectric layer 342 is formed of the same material of the gate dielectric layer 142 using the same or similar method. In some embodiments, the dielectric layer 342 may have a thickness of about 8 angstroms to about 20 angstroms. A dipole layer 344 is conformally deposited over the dielectric layer 322 in accordance with some embodiments. The dipole layer 344 may be formed of the same material as the dipole layer 144 using the same or similar method. In some embodiments, the dipole layer 344 has a thickness less than about 1 nm, or between about 2 angstroms to about 9 angstroms.

Figure 41B:
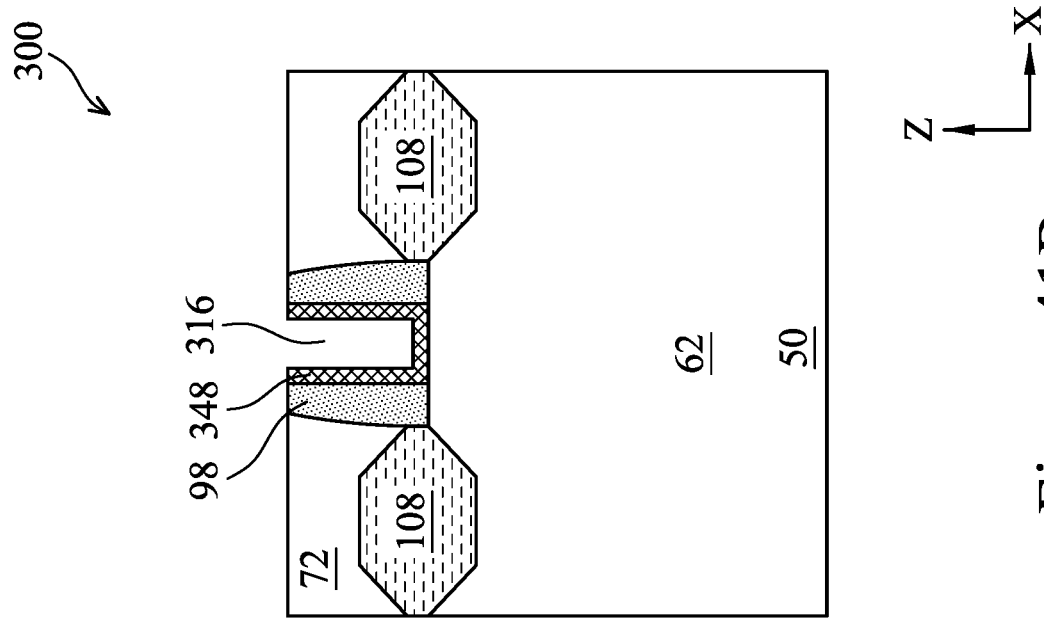
Figure 41A:
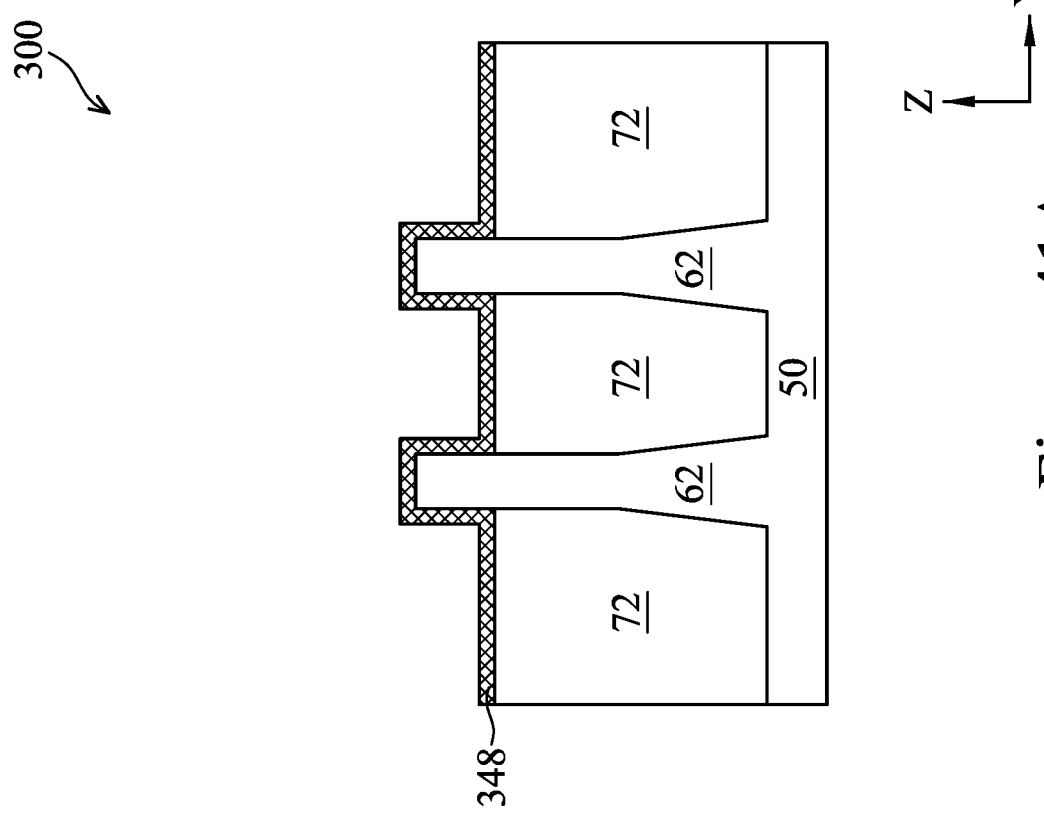

In FIGS. 41A and 41B, a thermal treatment is applied to the FinFET device 300 (e.g., applies to the dipole layer 344) to introduce the dipole elements of the dipole layer 344 into the dielectric layer 342, thereby forming a doped gate dielectric layer 348. In some embodiments, the doped gate dielectric layer 348 may have similar characteristics or properties to that of the doped gate dielectric layer 148.

In some embodiments, after the thermal treatment, the remaining portions of dipole layer 344 over the doped gate dielectric layer 348 are removed. In accordance with some embodiments, the dipole layer 344 is removed by a suitable etching method, such as a wet etch process. The etching process may use an etchant that etches the material of the dipole layer 344 faster than the material of the doped gate dielectric layer 348.

Figure 42B:
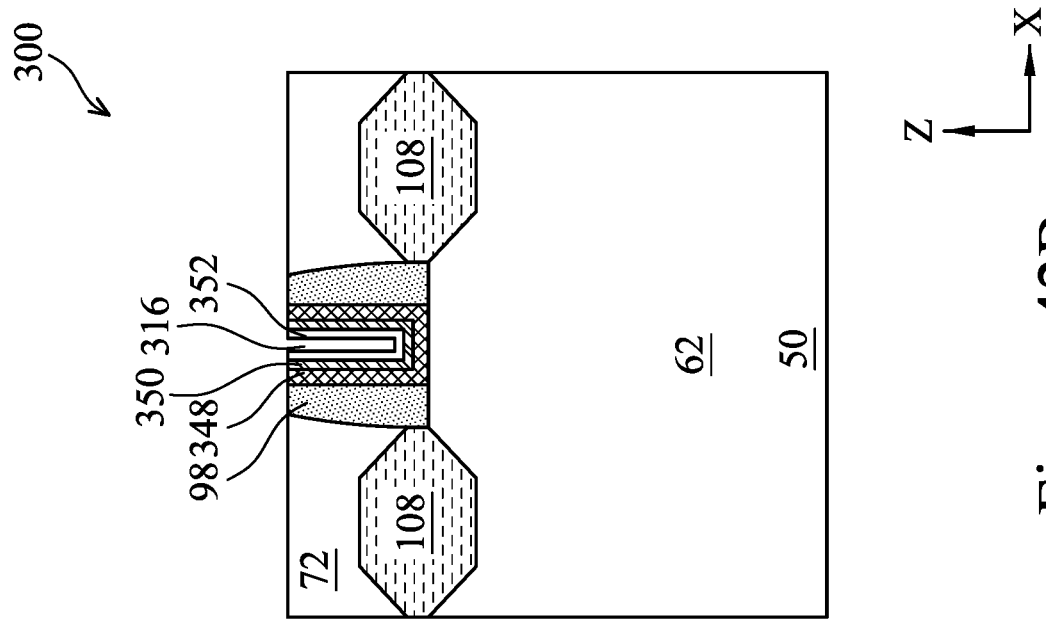
Figure 42A:
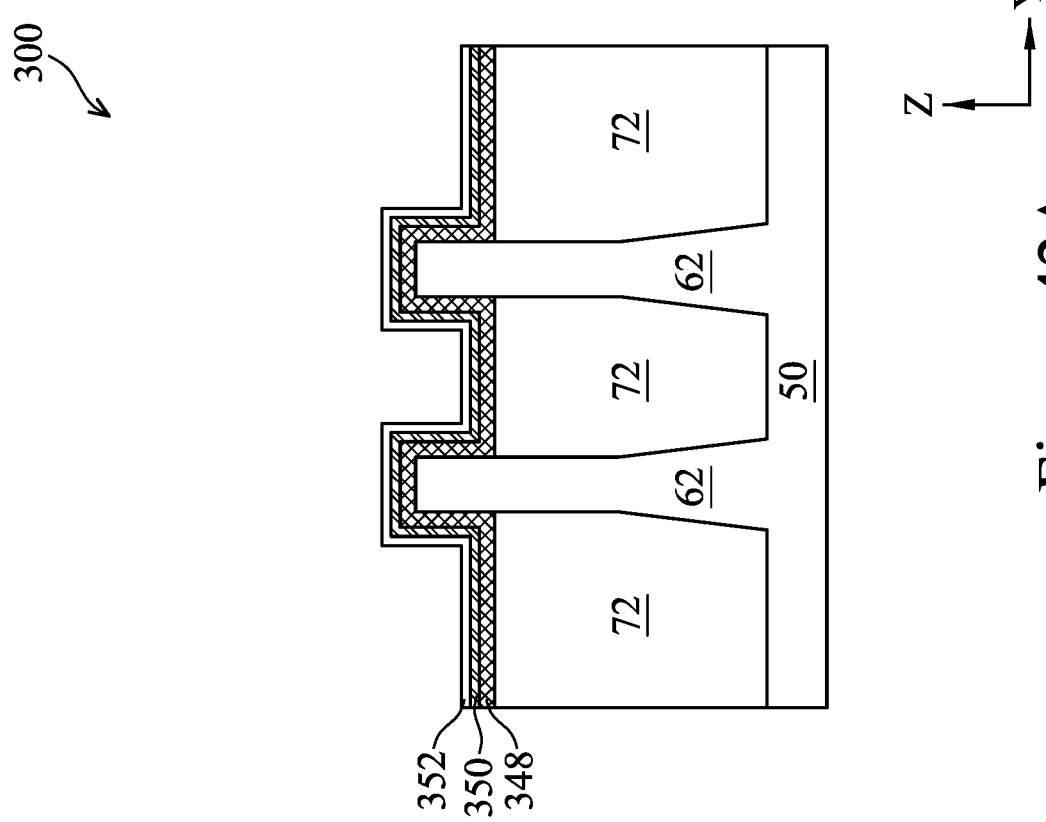

Next, in FIGS. 42A and 42B, a dielectric layer 350 is formed over the doped gate dielectric layer 348, and a barrier layer 352 is formed over the dielectric layer 350 in accordance with some embodiments. In some embodiments, the barrier layer 352 may be omitted. The dielectric layer 350 and the barrier layer 352 may be formed of the same material as the dielectric layer 150 and the barrier layer 152, respectively, using the same or similar methods, respectively.

Figure 43B:
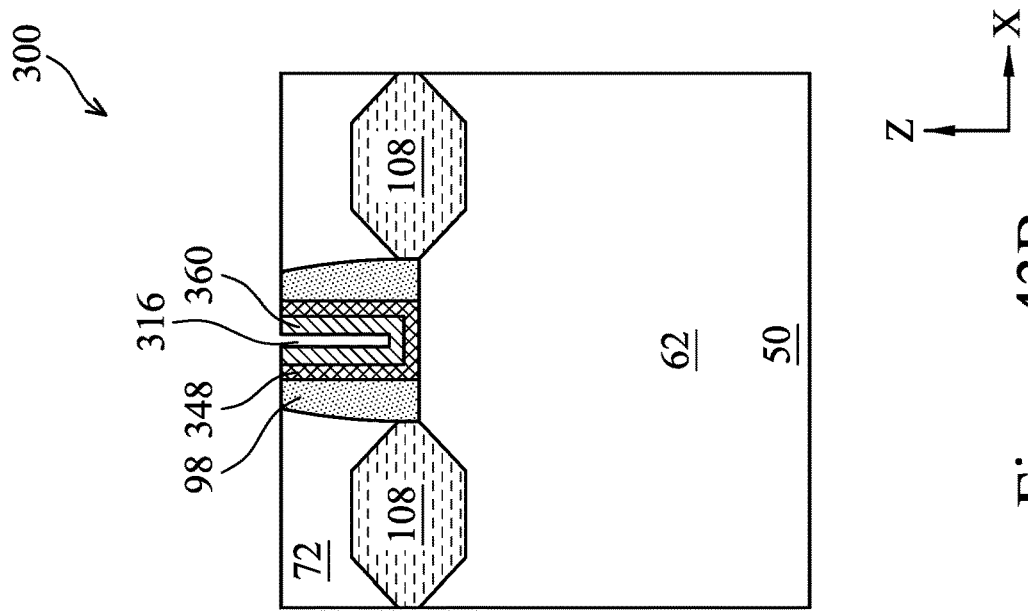
Figure 43A:
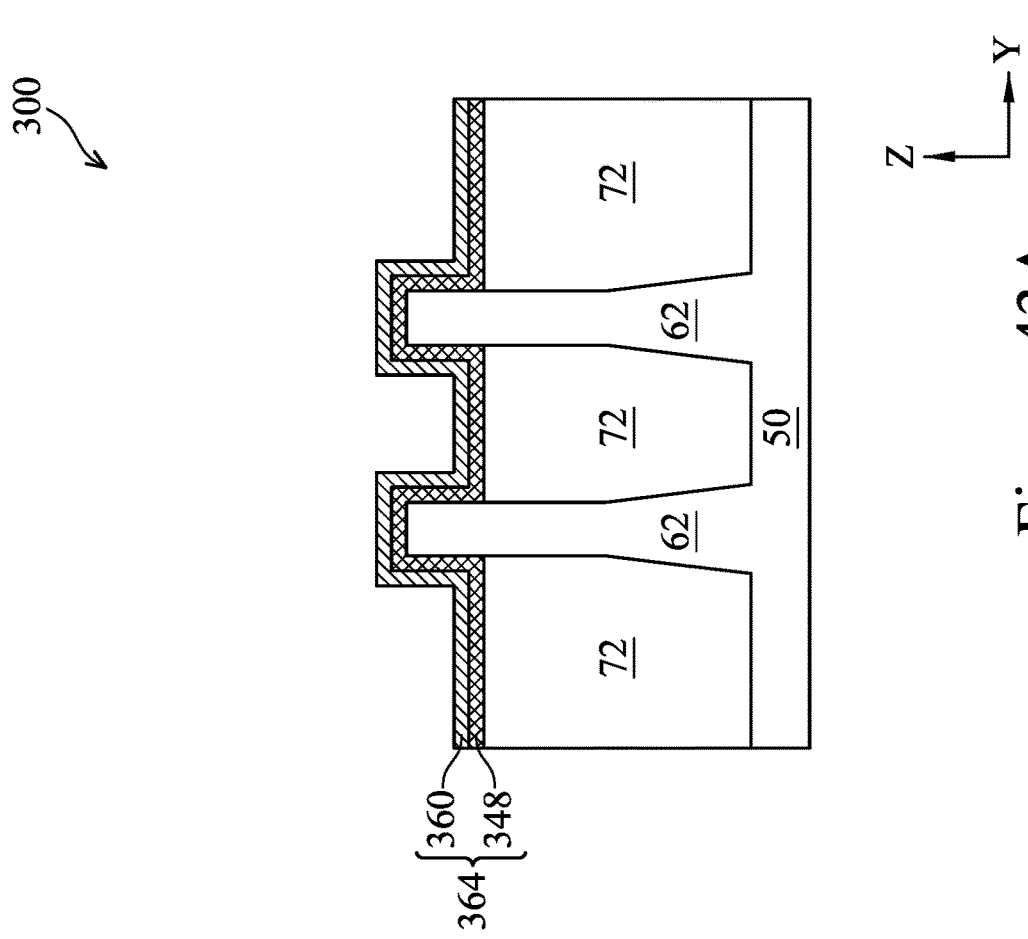

In FIGS. 43A and 43B, fluorine atoms are introduced into the dielectric layer 350 in accordance with some embodiments, thereby forming a fluorine-containing gate dielectric layer 360. The fluorine atoms may passivate the oxygen vacancy and/or reduce silicon dangling bonds in the dielectric layers 350, 348, and/or the underlying interfacial layer so as to increase the mobility of the FinFET device 300. The fluorine-containing gate dielectric layer 360 may be doped with fluorine atoms using similar processes and/or materials as discussed above in forming the fluorine-containing gate dielectric layer 160.

In some embodiments, the barrier layer 352 is removed. The barrier layer 352 may be removed by any suitable etching process, such as being etched by a mixture of $NH_4OH$, $H_2O_2$, and $H_2O$, a mixture of HCl, $H_2O_2$, and $H_2O$, a mixture of $H_2SO_4$, $H_2O_2$, and $H_2O$, or combinations thereof. In an embodiment that the fluorine-containing layer is formed, the fluorine-containing layer is removed, such as being removed by an etchant containing phosphoric acid.

Figure 44B:
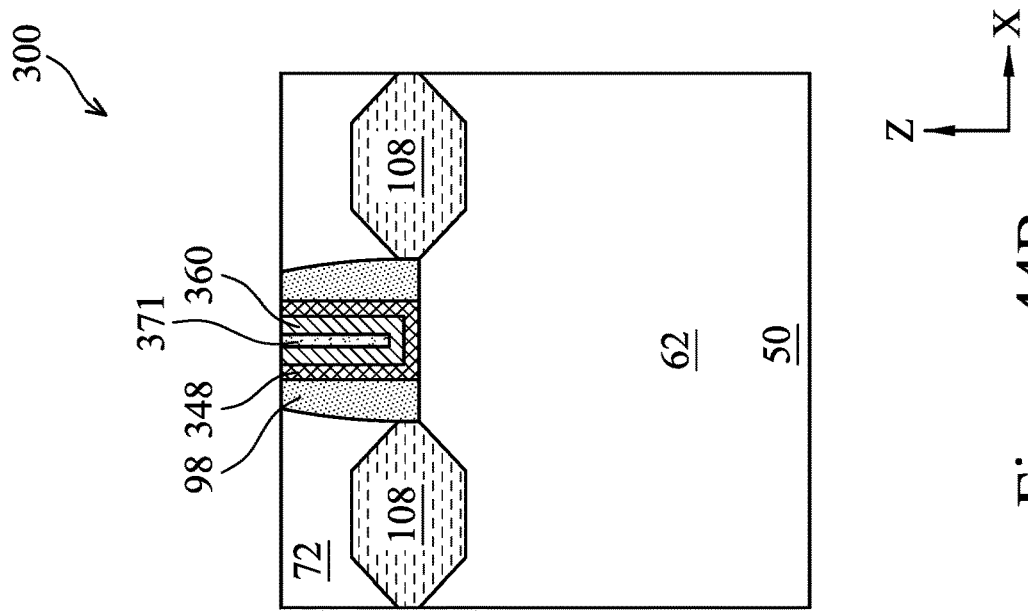
Figure 44A:
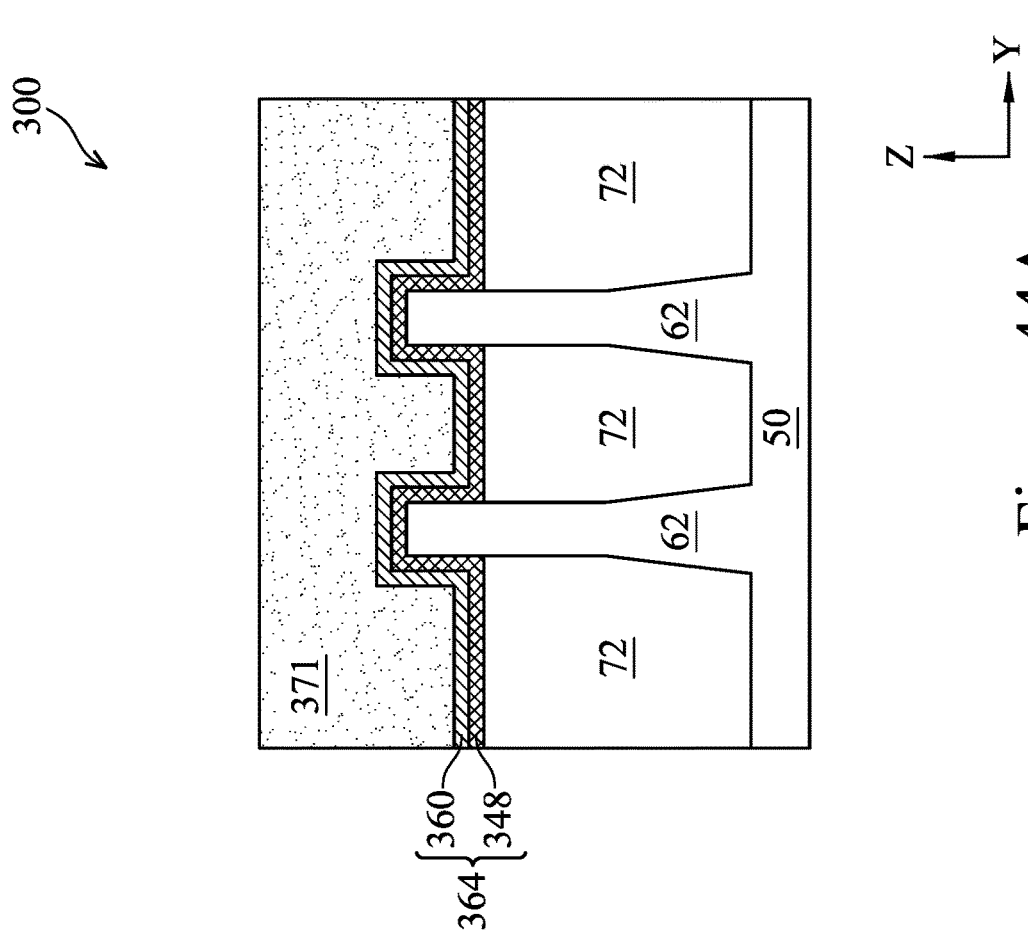

Next, in FIGS. 44A and 44B, a gate electrode 371 is formed over the gate dielectric layer 346. The gate electrode 371 is deposited over the gate dielectric layer 346, in accordance with some embodiments. Portions of gate electrode 371 outside the portions of the recesses 316 are removed by a planarized process such as CMP. The gate electrode 371 may be formed of a same or similar material as the gate electrode 171. Each gate electrode 371, and the corresponding interfacial layer (if present), and the gate dielectric layer 346 may be collectively referred to as a gate stack, a replacement gate structure, or a metal gate structure. The gate electrode 371 and the gate stacks may extend along sidewalls of a channel region of the semiconductor fins 62.

Additional processing may be performed to finish the fabrication of the FinFET device 300, as those of ordinary skill readily appreciates, thus details may not be repeated here. For example, an ILD may be deposited over the gate stack and the epitaxial source/drain regions 108. Further, gate contacts and source/drain contacts may be formed through the ILD to electrically connect to the gate electrode 371 and the epitaxial source/drain regions 108, respectively.

According to various embodiments of the present disclosure, the gate dielectric layers may be formed using a two-step process, which allows the gate dielectric layers to be incorporated with or without various dipole elements in different regions. Thus, the semiconductor devices in different regions may have different threshold voltages by using the gate dielectric layers. In addition, in some embodiments, the gate dielectric layers formed using the two-step process provide well-controlled distributions of fluorine atoms. The gate dielectric layer formed using the two-step process such as described herein may allow a majority of the fluorine atoms and a majority of the dipole elements to be located within different gate dielectric layers and thus separated from each other. As such, the interference for voltage tuning performance caused between the dipole elements and the fluorine atoms may be reduced to an acceptable or minimum level. Semiconductor devices that have any combinations of threshold voltage and desired device performance may be provided and therefore can meet the various design needs of integrated circuits.

In an embodiment, a method of forming a semiconductor device, the method includes: forming a first dielectric layer over a first channel region in a first region and over a second channel region in a second region; introducing a first dipole element into the first dielectric layer in the first region to form a first dipole-containing gate dielectric layer in the first region; forming a second dielectric layer over the first dipole-containing gate dielectric layer; introducing fluorine into the second dielectric layer to form a first fluorine-containing gate dielectric layer over the first dipole-containing gate dielectric layer; and forming a gate electrode over the first fluorine-containing gate dielectric layer. In an embodiment, introducing fluorine includes: exposing the second dielectric layer to a fluorine-containing gaseous environment; and annealing to diffuse fluorine from the fluorine-containing gaseous environment into the second dielectric layer. In an embodiment, introducing fluorine includes: forming a fluorine-containing layer over the second dielectric layer; and annealing to diffuse fluorine from the fluorine-containing layer into the second dielectric layer. In an embodiment, introducing the first dipole element into the first dielectric layer includes: forming a first dipole layer over the first dielectric layer in the first region and in the second region, wherein the first dipole layer includes an oxide of the first dipole element; removing a portion of the first dipole layer in the second region; applying a thermal treatment to the first dipole layer; and after applying the thermal treatment to the first dipole layer, removing remaining portions of the first dipole layer over the first channel region before forming the second dielectric layer. In an embodiment, further including after forming the first dipole-containing gate dielectric layer in the first region, introducing a second dipole element to the first dielectric layer in the second region to form a second dipole-containing gate dielectric layer in the second region. In an embodiment, introducing the second dipole element into the first dielectric layer includes: forming a second dipole layer over the first dielectric layer in the second region and the first dipole-containing gate dielectric layer in the first region, wherein the second dipole layer includes an oxide of the second dipole element; applying a thermal treatment to the second dipole layer; and after applying the thermal treatment to the second dipole layer, removing remaining portions of the second dipole layer in the second region before forming the second dielectric layer, wherein forming the second dielectric layer over the first dipole-containing gate dielectric layer includes forming the second dielectric layer over the first dipole-containing gate dielectric layer in the first region and over the second dipole-containing gate dielectric layer in the second region. In an embodiment, further including removing a portion of the second dipole layer in the first region before applying the thermal treatment to the second dipole layer. In an embodiment, the first dielectric layer and the second dielectric layer are formed of a same material.

In an embodiment, a semiconductor device includes a first gate dielectric layer disposed over a channel region; a second gate dielectric layer disposed over the first gate dielectric layer, wherein the first gate dielectric layer includes a first oxide doped with fluorine and a dipole element, and the second gate dielectric layer includes a second oxide doped with fluorine, wherein the peak concentration of fluorine in a combination of the first gate dielectric layer and the second gate dielectric layer is located within the second gate dielectric layer; a gate structure disposed over the second gate dielectric layer. In an embodiment, the dipole element includes La, Y, Ti, Ge, Al, Ga, Zn, or a combination thereof. In an embodiment, over 60% of the total amount of fluorine in the combination of the first gate dielectric layer and the second gate dielectric layer is distributed in the second gate dielectric layer. In an embodiment, the second gate dielectric layer has 0.01%-9% atomic concentration of fluorine. In an embodiment, the first oxide and the second oxide are a same material. In an embodiment, the first gate dielectric layer has a peak concentration of the dipole element adjacent or at a center portion along a thickness direction of the first gate dielectric layer.

In an embodiment, a semiconductor device includes: a first transistor including: a first dipole-containing gate dielectric layer disposed over a first channel region, wherein the first dipole-containing gate dielectric layer includes a first oxide doped with a first dipole element and fluorine; a first fluorine-containing gate dielectric layer disposed over the first dipole-containing gate dielectric layer, wherein the first fluorine-containing gate dielectric layer includes a second oxide doped with fluorine, wherein a peak concentration of fluorine in the first fluorine-containing gate dielectric layer is greater than a peak concentration of fluorine in the first dipole-containing gate dielectric layer; and a first gate electrode disposed over the first fluorine-containing gate dielectric layer; and a second transistor including: a second dipole-containing gate dielectric layer disposed over a second channel region, wherein the second dipole-containing gate dielectric layer includes a third oxide doped with a second dipole element and fluorine, wherein the first dipole element is different than the second dipole element; a second fluorine-containing gate dielectric layer disposed over the second dipole-containing gate dielectric layer, wherein the second fluorine-containing gate dielectric layer includes a fourth oxide doped with fluorine, wherein a peak concentration of fluorine in the second fluorine-containing gate dielectric layer is greater than a peak concentration of fluorine in the second dipole-containing gate dielectric layer; and a second gate electrode disposed over the second fluorine-containing gate dielectric layer. In an embodiment, the first oxide and the third oxide are a same material. In an embodiment, the first dipole element and the second dipole element have the same type. In an embodiment, the first dipole element and the second dipole element have the different types. In an embodiment, the first transistor further includes first source/drain regions, wherein the second transistor further includes a second source/drain regions, wherein the first source/drain regions and the second source/drain regions have different conductivity types. In an embodiment, the first transistor further includes first source/drain regions, wherein the second transistor further includes a second source/drain regions, wherein the first source/drain regions and the second source/drain regions have a same conductivity type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, wherein the method comprises:
    forming a first dielectric layer over a first channel region in a first region and over a second channel region in a second region;
    introducing a first dipole element into the first dielectric layer in the first region to form a first dipole-containing gate dielectric layer in the first region, wherein introducing the first dipole element into the first dielectric layer comprises:
        forming a first dipole layer over the first dielectric layer in the first region and in the second region, wherein the first dipole layer comprises an oxide of the first dipole element;
        removing a portion of the first dipole layer in the second region;
        applying a thermal treatment to the first dipole layer; and
        after applying the thermal treatment to the first dipole layer, removing remaining portions of the first dipole layer over the first channel region;
    after introducing the first dipole element, forming a second dielectric layer over the first dipole-containing gate dielectric layer;
    introducing fluorine into the second dielectric layer to form a first fluorine-containing gate dielectric layer over the first dipole-containing gate dielectric layer; and
    forming a gate electrode over the first fluorine-containing gate dielectric layer.

2. The method of claim 1, wherein introducing fluorine comprises:
    exposing the second dielectric layer to a fluorine-containing gaseous environment; and
    annealing to diffuse fluorine from the fluorine-containing gaseous environment into the second dielectric layer.

3. The method of claim 1, wherein introducing fluorine comprises:
    forming a fluorine-containing layer over the second dielectric layer; and
    annealing to diffuse fluorine from the fluorine-containing layer into the second dielectric layer.

4. The method of claim 1, further comprising after forming the first dipole-containing gate dielectric layer in the first region, introducing a second dipole element to the first dielectric layer in the second region to form a second dipole-containing gate dielectric layer in the second region.

5. The method of claim 4, wherein introducing the second dipole element into the first dielectric layer comprises:
    forming a second dipole layer over the first dielectric layer in the second region and the first dipole-containing gate dielectric layer in the first region, wherein the second dipole layer comprises an oxide of the second dipole element;
    applying a thermal treatment to the second dipole layer; and
    after applying the thermal treatment to the second dipole layer, removing remaining portions of the second dipole layer in the second region before forming the second dielectric layer,
    wherein forming the second dielectric layer over the first dipole-containing gate dielectric layer comprises forming the second dielectric layer over the first dipole-containing gate dielectric layer in the first region and over the second dipole-containing gate dielectric layer in the second region.

6. The method of claim 5, further comprising removing a portion of the second dipole layer in the first region before applying the thermal treatment to the second dipole layer.

7. The method of claim 1, wherein the first dielectric layer and the second dielectric layer are formed of a same material.

8. A method comprising:
    depositing a first gate dielectric layer over a first semiconductor structure in a first device region and over a second semiconductor structure in a second device region;
    depositing a first dipole layer over the first gate dielectric layer;
    selectively removing the first dipole layer from over the first gate dielectric layer in the second device region;
    after selectively removing the first dipole layer from over the first gate dielectric layer in the second device region, diffusing a first dipole element of the first dipole layer into the first gate dielectric layer in the first device region to form a first doped gate dielectric layer;
    removing the first dipole layer from over the first doped gate dielectric layer in the first device region;
    depositing a second dipole layer over the first gate dielectric layer in the second device region;
    diffusing a second dipole element of the second dipole layer into the first gate dielectric layer in the second device region;
    forming a second gate dielectric layer over the first doped gate dielectric layer, wherein a peak concentration of fluorine of the second gate dielectric layer is greater than a peak concentration of fluorine of the first gate dielectric layer, wherein forming the second gate dielectric layer comprises:
        depositing the second gate dielectric layer over the first doped gate dielectric layer after removing the first dipole layer from over the first gate dielectric layer in the first device region; and
        diffusing fluorine into the second gate dielectric layer; and
    forming a gate electrode over the second gate dielectric layer.

9. The method of claim 8, wherein diffusing fluorine into the second gate dielectric layer comprises soaking the second gate dielectric layer in a gaseous environment, the gaseous environment comprising fluorine.

10. The method of claim 8, diffusing fluorine into the second gate dielectric layer comprises:
    depositing a fluorine-containing layer over the second gate dielectric layer; and
    diffusing fluorine from the fluorine-containing layer into the second gate dielectric layer.

11. The method of claim 8 further comprising:
depositing a barrier layer over the second gate dielectric layer prior to diffusing fluorine into the second gate dielectric layer; and
removing the barrier layer after diffusing fluorine into the second gate dielectric layer, wherein diffusing fluorine into the second gate dielectric layer comprises diffusing fluorine into the second gate dielectric layer through the barrier layer.

12. The method of claim 8, wherein the first dipole element and the second dipole element are concurrently diffused into the first gate dielectric layer.

13. The method of claim 8, wherein the first dipole element has a same conductivity type as the second dipole element.

14. The method of claim 8, wherein the first dipole element has an opposite conductivity type as the second dipole element.

15. A method comprising:
forming an interfacial layer over a channel region;
forming a gate dielectric over the interfacial layer, wherein forming the gate dielectric comprises:
forming a first gate dielectric material over the channel region, wherein the first gate dielectric material comprises a dipole element;
forming a second gate dielectric material over the first gate dielectric material; and
diffusing fluorine into at least the second gate dielectric material, wherein a peak concentration of fluorine in the gate dielectric is in the second gate dielectric material; and
forming a gate electrode over the gate dielectric.

16. The method of claim 15, wherein the second gate dielectric material is thicker than the first gate dielectric material.

17. The method of claim 15, wherein forming the gate dielectric further comprises diffusing fluorine into the first gate dielectric material.

18. The method of claim 15, wherein forming the first gate dielectric material comprises:
forming a first dielectric layer;
forming a first dipole layer over the first dielectric layer, wherein the first dipole layer comprises an oxide of the dipole element;
applying a thermal treatment to the first dipole layer; and
after applying the thermal treatment to the first dipole layer, removing remaining portions of the first dipole layer.

19. The method of claim 15, wherein a peak concentration of first dipole element is in the first gate dielectric material.

20. The method of claim 15, wherein over 60% of the fluorine is distributed in the second gate dielectric material.

* * * * *